United States Patent [19]

Sano et al.

[11] Patent Number: 5,758,123
[45] Date of Patent: May 26, 1998

[54] VERIFICATION SUPPORT SYSTEM

[75] Inventors: Naoki Sano; Takeshi Yamamoto; Manabu Noriyasu; Satoru Natsui; Yuji Amano; Atsushi Ogasawara; Yuko Mizuta; Yoko Takihana, all of Tokyo, Japan

[73] Assignee: Yokogawa Electric Corporation, Tokyo, Japan

[21] Appl. No.: 420,261

[22] Filed: Apr. 11, 1995

[30] Foreign Application Priority Data

| Apr. 12, 1994 | [JP] | Japan | 6-073124 |
| Apr. 18, 1994 | [JP] | Japan | 6-078641 |
| Apr. 18, 1994 | [JP] | Japan | 6-078642 |
| Apr. 27, 1994 | [JP] | Japan | 6-089483 |
| Aug. 12, 1994 | [JP] | Japan | 6-190344 |

[51] Int. Cl.$^6$ .............................. G06F 9/455; G06F 3/00
[52] U.S. Cl. .............................. 395/500; 344/578
[58] Field of Search .............. 395/500, 183.01–183.08; 364/578, 488–491; 371/23

[56] References Cited

U.S. PATENT DOCUMENTS

| 4,590,581 | 5/1986 | Widdoes, Jr. .............. 365/578 |
| 4,697,266 | 9/1987 | Finley ...................... 395/182.14 |
| 4,751,672 | 6/1988 | Yamada ..................... 364/136 |
| 4,995,037 | 2/1991 | Imada et al. ............... 395/183.09 |
| 5,039,937 | 8/1991 | Mandt et al. ............... 324/121 R |
| 5,051,938 | 9/1991 | Hyduke ..................... 264/578 |
| 5,058,052 | 10/1991 | Sexton et al. ............. 395/708 |
| 5,133,076 | 7/1992 | Hawkins et al. ............ 364/709.11 |
| 5,146,460 | 9/1992 | Ackerman et al. ........... 395/183.09 |
| 5,228,039 | 7/1993 | Knoke et al. .............. 395/183.04 |
| 5,253,781 | 10/1993 | Mauri et al. .............. 364/489 |
| 5,276,811 | 1/1994 | Zifferer et al. ........... 395/500 |
| 5,349,518 | 9/1994 | Zifferer et al. ........... 364/192 |
| 5,359,545 | 10/1994 | Ott et al. ................. 364/578 |
| 5,404,496 | 4/1995 | Burrough et al. ........... 395/183.04 |
| 5,425,036 | 6/1995 | Liu et al. ................. 371/24 |
| 5,459,872 | 10/1995 | Connell et al. ............ 395/736 |
| 5,504,862 | 4/1996 | Suzuki et al. ............. 395/183.09 |
| 5,544,067 | 8/1996 | Rostoker et al. ........... 364/489 |
| 5,563,993 | 10/1996 | Sato et al. ............... 395/140 |
| 5,566,295 | 10/1996 | Cypher et al. ............. 395/326 |
| 5,572,437 | 11/1996 | Rostoker et al. ........... 364/489 |
| 5,574,893 | 11/1996 | Southgate et al. .......... 395/500 |
| 5,576,979 | 11/1996 | Lewis ..................... 364/578 |

OTHER PUBLICATIONS

Simulation of a Micro–Pipelined Multi CPU Event Process for Use in Fastbus; MF Letheren; A. Marchior; F. Slorach, IEEE Transaction on Nuclear Science, vol. 36 No. 5, Oct. 1989.

A Language for Compositional Specification and Verification of Finite State Hardware Controller, Clarke et al; Proceeding of IEEE, vol. 79, No. 9 Sep. 1991.

(List continued on next page.)

*Primary Examiner*—Kevin J. Teska
*Assistant Examiner*—Herbert McNair
*Attorney, Agent, or Firm*—Moonray Kojima

[57] ABSTRACT

A verification support system wherein before a CPU mounted circuit is actually made such circuit model and an ICE model are made virtually and verification of such circuit model is performed using logic simulation on the ICE model; and when an error is found execution and verification up to the error point are omitted and are performed immediately after the error point to correct the error. A waveform, obtained by logic simulation, and a partially enlarged waveform thereof are displayed on different display regions for each time period and a display region is provided for saving a displayed waveform obtained when logic simulation is stopped. In another aspect of the invention, before an actual system is made by PLC, such PLC model is verified, and a test program is carried out to obtain verification when a process model is detached from the PLC model, and a sequence program is carried out by using a general purpose simulator with a debugging function. The verification system enhances efficiency of development of a CPU mounted circuit, and development of a sequence control system using a PLC.

4 Claims, 49 Drawing Sheets

OTHER PUBLICATIONS

Program Emulation in a Personal Computer: is it Really Worth It? J R. Pollard, Programmable Control and Automation Technology, pp. 1–7, Oct. 1988.

Steve Gibson, Soft–Ice for Windows Boldly Goes into Undocumented Territory, Tech Talk, p. 42, Oct. 5, 1992.

Andrew Tanenbaum, Structural Computer Organization, 3rd Edition Book By Prentice–Hall, p. 11, Jan. 1990.

Christopher P Zing, Development System Put Two Processors on Speaking Terms UKCTR Manuf System, pp. 2–6, Jul. 1980.

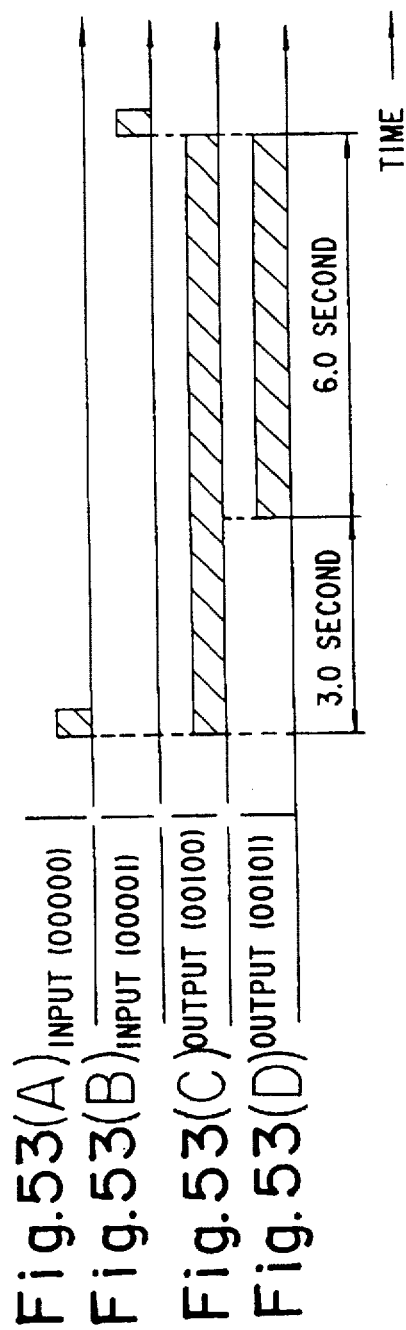

| Input | 00000 | Starting Switch |
|---|---|---|
| Input | 00001 | Output Sensor |
| Output | 00100 | Motor for Driving a Conveyer |
| Output | 00101 | Paint Blower |
| Timer | 000 | Delay Timer |

Fig.56

| Address | Instruction | Data | Comment |
|---|---|---|---|
| 0 | LD | 00000 | Load 00000, Value of Starting Switch |
| 1 | OR | 00100 | Keep itself by Output Value 00100 |
| 2 | AND NOT | 00001 | Confirm Output Sensor Off |
| 3 | OUT | 00100 | Start Motor for Driving a Conveyer |
| 4 | TIM | 000 | Start Counting Timer 000 |
|  |  | #0030 | Setup 3.0 sec to Timer |
| 5 | LD | TIM000 | Load Timer Condition |
| 6 | OUT | 00101 | Start Paint Blower |
| 7 | END (01) |  | Finish Plogram |

```
- - coating procedure
procedure coating;
procedure coating is
begin

TLD (0,0) ;                    - - Corresponding to Address 0
TOR (1,100) ;                  - - Corresponding to Address 1
TANDNOT (2,1) ;                - - Corresponding to Address 2
TOUT (3,100) ;                 - - Corresponding to Address 3
TTIM (4,0,3 sec) ;             - - Corresponding to Address 4
TLD (5,TIM (0) ) ;             - - Corresponding to Address 5
TOUT (6,101) ;                 - - Corresponding to Address 6
TEND (7) ;                     - - Corresponding to Address 7 end coating;
```

Fig.60

```
procedure coatingchk_without;
procedure coatingchk_without is;
begin print("Coating check without a controlled target model starts.");

print("Start switch 00000:OFF. Output sensor 00001:OFF.");
    sv(00000,"OFF");
    sv(00001,"OFF");
    runt(1 sec);
    check("coating_chk11","out(00100)",out(00100),"OFF");
    check("coating_chk12","out(00101)",out(00100),"OFF");
    check("coating_chk13","timer(000)",timer(000),"OFF");

print("Start switch 00000:ON.");
    sv(00000,"ON");
    runt(1 sec);
    check("coating_chk21","out(00100)",out(00100),"ON");
    check("coating_chk22","out(00101)",out(00100),"OFF");
    check("coating_chk23","timer(000)",timer(000),"OFF");

sv(00000,"OFF");
    runt(2 sec);
print("Timer 000 is up. Coating machine starts.");
    check("coating_chk31","out(00100)",out(00100),"ON");
    check("coating_chk32","out(00101)",out(00100),"ON");
    check("coating_chk33","timer(000)",timer(000),"ON");

runt(2 sec);
print("Coating is proceeding.");
    check("coating_chk41","out(00100)",out(00100),"ON");
    check("coating_chk42","out(00101)",out(00100),"ON");
    check("coating_chk43","timer(000)",timer(000),"ON");

runt(4 sec);
print("Output sensor 00001:ON.");
    sv(00001,"ON");
    runt(1 sec);
    check("coating_chk51","out(00100)",out(00100),"OFF");
    check("coating_chk52","out(00101)",out(00100),"OFF");
    check("coating_chk53","timer(000)",timer(000),"OFF");

print("Output sensor 00001:OFF.");
    sv(00001,"OFF");

print("Coating ends.");

end coatingchk_without;
```

Fig.61

```
procedure coatingchk_with;
procedure coatingchk_with is;
begin print("Coating check with a controlled target model starts.");

print("Start switch 00000:OFF.");
        sv(00000,"OFF");
        sv(00001,"OFF");
        runt(1 sec);
        check("coating_chk11","in(00001)",in(00001),"OFF");

print("Start switch 00000:ON.");
        sv(00000,"ON");
        runt(1 sec);
        check("coating_chk21","in(00001)",in(00001),"OFF");

sv(00000,"OFF");
        runt(2 sec);

print("Coating is proceeding.");
        check("coating_chk31","in(00001)",in(00001),"OFF");
        runt(6 sec);

print("Check output sensor 00001:ON.");
        check("coating_chk41","in(00001)",in(00001),"ON");
        runt(1 sec);

print("Check output sensor 00001:OFF.");
        check("coating_chk51","in(00001)",in(00001),"OFF");

print("Coating ends.");

end coatingchk_with;
```

VERIFICATION SUPPORT SYSTEM

BACKGROUND OF THE INVENTION

1. Field of Invention

This invention relates to a verification support system which executes a variety of verifications on a general purpose engineering work station (hereinafter called "EWS"); and more particularly, to such system which executes verification of hardware and software of a CPU (central processing unit) mounted circuit on the general purpose EWS, or executes verification of a sequence program that a programmable logic controller (hereinafter called "PLC") executes on the general purpose EWS.

2. Description of the Prior Art

Before discussing the various categories of conventional verification support systems and problems encountered thereby, a verification support system for performing verification of the hardware and software of a CPU mounted circuit will be described. The target of verification is a printed circuit board or application specific integrated circuit (hereinafter called "ASIC") on which a ROM, a RAM, and a user logic are mounted around a general purpose CPU. The printed circuit board and ASIC are generally referred to as a CPU mounted circuit. The verification support system executes the verification of the hardware and software of the CPU mounted circuit on the general purpose EWS. The foregoing and other conventional verification support systems may be divided into six categories (a)–(f), which are discussed below.

Category (a) Prior Art System and Problems

In circuit emulators (hereinafter called "ICE") are extensively used to enhance the efficiency of development of computers. The ICE is mounted in a computer development support system and functions as the CPU of a computer, which is the subject of development, and executes verification of the hardware and software of the subject computer.

FIG. 1 depicts a CPU mounted circuit 1 which is the target or subject of the development and comprises a general purpose CPU 2, which is the core of the CPU mounted circuit 1; a ROM 3 for program storage; a RAM 4 for data storage; and a user logic 5 which is a circuit part that the user builds. User logic 5 is a signal processing circuit including an A/D converter, and the like, for example, which can access general purpose CPU 2 for reading and writing of data.

Verification of the hardware and software of a CPU mounted circuit 1 has so far been performed with an ICE 6 related to the general purpose CPU 2, after the CPU has actually been made.

The development of ASICs with a CPU core mounted therein has been extensively carried out for the purpose of large scale integration and miniaturization of equipments or systems.

FIG. 2 depicts the prior art environment under which the development and debugging of an ASIC are performed, wherein a CAD (computer aided design) 7 for designing a user circuit and a CAD 8 for designing a CPU mounted circuit are provided. A personal computer 9 is provided in a computer development support system and an ICE 10 is operated under control of personal computer 9. A C source (i.e. source program of C language) is converted by a C compiler (i.e. compiler of C language) into object codes, which are inputted to personal computer 9. A CPU mounted circuit 11 is provided for evaluation. A user circuit 12, only a portion of which is ASICed is provided.

As shown in FIG. 2, even when the entire board is finally ASICed, the CPU mounted circuit 11, in which only the user circuit part 12 was ASICed, is first made, and then, this CPU mounted circuit 11 is verified with the ICE 10 in the same way as described above.

However, in the conventional examples in which verification is performed after the CPU mounted circuit has actually been made, or after the CPU mounted circuit for evaluation, having only the user circuit part ASICed, has actually been made, as described above, there exist the following problems:

(1) Since the actually made CPU mounted circuit is verified by a worker applying a probe thereinto, when the operation of the CPU is made to be of high speed, it is difficult to verify at the actual operational speed.

(2) When the circuits on the board are of large-scale integration, it becomes difficult to physically apply a probe to the wiring patterns.

(3) When, as a result of verification, abnormalitiy is found in the hardware of the CPU mounted circuit, the CPU mounted circuit must be remade. This results in an additional development cost and increases the development time. More particularly, when the abnormality is found in the ASICed user circuit, this becomes a large problem.

Category (b) Prior Art System and Problems

Recently, as general purpose EWSs and logic simulators have become more cost effective and have increased in operational speed, verification of the hardware and software of CPU mounted circuits has been performed by logic simulation.

When verification of the circuit of FIG. 1 is performed with logic simulation, a virtual model of a CPU mounted circuit, such as shown in FIG. 3, is made. FIG. 3 depicts a CPU mounted circuit model 21 comprising a general purpose CPU model 22, a ROM model 23, a RAM model 24 and a user logic model 25. These are virtual models of the corresponding components, and can be realized with use of appropriate software.

A source file described in C language, for example, is compiled with a C compiler, and the object codes, comprising 0 and 1 patterns generated as a result, are loaded down into ROM model 23 when logic simulation is started. The loaded program is executed by the general purpose CPU model 22 once verification of the software is performed. The source file is an application program made by the user, and the C compiler is provided by the user. How efficiently the above-described logic simulation can be performed greatly influences the shortening of the time it takes to develope the CPU mounted circuit.

FIG. 4 shows the steps of a program stored in ROM model 23, wherein the program comprises a related sequence of steps 1 to N (wherein N represents an integer). The related sequence of Steps 1 to N is intended to mean that Step 2 is performed with data obtained in Step 1, Step 3 is performed with data obtained in Step 2, and thereafter, subsequent Steps are likewise related to each other in the same manner.

FIG. 5 shows the Steps of verifying the program of FIG. 4 stored in ROM model 23. The flow chart of FIG. 5 shows that no errors were found in the verification. The Steps of verification described below as Steps (A1) through (A5) correspond to Steps A1 through A5 of FIG. 5.

(A1) Start the logic simulator to start logic simulation.

(A2) The object codes of a program for performing verification are loaded down into ROM model 23.

(A3) General purpose CPU model 22 is started, and the object codes are read out in sequence by ROM model 23, and instructions are executed.

(A4) The program of Steps 1 to N, through Step M, is executed in sequence and verification is performed for each Step.

(A5) Finish the logic simulation.

FIG. 6 shows the Steps when an error is found in Step M. Steps (B1) to (B6) in the following description correspond to Steps B1 to B6 of FIG. 6.

(B1) A program related to Step M (corresponding to a source file) is corrected, and the entire program after correction is recompiled.

(B2) The logic simulator is started and the logic simulation is started.

(B3) The object code of the corrected program is loaded down into ROM model 23.

(B4) General purpose CPU model 22 is started and the object codes are read out in sequence by ROM model 23, and instructions are executed.

(B5) The program of Steps 1 to M−1, already verified, is executed in sequence.

(B6) Step M in the corrected program is executed and verification is performed. If the errors have been removed as a result of verification, Step M will advance to the next Step M+1. On the other hand, if the errors still exist, Steps (B1) to (B5) will be repeated and executed.

However, in the procedure shown in FIG. 6, when an error is found in the verification in Step M, Step M is executed after the program for Step 1 to Step M−1, already verified has been executed in sequence. Thus, the time required to get to the verification of the error portion is additional so that verification of the error portion cannot be performed with efficiency. This reduces verification efficiency of the software of the CPU mounted circuit.

Category (c) Prior Art System and Problems

Efficiency of logic simulation and performance is an important consideration in the shortening of development time when developing hardware. Priorly, when verifying hardware by checking a signal wave form with logic simulation, a simulation display time width was set in advance to δT, a signal waveform corresponding to time width δT was displayed on the waveform window of a CRT screen, and this waveform was renewed and displayed every hour as the simulation proceeded, as shown in FIG. 7. That is δT=TR−TL. It was usual that the simulation be stopped when the waveform shown in the waveform window arrived at a verification point, and the waveform held on the window is checked visually.

However, there are few cases where visual checking can be performed without changing the display time width δT when checking is performed. That is, when the display time width δT is too large, the waveform at the verification point is too small, as shown in FIG. 8, so that a fine signal change is difficult to observe. For this reason, the window of FIG. 8 is renewed to be a window in which a section between time T12 and T13 (such as that shown in FIG. 9) is; displayed on an enlarged scale, checking is performed on the renewed window. On the other hand, if an enlarged display such as shown in FIG. 9 is displayed, the display time width δT becomes too small, so that the entire signal change is often difficult to observe. In such a case, the section between time T12 and T13 of FIG. 9 is displayed on a reduced scale, and checking is performed on a window, such as that shown in FIG. 8.

Thus, depending on the circumstances, an enlarged display or reduced display, may be needed at the verification point. Thus, verification cannot be performed with a single fixed magnification of the display. Thus, in the prior art when an enlarged display or reduced display is needed at each verification point, simulation remains stopped during the time the enlargement or reduction is being produced. Accordingly, the time required for simulation is increased and efficiency is reduced.

Category (d) Prior Art System and Problems

Along the same lines of efficiency of logic simulation, when performing logic simulation, a plurality of waveforms of signal data, which are necessary for verification of a target circuit model, are displayed on a CRT window, such as shown in FIG. 10, for example. Logic simulation is stopped at the point where the verification of hardware is performed. At that point, the signal waveform is partially enlarged or reduced. Verification is performed by visually checking the enlarged or reduced waveform.

However, since logic simulation is stopped at each verification point and then the waveform is checked, logic simulation cannot be performed during the checking. Thus, also when verification of the target circuit mode is performed, the time required for logic simulation becomes longer and efficiency of logic simulation is reduced further.

Category (e) Prior Art System and Problems

In the verification support system, there are cases where two target logics are verified with use of a single system, and the waveforms obtained from the respective target logics are compared.

FIG. 11 shows a target logic comprising two target logics $1_1$ and $1_2$, each comprising general purpose CPU $2_1$, $2_2$ which become the cores of target logics $1_1$ and $1_2$; ROM $3_1$, $3_2$ for program storage; RAM $4_1$, $4_2$ for data storage; and user logic $5_1$, $5_2$ which are circuits built by the user. User logics $5_1$, $5_2$ are signal processing circuits including an A/D converter, and the like, for example, and can be used to access general purpose CPU $2_1$, $2_2$ for reading and writing data.

When verification of the hardware and software of the target logic shown in FIG. 11 is performed with logic simulation, a virtual model of a target logic is made, such as shown in FIG. 12.

FIG. 12 shows target logic models $21_1$, $21_2$ comprising general purpose CPU models $22_1$, $22_2$; ROM models $23_1$, $23_2$; RAM models $24_1$, $24_2$; and user logic models $25_1$, $25_2$. These are virtual models of the corresponding target logics $1_1$, $1_2$, and are realized by use of appropriate software. Logic simulation is performed on a target logic model, such as shown in FIG. 12, and verification of the hardware and software of the target logic model is performed.

A source file described in C language, for example, is compiled with a C compiler, and object codes comprising 0 and 1 patterns, generated as a result, are loaded down into ROM models $23_1$, $23_2$, when logic simulation is started. The loaded programs are executed by general purpose CPU models $22_1$, $22_2$, respectively. The source file is an application program made by the user, and the C compiler is provided by the user.

How efficiently the above logic simulation can be performed is an important consideration in the shortening of development time to develope the hardware. Priorly, when signal data, necessary for verification of the target logic model, were displayed on the waveform window of a CRT display unit, as the hardware was verified by checking the waveform with logic simulation, there were limitations on the number of waveform windows that can be displayed at the same time. Also, in the example of the target logic shown in FIG. 12, the signal data were divided into two groups to display waveforms so that they were easy to observe. That is, the signal data were grouped into signal data necessary for verification of target logic model $21_1$ and signal data necessary for verification of target logic model $21_2$. These two groups of data were respectively displayed on waveform windows #1 and #2, as shown in FIG. 13. In the windows of FIG. 13, CLK represents a clock to provide operating timing; XAS represents an address strobe signal of negative logic; HA represents a host address; and XRW represents a read/write signal of negative logic. "16'hffff" is data which is given as a default when the host address HA is not determined.

Each of the waveform windows #1 and #2 is provided with a PAUSE button and a RUN button, for example. The renewal of the waveforms in the windows is stopped temporarily by pushing the PAUSE button. The renewal of the waveforms in the window is restarted by pushing the RUN button. In such a conventional display window, the renewal of the waveform window can be stopped or restarted independently for each window.

However, when it is desired that the renewals of the two windows be stopped at the same time, the PAUSE button of window #1 must be pushed first, and then, the PAUSE button of window #2 is pushed. For this reason, when the two windows are stopped, there is a difference in simulation time between the waveforms of windows #1 and #2, as shown in FIG. 14. Thus, the waveforms must be checked and the difference in time between the two windows must be taken into account. Thus, the checking of the waveforms cannot be performed efficiently. In FIG. 14, the pushed PAUSE buttons have been changed from ☐ to ■.

Also, when it is desired that the renewals of the two windows be restarted at the same time, likewise, the RUN button of window #1 must be pushed first and then the RUN button of window #2 is pushed. Thus, when the windows are restarted, there is difference in simulation time between the waveforms of window #1 and window #2, as shown in FIG. 15, so that the same problem exists as that of stopping.

Each time the stop and restart of the simulation is performed, the difference in time between the two windows is accumulated. Thus, checking of the waveforms cannot be done efficiently, and efficiency of logic simulation is reduced.

Category (f) Prior Art System and Problems

Verification of a sequence program executed by a PLC is discussed next. The PLC is one of representative controllers used in a sequence control system. FIG. 16 shows a sequence control system comprising input part 31, calculation control logic 32, output part 33, and operating window 34. External information is inputted to input part 31, for example, through a limit switch 700, a toggle switch 701, a relay switch 702, or as an analog input IN. Calculation control logic 32 comprises a memory 321 for storing a sequence program and information and a CPU 322 for executing the sequence program. Output part 33 outputs the results of calculation to the outside, for example, to a motor 703, a lamp 704, a solenoid 705, or as an analog output signal OUT. Operating window 34 inputs a sequence program to calculation control logic 32.

Recently, customers have demanded that PLCs have process control processing function, information processing function, and data processing function, in addition to the original sequence control processing function. Accordingly, the PLC tends now to be large in scale and complex, so that the efficiency of design is increasingly desired. In particular, as the PLC becomes large in scale and more complex, generally a sequence program is also increased in the number of Steps used, and increased in complexity. Thus, improving the verification efficiency of the sequence program contributes to improvement in efficiency in designing of the entire PLC.

FIG. 17 shows the basic steps of a conventional design of a sequence program. In the following description Steps (C1) to (C8) correspond to Steps C1 to C8 of FIG. 17.

(C1) First, the specification of a system, which is the target of control, is examined.

(C2) Next, allocation of the number of input-output units to which an input-output device is connected, is determined.

(C3) Then, based on a timing diagram, and the like, the design of a sequence circuit is made, with a ladder diagram, for example, and the control steps are expressed definitively.

(C4) The allocation of an internal memory, a timer, a counter, and the like, is made at the same time as the sequence circuit is being designed, or after the design is completed.

(C5) When the sequence circuit is completed, a circuit entry is made with a programming tool, and the sequence circuit is converted into a mnemonic (i.e. mechanical word of PLC). As a method of circuit entry, one may use (a) the method of drawing the symbol of a ladder diagram on the CRT window; or (b) the method of directly coding command words such as AND or OR as logic symbols.

(C6) When the making of the sequence program is completed, debugging is performed on a disk with the programming tool.

(C7) The debugged program is stored in the memory of PLC.

(C8) The sequence program is debugged by trial of the program.

If the sequence program is not operated correctly, it will be corrected or changed as needed.

However, in the conventional method in which after the hardware and software have been coupled to construct a real system, the sequence program is verified on a full scale by trial of the program, as described above. The following problems were found in such conventional methods.

(1) The verification of the sequence program was performed after an actual system was constructed, so that when it was necessary to correct or change the sequence program, the correction or change became troublesome and efficiency was reduced. More particularly, when the control of the PLC was extremely complex, correction or change tended to repeatedly occur until the verification of the sequence program was completed, so that verification takes a considerable amount of time.

(2) At the stage of examining the specification of a system, it was difficult to quantitatively estimate the allocation of control by hardware and control by software, together with the performance of the PLC. When the program is completed, and when program trial is just starting, if an objectionable point is just found, a large change or correction of the sequence program cannot be avoided, and in some cases, the sequence program must be redesigned in entirety.

SUMMARY OF THE INVENTION

Accordingly, an object of the invention is to overcome and resolve the aforementioned problems, deficiencies and disadvantages of the prior art.

Another object is to provide a verification support system which is capable of enhancing efficiency of development of a CPU mounted circuit and also enhance efficiency of development of a sequence control system using a PLC.

BRIEF DESCRIPTION OF THE DRAWINGS.

FIGS. 53(A)–53(D) are timing diagrams are of the input-output of the painting step of the paint blower of FIG. 51.

FIG. 56 is a diagram depicting an example of a sequence program by a mnemonic.

FIG. 60 is a diagram depicting an example of a test program when the control target model is disconnected from the PLC model.

FIG. 61 is a diagram depicting an example of a test program when the control target model is connected to the PLC model.

DETAILED DESCRIPTION OF THE PREFERRED EMBODIMENTS

The first through the sixth illustrative embodiments will now be described in further detail. These are verification support systems which have solved the above and other problems of the prior art, and have the features and advantages to be further described below. The first through the sixth illustrative embodiments are discussed hereinbelow under the headings (a-1) embodiment through (f-6) embodiment.

(a-1) First Embodiment

Figure 18:
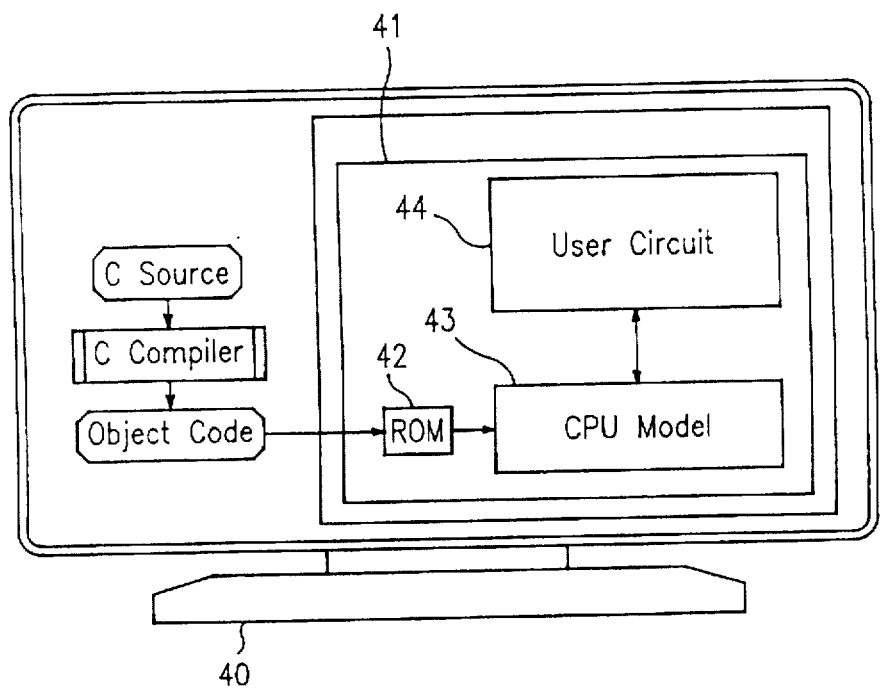
FIG. 18 is a conceptual diagram depicting the environment under which development and debugging of a CPU mounted circuit in the inventionn are performed.

FIG. 18 shows the environment under which the development and debugging of a CPU mounted circuit are performed by the instant invention. In FIG. 18, there is depicted an EWS 40 in which a virtual CPU mounted circuit 41 is provided and comprises a virtual ROM 42, a CPU model 43, and a user circuit 44. Object codes, converted by a C compiler, are stored in ROM 42. CPU model 43 executes a program comprising the stored object codes. Virtual ROM 42, virtual CPU model 43, and virtual user circuit 44 correspond to the real ROM 3, general purpose CPU 2, and user logic 5, respectively. In FIG. 18, there is conceptually shown that the CPU mounted circuit virtually made in EWS 40 is verified with logic simulation.

Figure 19:
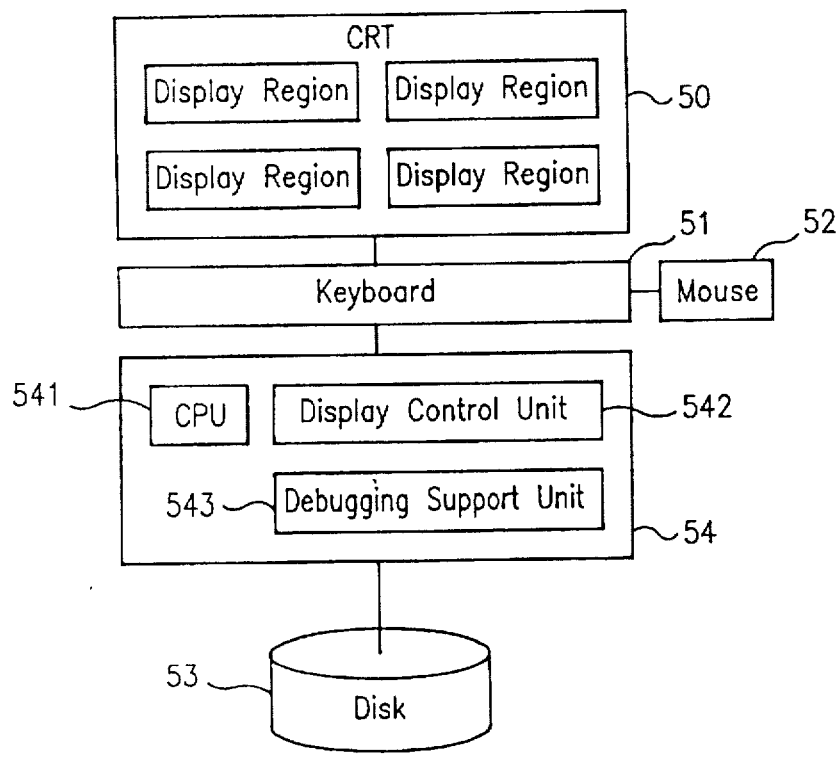
FIG. 19 is a diagram depicting construction of the hardware of a first illustrative embodiment of the invention.

FIG. 19 shows an example of the construction of hardware of the first illustrative embodiment, which corresponds to an EWS that is mounted in a computer system, and comprises a CRT display unit 50, a keyboard 51, a mouse 52, a disk 53, and a process control unit 54. CRT display unit 50 displays figures, waveforms, characters, etc. Keyboard 51 is used to input characters, symbols, and the like. Mouse 52 is used to specify menus, areas, and the like. Disk 53 stores the following and similar information:

(1) Circuit information described in net list or hardware description language (hereinafter called "HDL") for logic simulation.

(2) Program information for operating circuits.

(3) Logic function of each element used in circuit information.

(4) Library including an electric specification.

(5) Software for general purpose logic simulator.

(6) Software for ICE described in HDL.

(7) General purpose CPU, ROM, RAM and user logic models to be described later.

Process control unit 54 has a CPU 541, which mainly executes logic simulation, and stores or displays the results of simulation, in disk 53 or on CRT display unit 50. Process control unit 54 is provided with a display control unit 542 and a debugging support unit 543. Display control unit 542 displays the logic simulation results on a predetermined display region of CRT display unit 50. Debugging support unit 543 performs debugging at a predetermined display region of CRT display unit 50.

Figure 20:
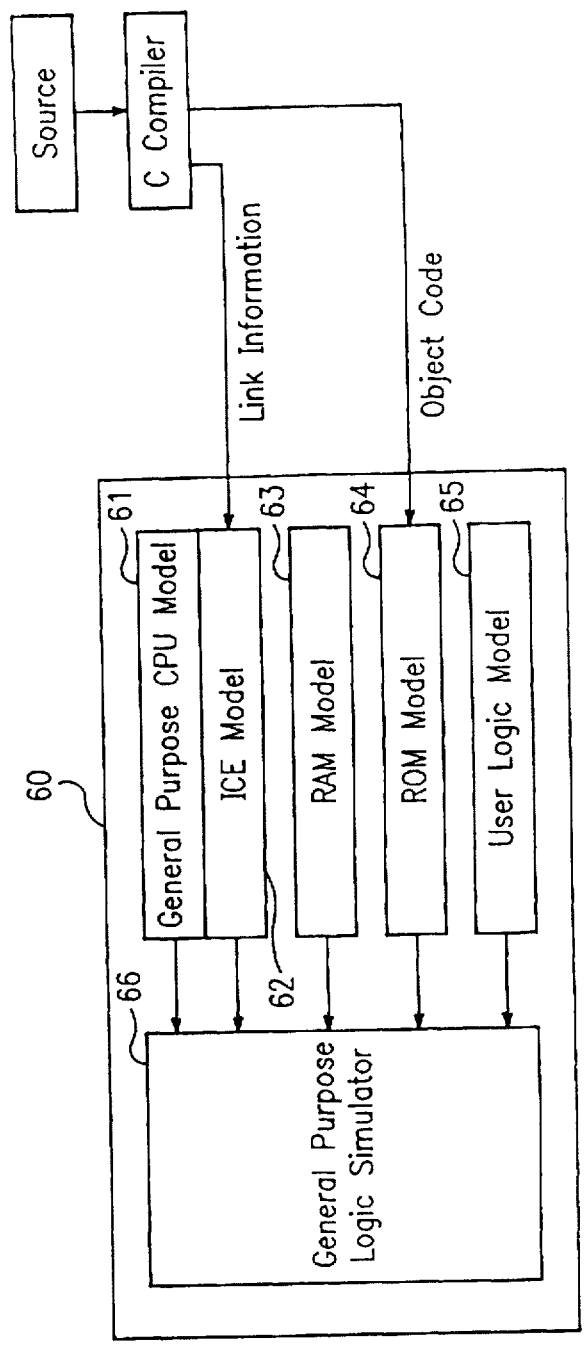
FIG. 20 is a block diagram depicting functions of the first embodiment.

FIG. 20 shows the functions of the first embodiment, wherein a logic simulation support system 60 comprises a general purpose CPU model 61, ICE model 62, RAM model 63, ROM model 64, a user logic model 65, and general purpose logic simulator 66. General purpose CPU model 61 is a file in which the function and operating timing of a general purpose CPU to be verified have been described in HDL.

ICE model 62 is a file in which the following functions have been described in HDL:

(1) Assembly display function of an execution instruction of a general purpose CPU.

(2) C source code display function.

(3) Function of displaying the content of an internal register of a general purpose CPU.

(4) Function of setting, displaying, and releasing a break point.

(5) External interrupt display function.

(6) Damp function to RAM.

(7) Read/write function with respect to user logic.

(8) Instruction step execution function.

(9) Function of measuring execution time.

(10) Execution function display function at C source level.

The C source code display function and the execution function display function are realized by inputting logic simulation support system 60, the object codes obtained from a source file, described in advance in C programming language, and compiled by a C compiler, and instructions obtained together with the object codes. Also, link information is provided to an instruction store address. The instruction store address used herein is a store address to a ROM model 64 to be described later. The source file is an application program that is made by the user, and the C compliler is provided by the user.

RAM model 63 is a file described as the work area or data store region of the general purpose CPU in HDL. ROM model 64 is provided as the store region of a program that the general purpose CPU executes and is a file comprising 0 and 1 patterns. The above described object codes are loaded down into ROM model 64. User logic model 65 is a circuit part that is built by the user and is a file described with a register transfer level or a gate level capable of logical synthesis.

General purpose logic simulator 66 has inputted therein signals from general purpose CPU model 61, ICE model 62, RAM model 63, ROM model 64, and user logic model 65, when logic simulation is executed, and executes logic simulation in which a virtual CPU mounted circuit, which is constituted of general purpose CPU model 61, RAM model 63, ROM model 64, and user logic model 65, is verified by ICE model 62.

General purpose CPU model 61, ICE model 62, RAM model 63, ROM model 64, user logic model 65, and general purpose logic simulator 66 are stored in disk 53 (see FIG. 19). ICE model 62 corresponds to software for ICE described in HDL which is stored in disk 53. General purpose logic simulator 66 corresponds to software for general purpose logic simulator which is stored in disk 53.

As HDL for describing general purpose CPU model 61, ICE Model 62, RAM model 63, ROM model 64, there is used Verilog-HDL, for example.

While the HDL was developed as language for designing VLSI (very large scale integrated circuit), it is now extensively used as simulation language, modeling language, programming language, and logical synthesis language. RTL is a subset of HDL and is mainly positioned as a logical synthesis language.

Priorly, after a CPU mounted circuit was made, the verification of the hardware and the software was performed. On the other hand, in a system of the invention, the general purpose CPU model, the RAM model, the ROM model, and the user logic model are described in advance as files. Then, an ICE function is inputted as an ICE model to part of the general purpose logic simulator. By using the EWS as a logic simulation support system and logic simulation as a base, the verification of the hardware and software is performed on the EWS by the ICE model before the CPU mounted circuit is made.

Figure 21:
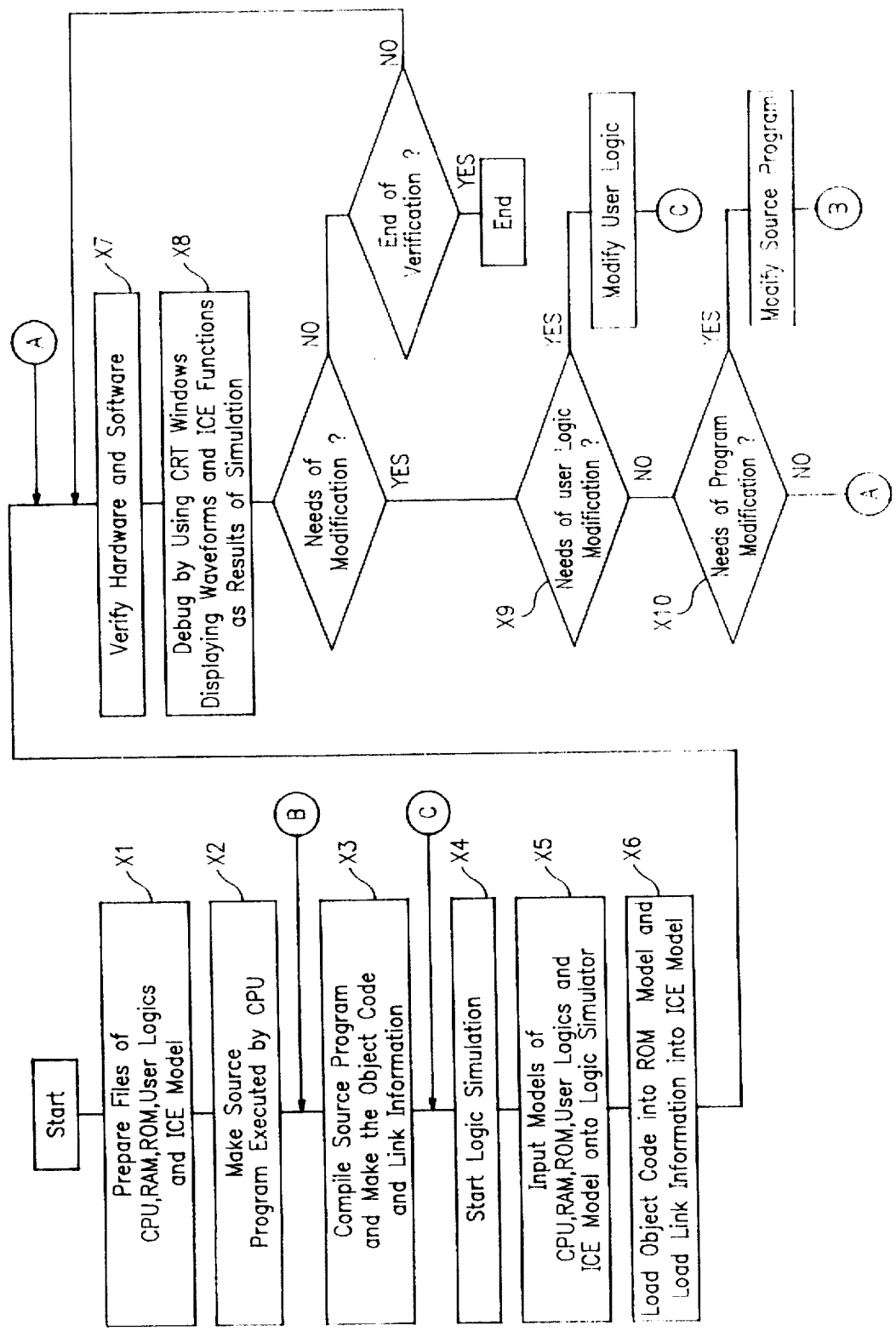
FIG. 21 is a flow chart depicting operational steps of the first embodiment.
Figure 22:
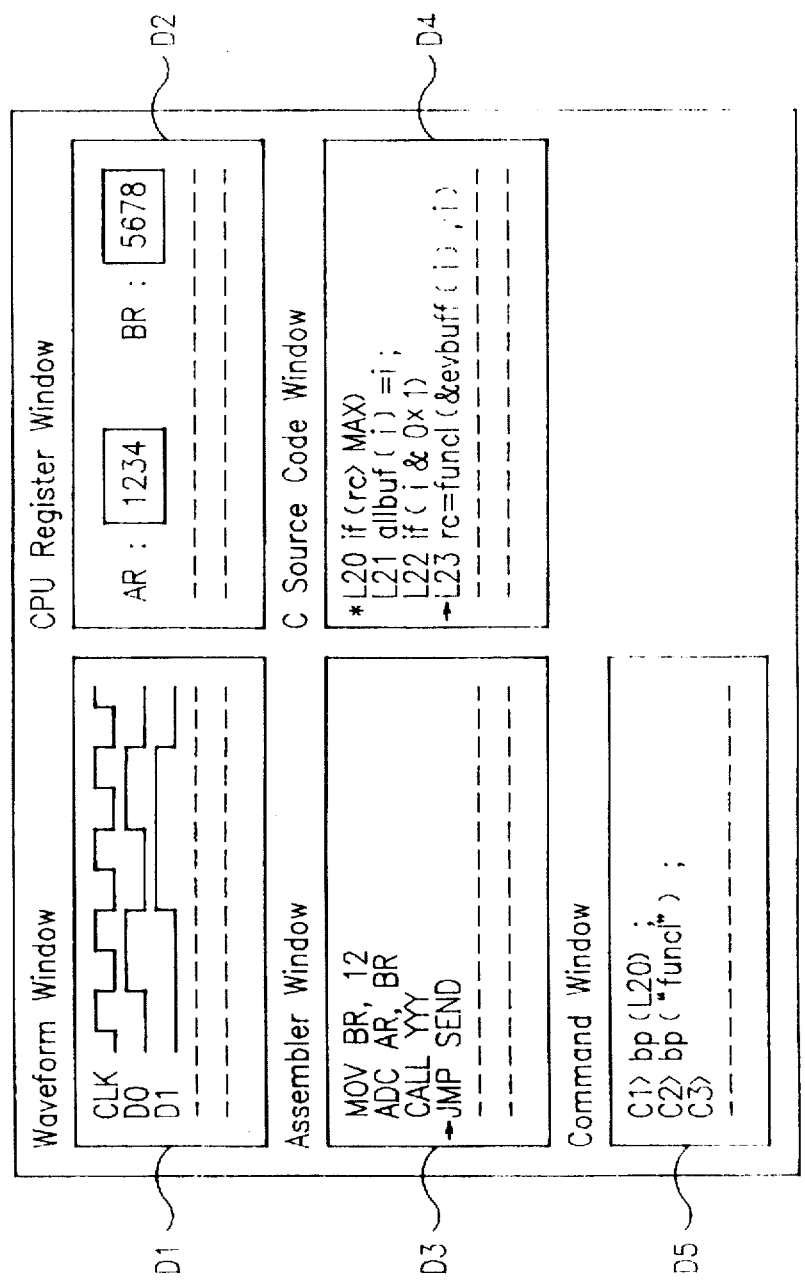
FIG. 22 is a diagram depicting an example of a display window for the results of logic simulation.

The operation of the first embodiment is now described with reference to FIGS. 21 and 22, wherein FIG. 21 shows the operational steps of the first embodiment, and FIG. 22 shows an example of the display windows on the CRT display unit 50 as a result of the simulation. In the following description, Steps (X1) to (X10) correspond to Steps X1 to X10 of FIG. 21.

(X1) First, prepare files of the CPU 61, RAM 63, ROM 64, user logic 65, and ICE models 62, and store them in disk 53.

(X2) Next, make a source program (C source, for example), that is executed by the general purpose CPU model. This source program is an application program made by the user.

(X3) The source program which is made is compiled by a compiler (C compiler, for example) and the object code and link information are made. These are stored in disk 53. The link information is the following information:

(1) Source line number.

(2) Information in which there are paired a source list, and an absolute address at which the head instruction of instruction groups constituting the source list is stored.

(3) Information in which there are paired a name of each function used in the source program and an absolute address at which the head instruction of instruction groups constituting the function is stored.

(X4) Start logic simulation.

(X5) When the general purpose logic simulator 66 is started, process control unit 54 will read out general purpose CPU model 61, ICE model 62, RAM model 63, ROM model 64, user logic model 65, and the library for circuit information from disk 53. Then, general purpose CPU model 61, ICE Model 62, RAM model 63, ROM model 64, and user logic model 65 all output signals which are applied to the general purpose logic simulator 66.

(X6) Next, by use of disk 53, the object codes are loaded into ROM model 64, and the link information is loaded into the ICE Model 62.

With the above operation, the verification operation of the hardware and software of the CPU mounted circuit is in a ready state.

(X7) Execute the verification operation of the hardware and software.

(X8) Process control unit 54 performs display operation such as shown in FIG. 22 on the window of display unit 50, as a result of the simulation of the CPU mounted circuit by general purpose logic simulator 66. In FIG. 22, the timing diagram of waveforms, at an arbitrary position in the CPU mounted circuit, is displayed at a display region D1. Also, with the function of ICE Model 62, the state value of a register in the general purpose CPU mounted circuit is displayed at display region D2, and the assembly code and C source code being executed general purpopse CPU 61, are displayed at region D3 and display region D4. The arrows → in FIG. 22 represent the assembly code and C source code that are being executed, respectively.

The display of the assembly code is a mnemonic informed to process control unit 54 when the object code, comprising 0 and 1 patterns read out from ROM model, is decoded by the instruction decoding unit of the general purpose CPU 61.

The verification and debugging are performed ay making use of the function of a break point at the level of C source code. The setting of the break point at the C source code level is performed by clicking, for example, a corresponding source in the display region D4 of the C course code shown in FIG. 22 with mouse 52. A mark of * is applied to the corresponding source clicked with the mouse 52. The break point can also be set by inputting a line number corresponding to the corresponding source and also a command to the command window D5 by using the keyboard 51. The term bp(L20) in window D5 of FIG. 22 is an input from the keyboard 51.

The setting of the break point at an execution function level is also performed by a corresponding function name and a command to the command window D5 by likewise using keyboard 51. The term bp("func1") in window D5 of FIG. 22 is an input from keyboard 51.

The display of the windows of FIG. 22 is performed by display control unit 542.

(X9) Where modification is needed, for example, in the user logic, the file described at the RTL or gate level is modified, and then, the logic simulation is again executed.

(X10) Where modification is needed in a program, the source program is modified. Then, this modified program is again complied with to remake the object code and link information, and the logic simulation is again executed.

Where modification is needed at a point other than the user logic and program, the point is modified and then the logic simulation is again executed.

The Steps (X9) and (X10) are repeated until no correction is needed and the verification is completed. The correction is performed by debugging support unit 543.

By operating the logic simulation support system of the invention on a single EWS and inputting a general purpose CPU model, which is to be verified, as a part of an input file by the general logic simulator, and displaying the function of the ICE model corresponding to that general purpose CPU on the window of the CRT display unit 50, the verification and debugging of the hardware and software, are performed.

Figure 1:
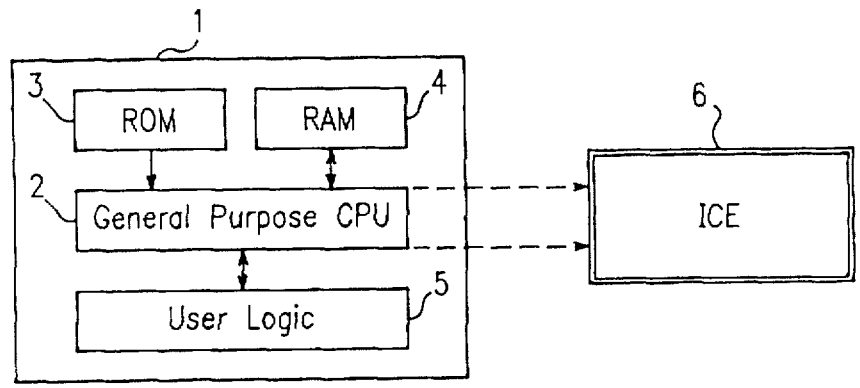
FIG. 1 is a block diagram depicting a conventional CPU mounted circuit which is the target of development.
Figure 2:
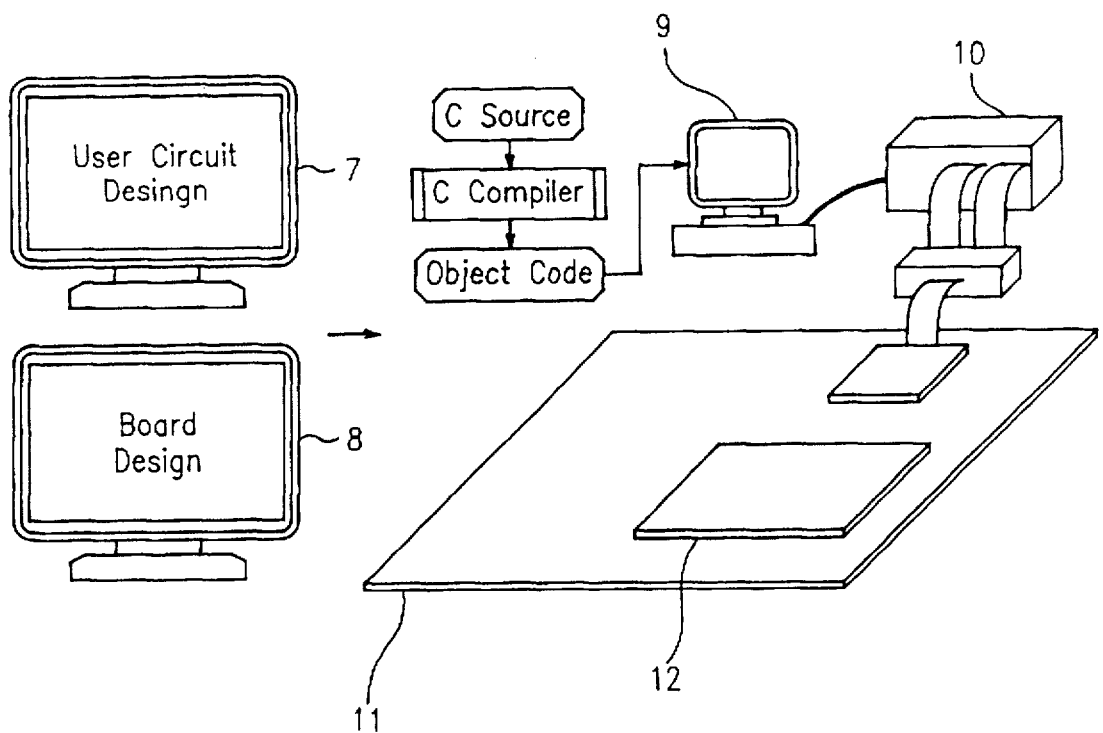
FIG. 2 is a schematic view depicting the environment under which the development and debugging of an ASIC are performed in the prior art.
Figure 11:
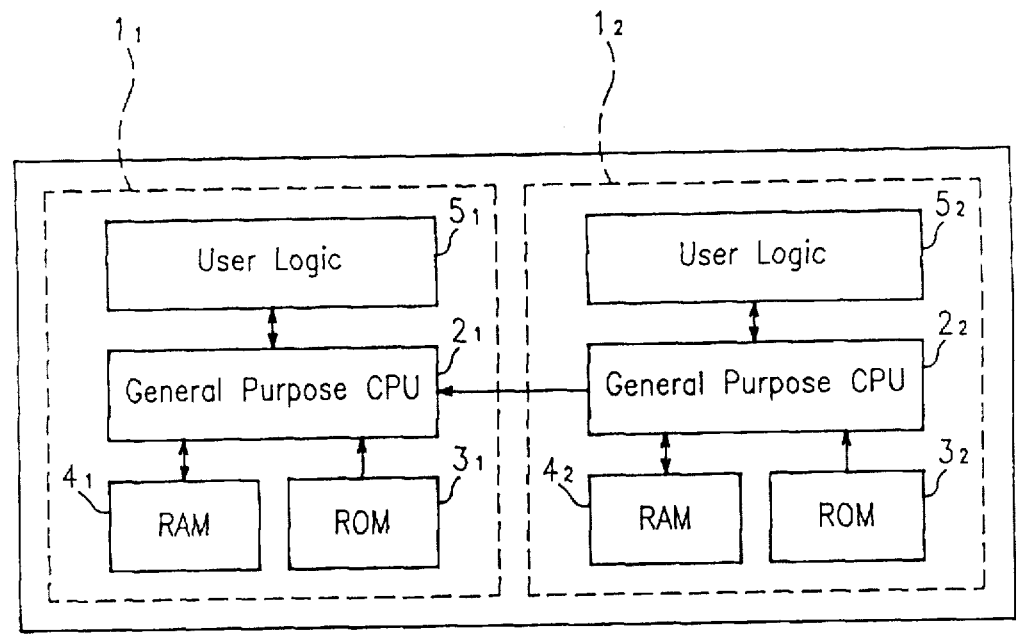
FIG. 11 is a diagram depicting the construction of a CPU mounted circuit which is the target of verification.

Note that the target of verification is not limited to a single CPU mounted circuit such as shown in FIG. 1. It may also be a plurality of CPU mounted circuits, such as shown in FIG. 11.

Alternatively, the object of verification may be a single CPU mounted circuit in which a plurality of the same or different general purpose CPUs are mounted. In such a case, by loading a plurality of ICE models into a single general purpose logic simulator and respectively displaying the functions of the ICE models on the windows of a single CRT device, the verification of the hardware and software can be performed efficiently.

On the other hand, in a conventional example, it is necessary to prepare a plurality of actual ICEs, so that the conventional example cannot perform verification efficiently as compared with the invention.

The embodiment enjoys the following and other advantages. Before making actually a CPU mounted circuit, the CPU mounted circuit model and the ICE mode are virtually made with files described in HDL, and logic simulation is performed wherein the CPU mounted circuit model is verified by the ICE model. With this, there are attained the following advantages:

(1) Even if a general purpose CPU mounted in a CPU mounted circuit were operated at high speed, probing can be performed at the actual operational speed.

(2) Even if the circuits of the CPU mounted circuit were integrated with high density, there would be no possibility that probing be physically limited.

(3) Even if the need for correction occurred in the CPU mounted circuit, there would be no need for remaking an actual CPU mounted circuit, and all one would have to do would be to correct the CPU mounted circuit virtually made on the EWIS, so that cost of development is reduced and the period of development is shortened.

Figure 23:
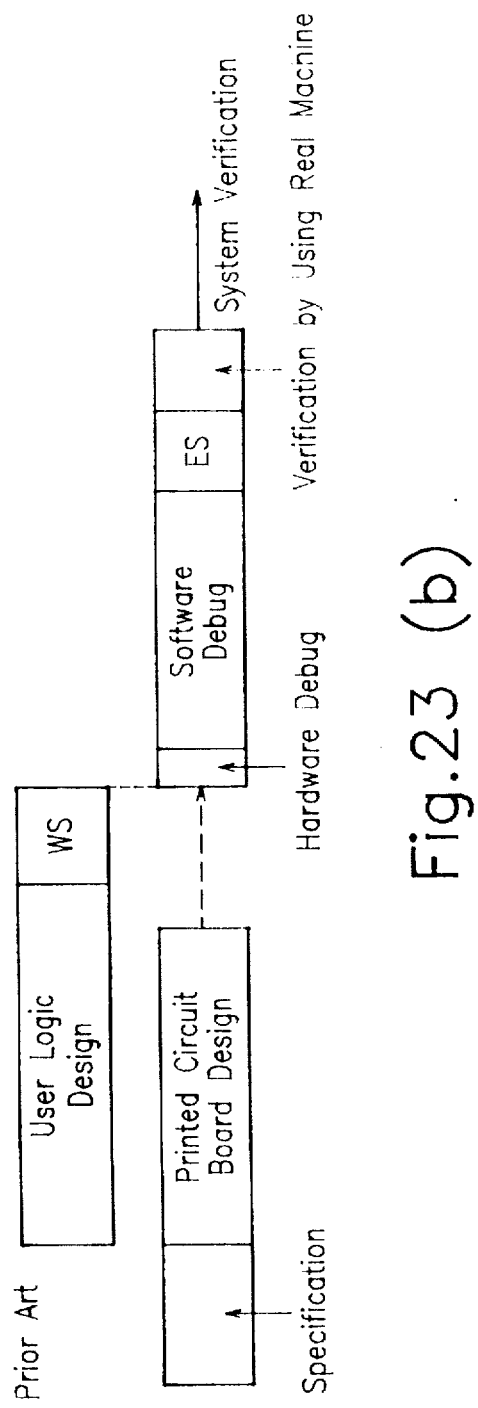
FIGS. 23(a) and 23(b) are diagrams used to explain the effects of the first embodiment.
Figure 23:
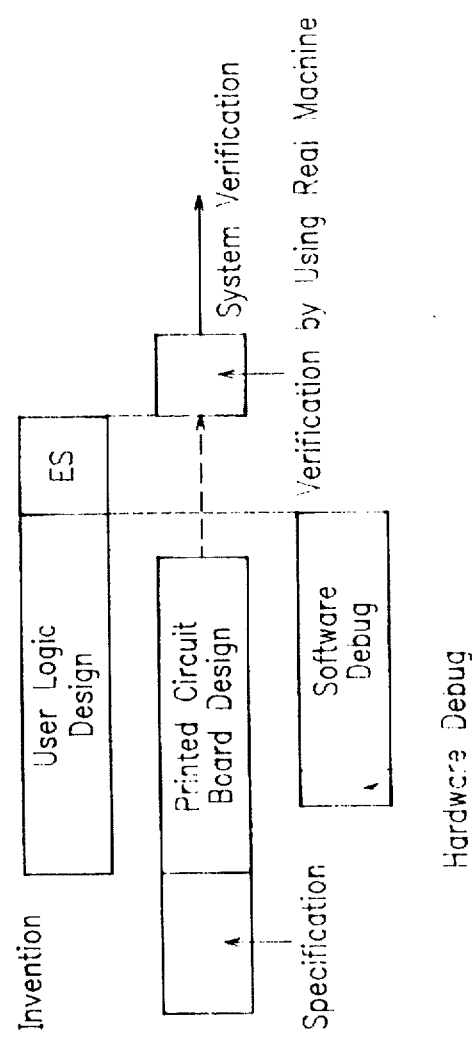

(4) As shown in FIG. 23(a), conventionally, the development of hardware and software and debugging by use of ICE, are performed in a series manner, that is one after the other. On the other hand, with the invention, the development of hardware and software and debugging by the ICE can take place in a parallel manner, that is substantially concurrently, as shown in FIG. 23(b). Thus, efficiency of development with the invention is greatly enhanced.

Also, since the system of the first embodiment is constructed on the basis of a general purpose logic simulator, the following advantages are attained:

(5) In realizing a certain function, the trade off between the realization of a general purpose CPU by software and the realization of a user logic by hardware can fully be examined before an actual CPU mounted circuit is made, so that optimum allocation can be made.

(6) The performance of the entire CPU mounted circuit, including hardware and software, can be estimated efficiently and accurately before the CPU mounted circuit is actually made.

As has been described above, the first embodiment can prevent correction of hardware and software after a CPU mounted circuit is made, and thus, can contribute to improvement in efficiency of development of the CPU mounted circuit.

(b-2) Second Embodiment

Figure 24:
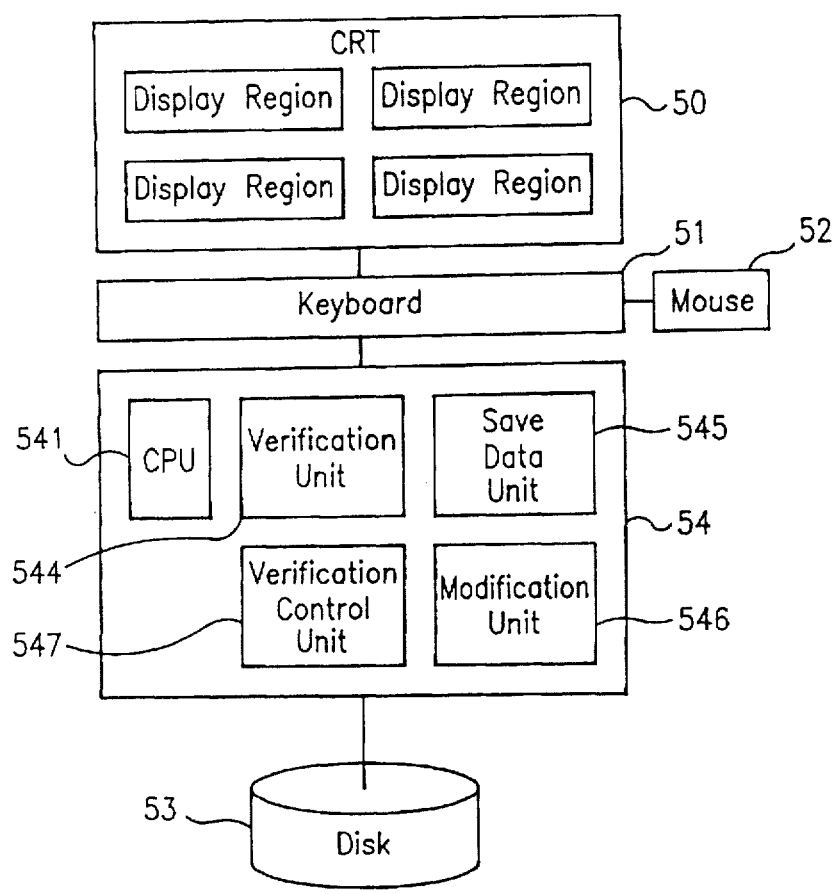
FIG. 24 is a diagram depicting the contruction of the hardware of the second illustrative embodiment.

FIG. 24 shows the second illustrative embodiment wherein the same reference numerals are used for the same parts as in the first embodiment, and wherein process control unit 54 comprises a verification unit 544 for verifying a program and a save data unit 545 for saving necessary data for the next step in disk 53 each time each step of a program is completed. A modification unit 546 is also provided for modifying a program when an error is found in verification and for rewriting the content of a ROM model with the modified program. The modification of a program is performed on the display region of a CRT display unit 50, for example. A verification control unit 547 is provided for controlling the verification of verification unit 544. The operations of these units will be described later.

Figure 3:
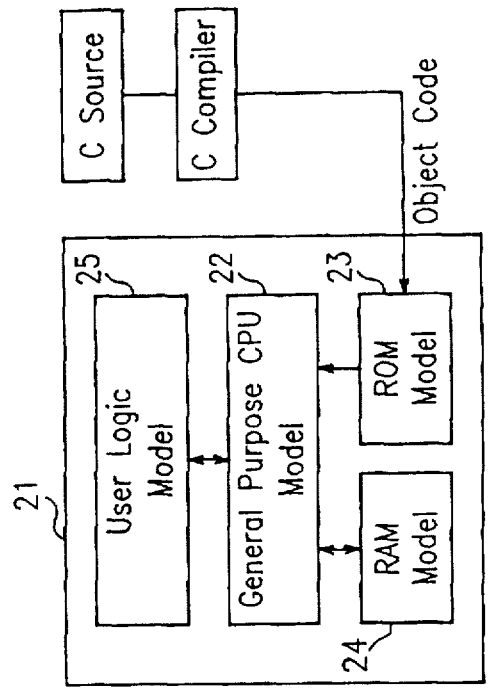
FIG. 3 is a diagram depicting a virtual model of the CPU mounted circuit of FIG. 1.
Figure 6:
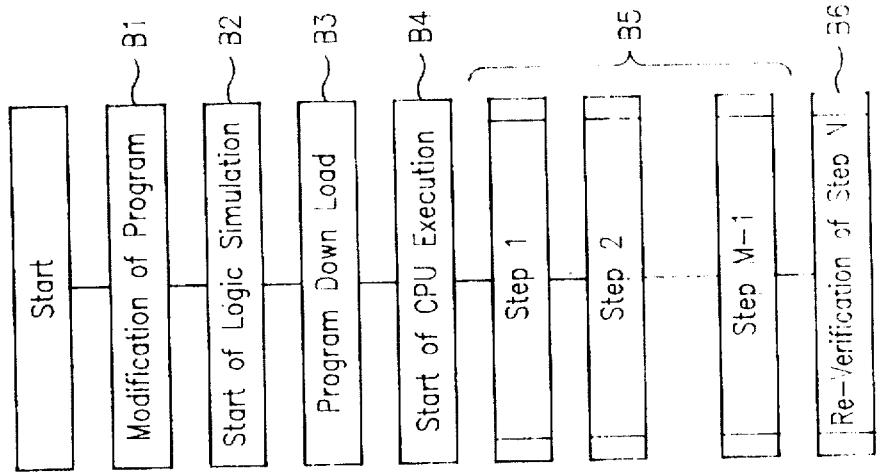
FIG. 6 is a flow chart depicting the Steps as logic simulation is performed with the CPU mounted circuit of FIG. 3.

The second embodiment is a system for verifying the software of a CPU mounted circuit as that shown in FIG. 1. A virtual model of the CPU mounted circuit of FIG. 1, i.e. the CPU mounted circuit model shown in FIG. 3, is prepared, and with this model, the software of the software of the CPU mounted circuit is verified by logic simulation.

Figure 25:
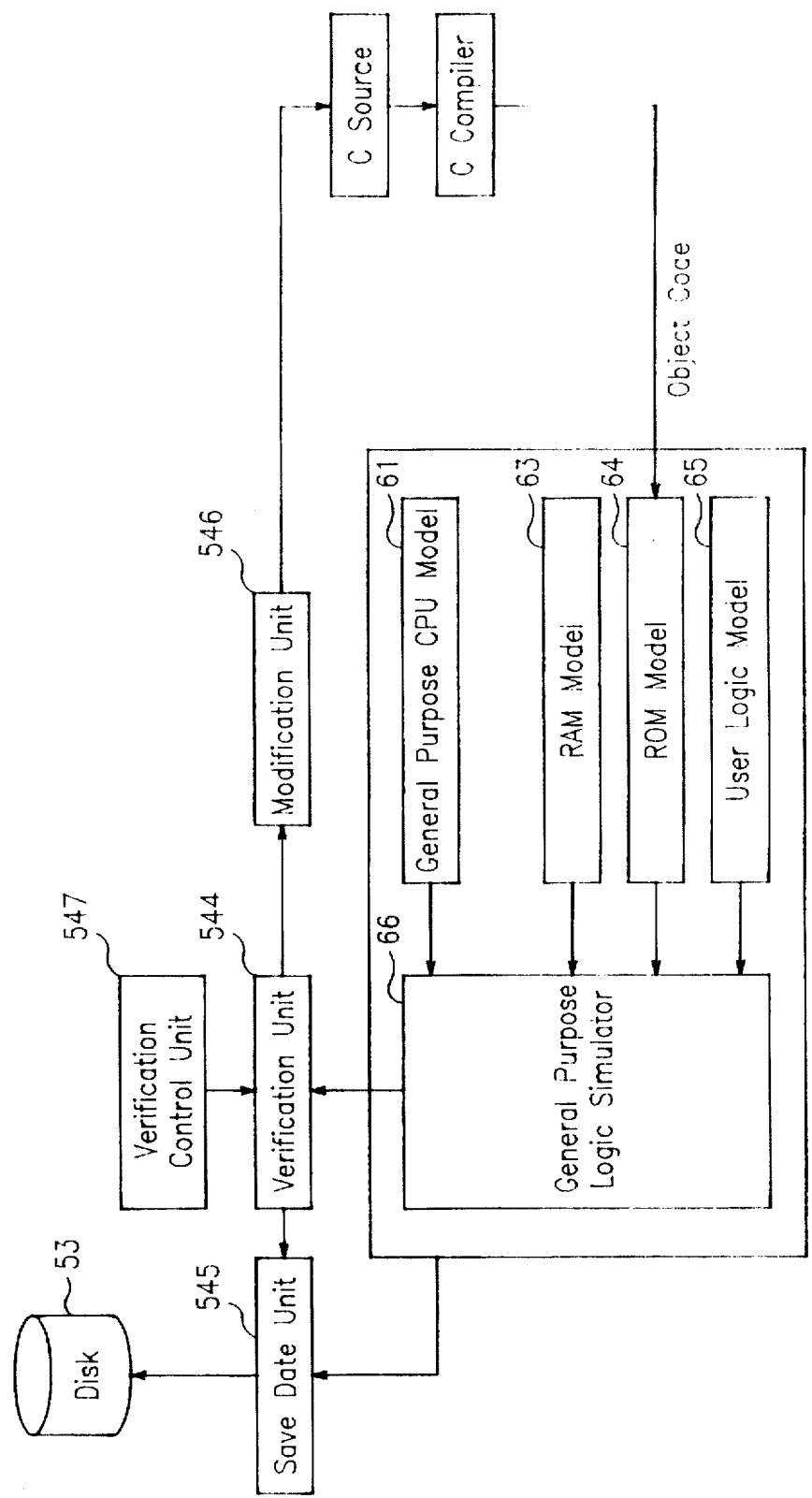
FIG. 25 is a block diagram depicting the functions of the second embodiment.
Figure 26:
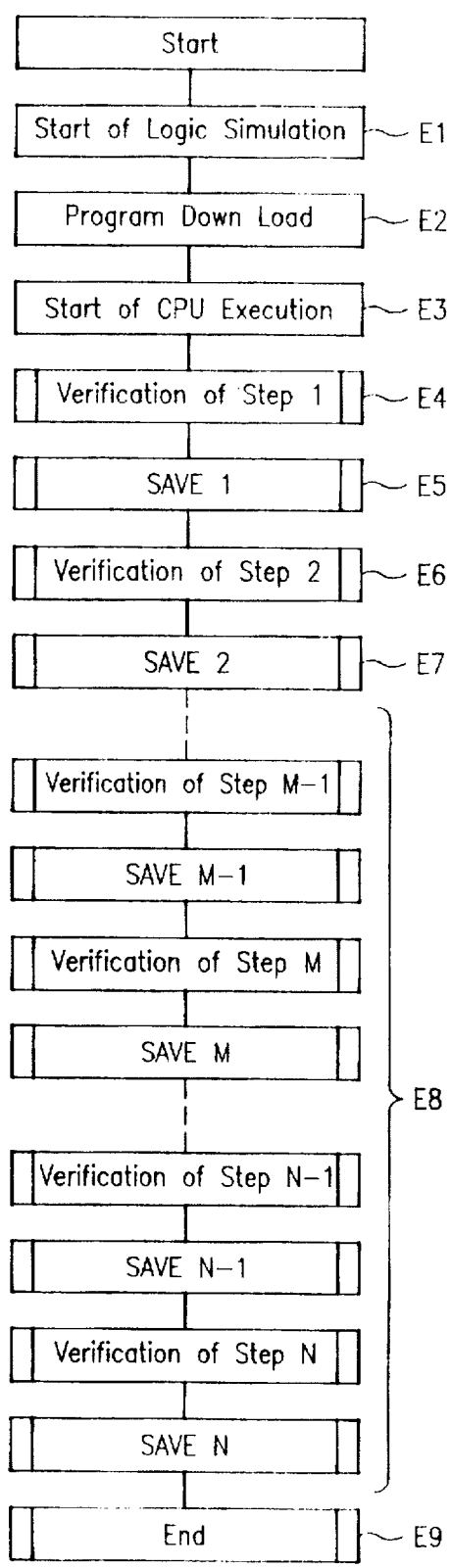
FIG. 26 is a flow chart used to explain the operation of the second embodiment.

FIG. 25 shows the functions of the second illustrative embodiment of FIG. 24. The operation of the second embodiment will be described with reference to FIG. 26, which shows the procedure steps of the program of FIG. 4 which is stored in ROM model 64 and verification is performed with logic simulation. The flow chart of FIG. 26 shows the case where no errors are found in the program.

The verification procedure is as follows. In the following description, Steps (E1) to (E9) correspond to Steps E1 to E9 of FIG. 26.

(E1) Start the general purpose logic simulator 66 to execute the logic simulation. When general purpose logic simulator 66 is started, process control unit 54 will read out general purpose CPU model 61, RAM model 63, ROM model 64, user logic model 65, and the library for circuit information from disk 53. Then, the outputs from these units are applied as inputs to general purpose logic simulator 66.

(E2) The object codes of a program to be examined are loaded from disk 53 into ROM model 64.

(E3) General purpose CPU model 61 is started, and by ROM model 64, the object codes are read out in sequence and the instructions are executed.

(E4) Execute the program of Step 1 to perform the verification corresponding to that program.

(E5) The contents of general purpose CPU model 61 and the register provided in user logic model 65 and the contents of RAM model 63, at the time of execution and verification of Step 1 is finished, are saved in disk 53. The "SAVE 1" in FIG. 26 means the saving after the completion of Step 1. A like expression will hereinafter be used for each step.

(E6) Execute the program of Step 2 to perform the verification corresponding to that program.

(E7) The contents of the general purpose CPU model 61 and the register provided in user logic model 65 and the contents of RAM model 63 at the time of execution and verification of Step 2 have been completed, are saved in disk 53.

(E8) Likewise, the progam of each of steps 3 to N is executed and verification corresponding to each program is performed. Each time the execution and verification of each step are completed, the contents of the general purpose CPU model 61 and the register provided in user logic model 65 and the contents of RAM model 63 are saved in disk 53.

Such saving is performed by save data unit 545. The verification of each step is performed by verification unit 544.

(E9) Finish the logic simulation.

Figure 4:
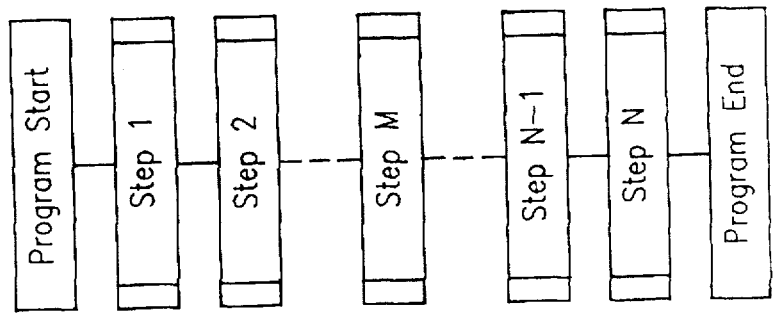
FIG. 4 is a flow chart depicting the Steps of a program which is the target of verification.
Figure 27:
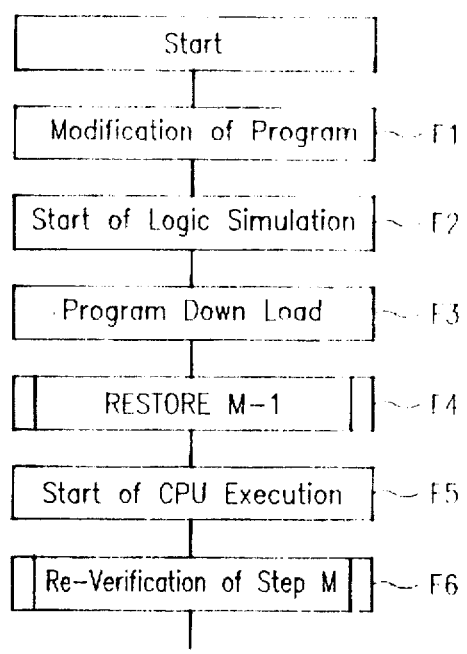
FIG. 27 is a flow chart used to also explain the operation of the second embodiment.

FIG. 27 shows the steps of a logic simulation in the case where an error is found in Step M of the program of FIG. 4. In the following description Steps (F1) to (F6) correspond to Steps F1 to F6 of FIG. 27.

(F1) The program from the source file corresponding to Step M is modified, and the entire program after modification is again compiled. The program modification is performed by modification unit 546.

(F2) Start the general purpose logic simulator to execute logic simulation. When general purpose logic simulator is started, process control unit 54 will read out general purpose CPU model 61, RAM model 63, ROM model 64, user logic model 65, and the library for circuit information from disk 53, and then apply the signals therefrom to general purpose logic simulator 66.

(F3) The object codes of the modified program are again loaded from disk 53 into ROM model 64.

(F4) The contents saved after the execution and verification of Step M–1 is read out from disk 53 and again stored in general purpose CPU model 61, the register provided in user logic model 65, and RAM model 63.

(F5) General purpose CPU model 61 is started, and by ROM model 63, the object codes are read out in sequence and the instruction is executed.

(F6) The execution and verification of Steps 1 to M−1 are bypassed, and the program for Step M is immediately executed and verifiers. If no error is found as a result of verification, the program of the next Step M+1 is executed and verified. If an error is found to still exist, the Steps (F1) to (F5) are repeatedly executed.

The above bypass of execution and verification is performed by controlling verification control unit 547.

The second embodiment enjoys the following and other advantages. When the program is verified with logic simulation, the contents of the general purpose CPU model, register provided in the user logic model, and RAM model are saved in the disk each time each step of the program is completed. When an error is found in a certain step M, the contents saved in step M−1 is again stored in general purpose CPU model, the register provided in the user logic model, and RAM model, for the program after the error has been corrected. Then, the execution and verification of Steps 1 to M−1 are bypassed, and the program for Step M is immediately executed and verified. Thus, the time required for getting to the verification of the error portion becomes shorter, so that verification of the error portion is performed with efficiency, and verification efficiency of the software of the CPU mounted circuit is enhanced.

(c-3) Third Embodiment

Figure 28:
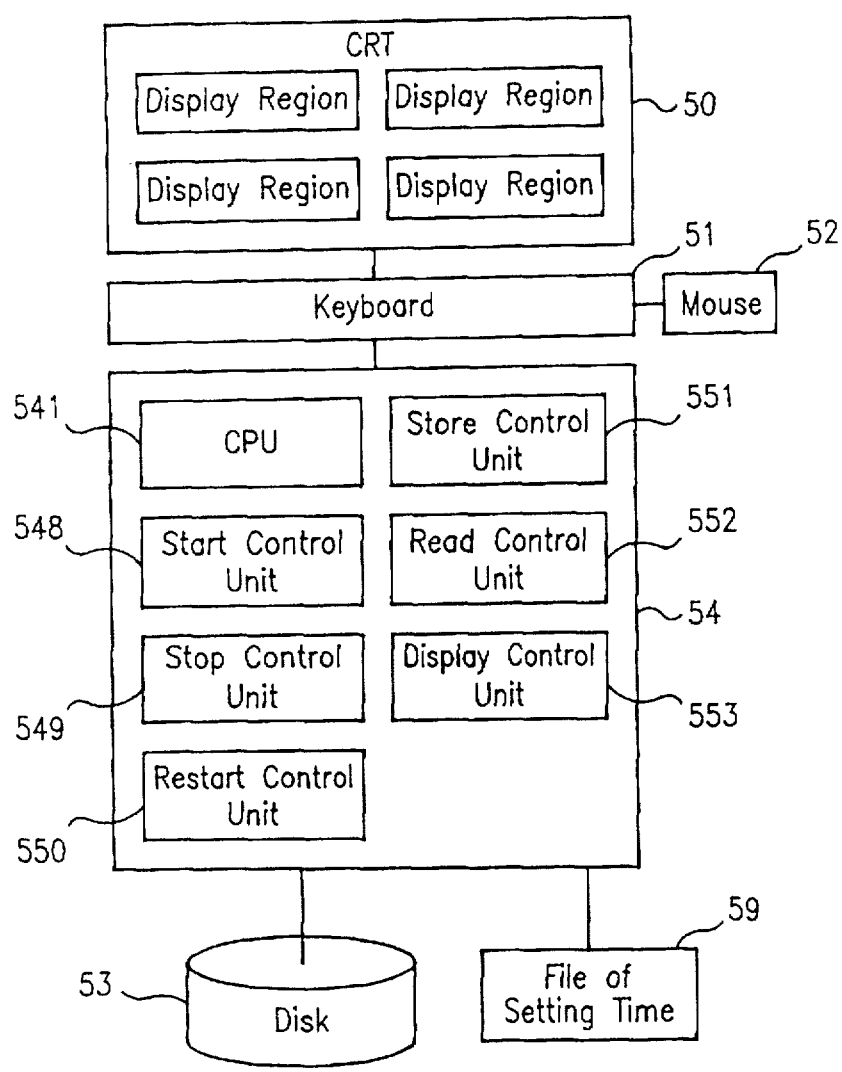
FIG. 28 is a diagram depicting construction of the hardware of the third illustrative embodiment.

FIG. 28 shows the hardware of the third illustrative embodiment, wherein process control unit 54 comprises a start control unit 548, a stop control unit 549, a restart control unit 550, a store control unit 551, a read control unit 552, a display control unit 553, and a CPU 541. Details of the operation thereof will be set forth later.

A file 54 is provided for setting time in which a plurality of data for setting the display start time and display time width of a simulation result. With the data stored in time setting file 59, a plurality of waveform displays are performed with different display time widths for the same simulation results.

The third embodiment is a system for verifying the hardware of a CPU mounted circuit such as that shown in FIG. 1. The virtual model of the target logic shown in FIG. 3 is prepared, and with this model, the hardware of the target logic is verified by logic simulation.

Figure 29:
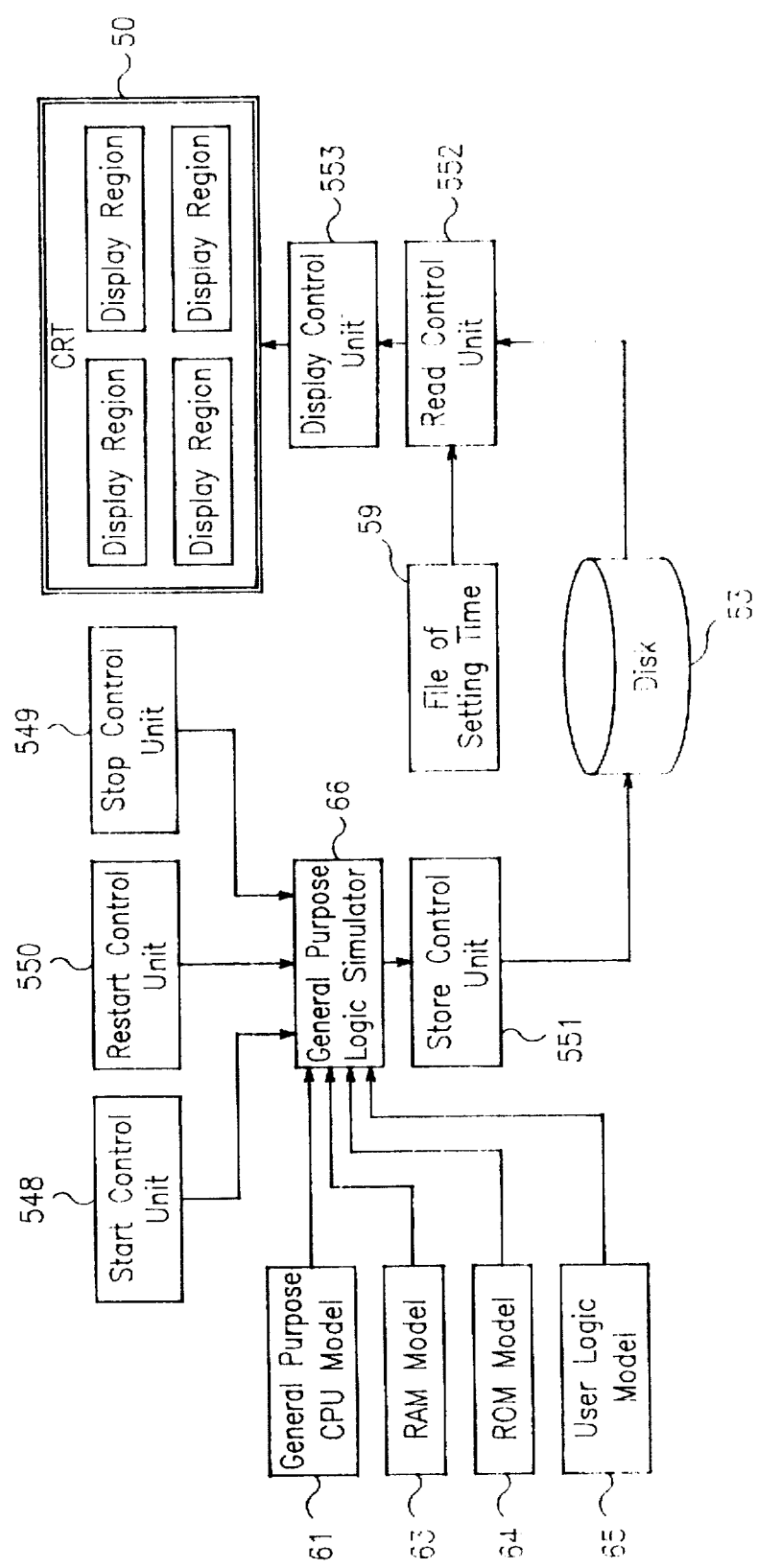
FIG. 29 is a block diagram depicting the functions of the third embodiment.

FIG. 29 shows the functions of the third embodiment. Start control unit 548, stop control unit 549, and restart control unit 550 perform the instructions of start, stop and restart of the logic simulation, respectively.

Store control unit 551 stores in disk 53 the signal data and simulation time data necessary for verification of the target logic model obtained as a result of logic simulation. Read control unit 552 reads the signal data and simulation time data corresponding to the display start time and display time width from disk 53 by referring to the data of the display start time and display time width stored in time setting file 59.

Display control unit 553 converts the signal data and simulation time data read from disk 53, by read control means 552, into waveform timing diagrams and displays them on a plurality of display regions of CRT display unit 50. In this display, a plurality of waveforms different in display time widths are displayed with respect to the same simulation result by referring to a plurality of data of different display times and display time widths. That is, a waveform timing diagram of certain time width and a partially enlarged waveform timing diagram of that timing diagram are displayed on different display regions, respectively, of CRT 50. The waveform timing diagram displayed on each display region is renewed as the logic simulation proceeds.

Figure 30:
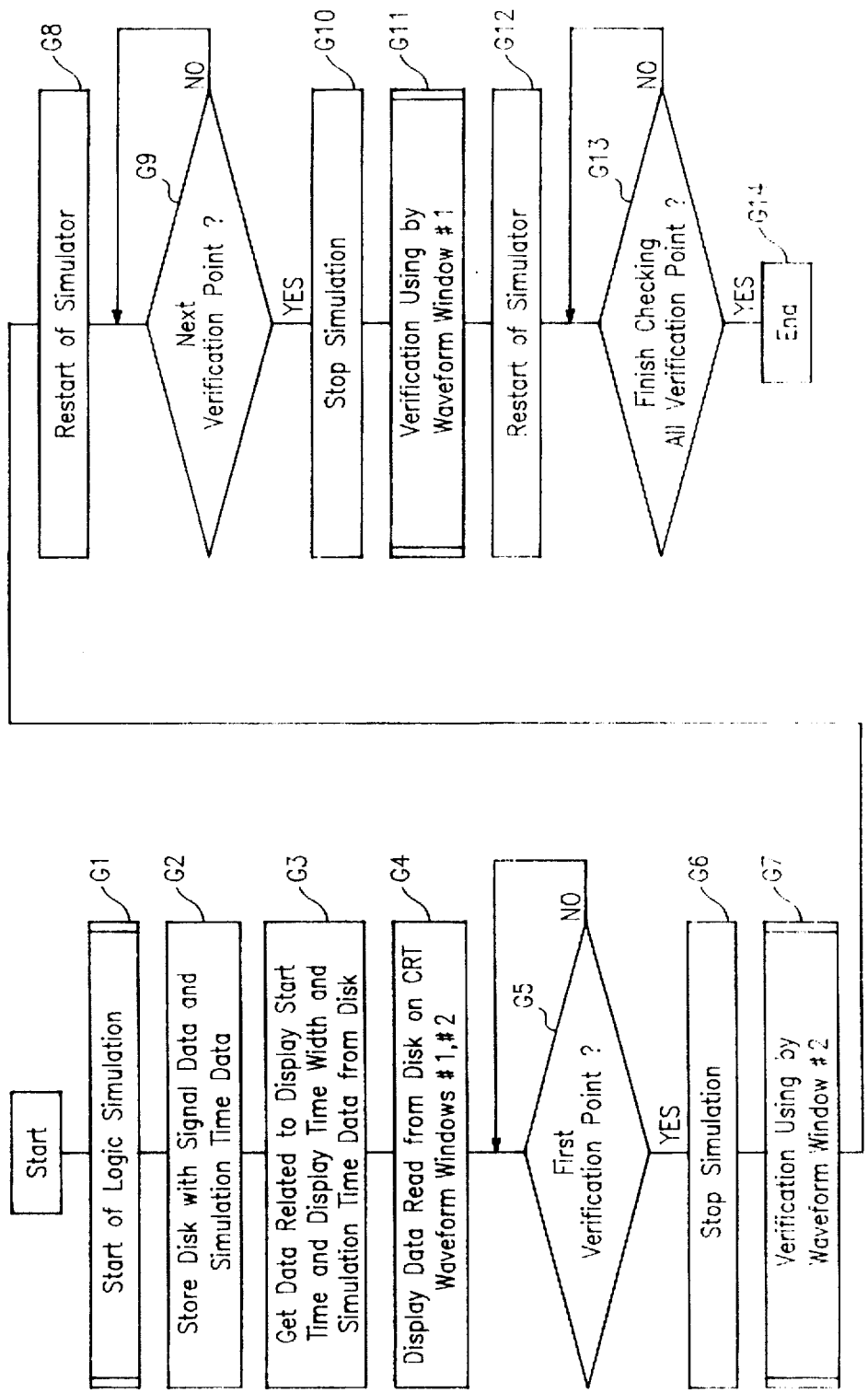
FIG. 30 is a flow chart used to explain the operation of the third embodiment.

The operation of the third embodiment is described with reference to FIG. 30, which shows procedural steps for verification using logic simulation of the hardware of a target logic model. The Steps will be described with Steps (G1) to (G14) corresponding to Steps G1 to G14 of FIG. 30.

(G1) Start general purpose logic simulator 66. This start is performed by start control unit 548. When general purpose logic simulator 66 is started, process control unit 54 will read out target logic model 21, a library for circuit information, and a signal file in which a plurality of previously registered signal names in the target logic model necessary for verification have been writtten, from disk 53. These signals are inputted to general purpose logic simulator 66 to start the logic simulation.

(G2) When the logic simulation is started, general purpose simulator 66 will follow the content of the signal file as a result of the simulation execution, and store signal data necessary for verification and also simulation time data in disk 53 using store control unit 551.

(G3) Read control unit 552 reads the signal data and simulation time data corresponding to the display start time and display time width from disk 53, by referring to data of the data start time and display time width stored in time setting file 59. The display start time and display time width, to which reference is made, have been specified in advance with respect to read control unit 552.

(G4) The signal data and simulation time data read out are converted into waveform timing diagrams and displayed on the waveform windows #1 and #2 of unit 50 by use of display control unit 553.

Figure 31:
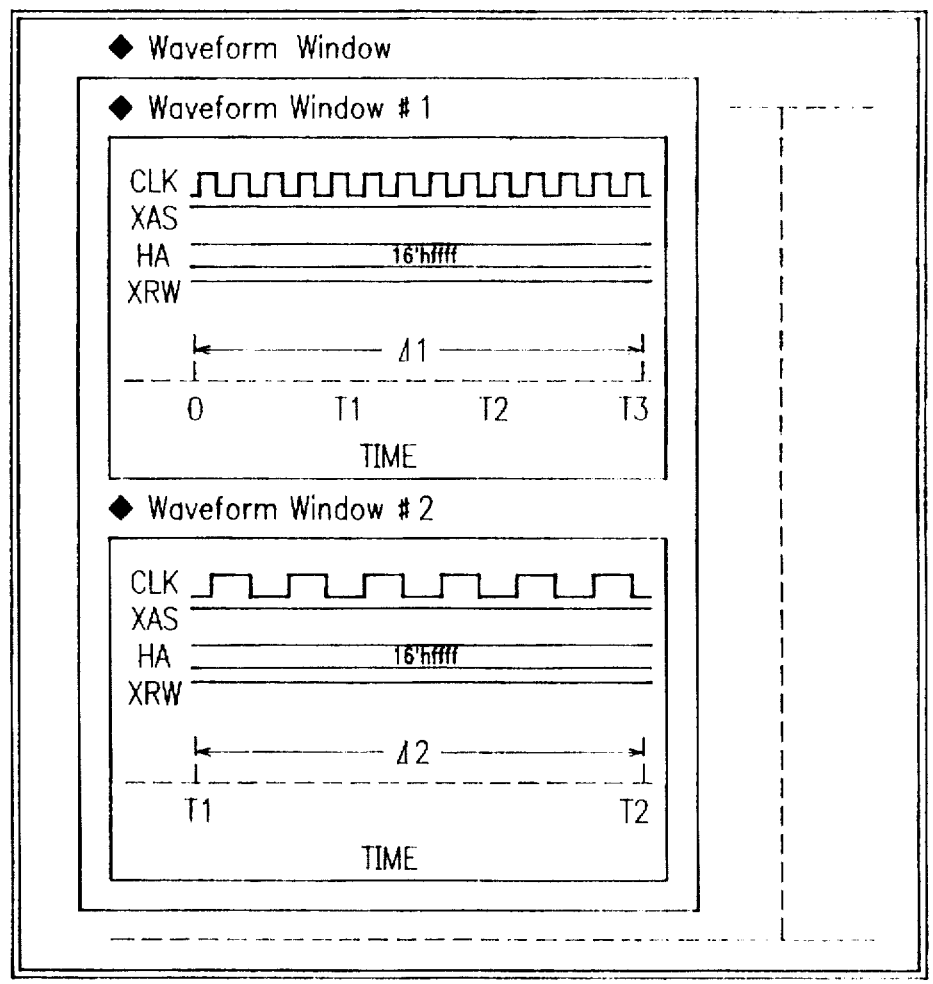
FIG. 31 is a diagram depicting an example of windows displayed in the third embodiment.

FIG. 31 shows an example of the windows of unit 50 at that time. Window #1 displays the simulation result between simulation time 0 and T3. The simulation result is displayed in the form of a waveform timing diagram. In window #1, the initial display start time is 0 and the display time width is δ1=T3−0. The display start time is renewed as the simulation proceeds. The display time width δT is constant unless it is changed.

Window #2 is a window for displaying on an enlarged scale the simulation result between simulation times T1 and T2 of window #1. The simulation result is displayed in the form of a waveform timing diagram. In window #2, the initial display start time is 0 and the display time width is δ2=T2−T1.

In the windows of FIG. 31, the current simulation time is T3; CLK represents a clock for providing operating timing; XAS represents a negative logic address strobe signal; HA represents a host address; and XRW represents a negative logic read/write signal. 16'hffff is data which is given as a default when the host address HA is not determined.

As the simulation proceeds, the waveform timing diagrams of windows #1 and #2 are renewed every hour with the display time widths held in δ1 and δ2. At this time, the display start times of Windows #1 and #2 are also renewed.

(G5) Check whether the waveform window has gotten to a first; verification point.

(G6) At the time the waveform window has gotten to the first verification point, the command in the command operating window (not shown) in the window of unit 50 is clicked with mouse 52. In response, stop control unit 549 stops the simulation once. At the same time as the simulation is stopped, the renewal of the display waveforms of windows #1 and #2 is also stopped.

Figure 32:
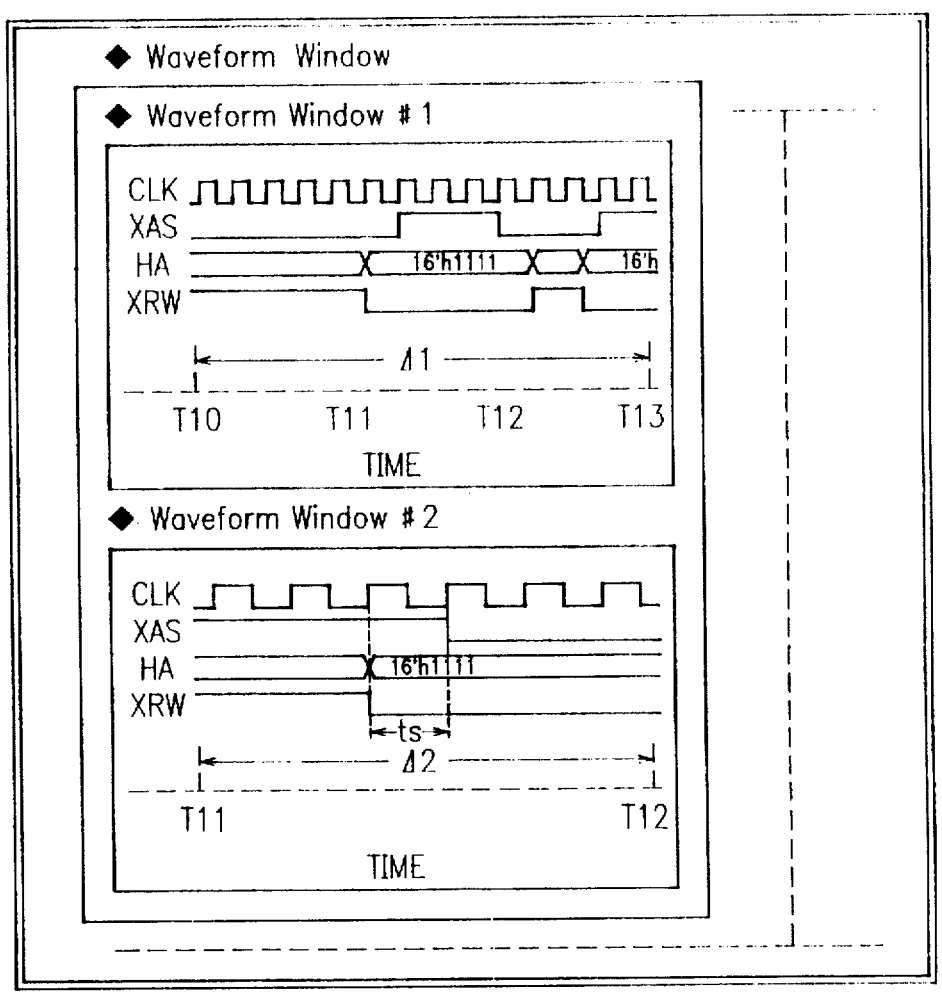
FIG. 32 is a diagram depicting an example of windows displayed in the third embodiment.

FIG. 32 is a diagram showing an example of the windows of unit 50 at that time. Window #1 displays the simulation result between simulation times T10 and T13. At that time, in window #1, the display start time is T10 and the display time width remains δ1, window #2 is a window displaying, on an enlarged scale, the simulation result between simulation times T11 and T12 of window #1. In window #2, the display start time is T11 and the display time width remains δ2. In the windows of FIG. 32, the current simulation time is T13.

Figure 5:
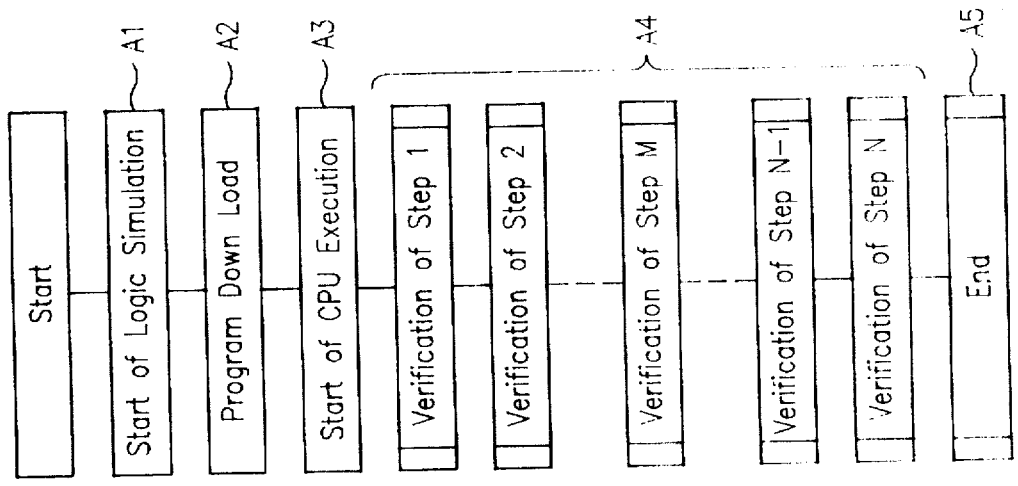
FIG. 5 is a flow chart depicting the Steps as logic simulation is performed with the CPU mounted circuit of FIG. 3.
Figure 7:
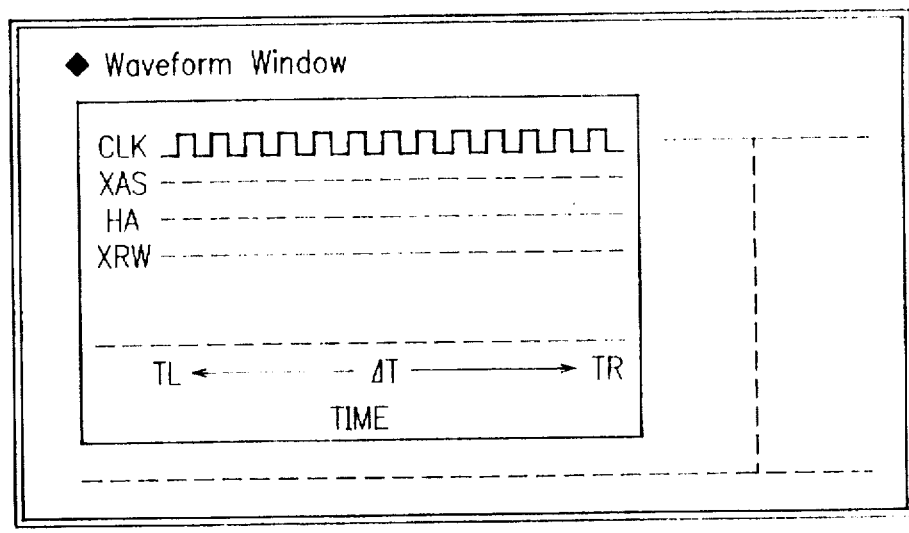
FIG. 7 is a diagram depicting an example of a window shown in a conventional system.
Figure 8:
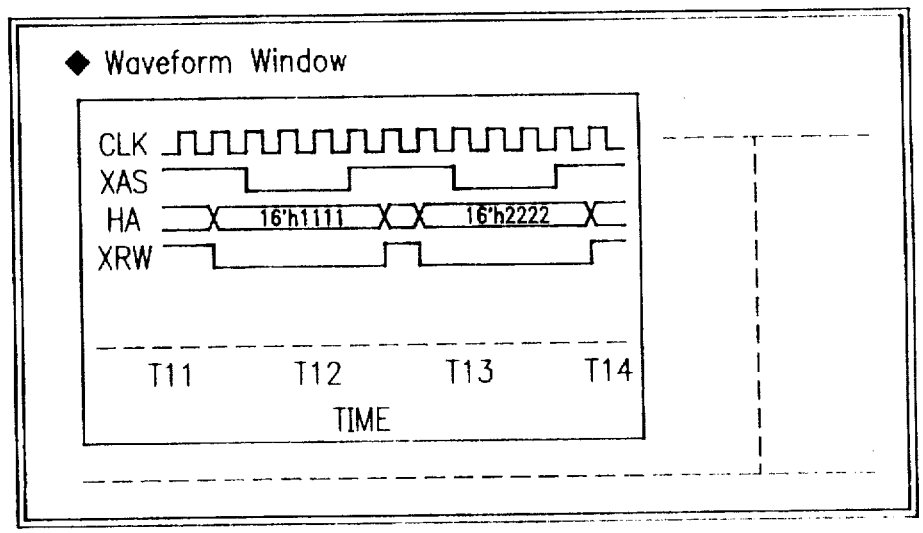
FIG. 8 is a diagram depicting an example of a window shown in a conventional system.
Figure 9:
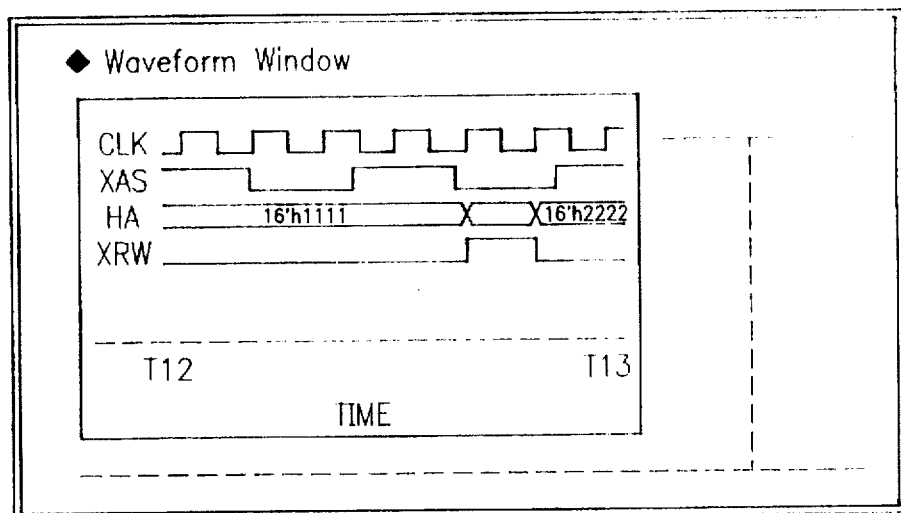
FIG. 9 is a diagram depicting an example of a window shown in a conventional system.
Figure 10:
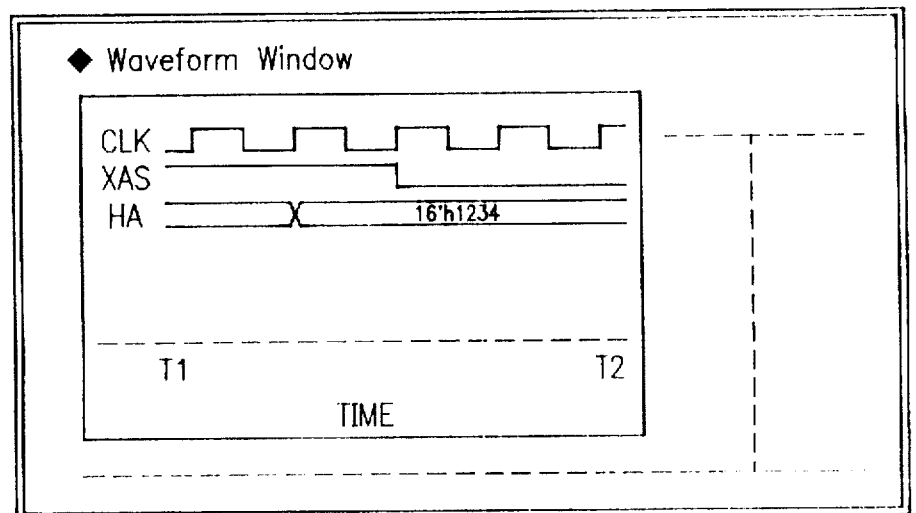
FIG. 10 is a diagram depicting an example of a window shown in a conventional system.

(G7) Next, verification by checking the first waveform is performed with window #2. In the window example of FIG. 5, one verifies whether the set up time ts, of the host address HA as the address strobe signal XAS in window #2 went from 1 to 0, is matched with a prescribed time.

(G8) When the first verification is completed, the command in the command operating window (not shown) in the window of CRT unit 50 is clicked with mouse 52. In response, restart control unit 550 restarts the simulation.

(G9) Check whether the waveform window has gotten to the next verification point.

(G10) At the time the waveform window has gotten to the next verification point, the command in the command operating window (not shown) in the window of unit 50 is clicked with mouse 52. In response, stop control unit 549 stops the simulation once. At the same time as the simulation is stopped, the renewing of the display waveforms of windows #1 and #2 is also stopped.

Figure 33:
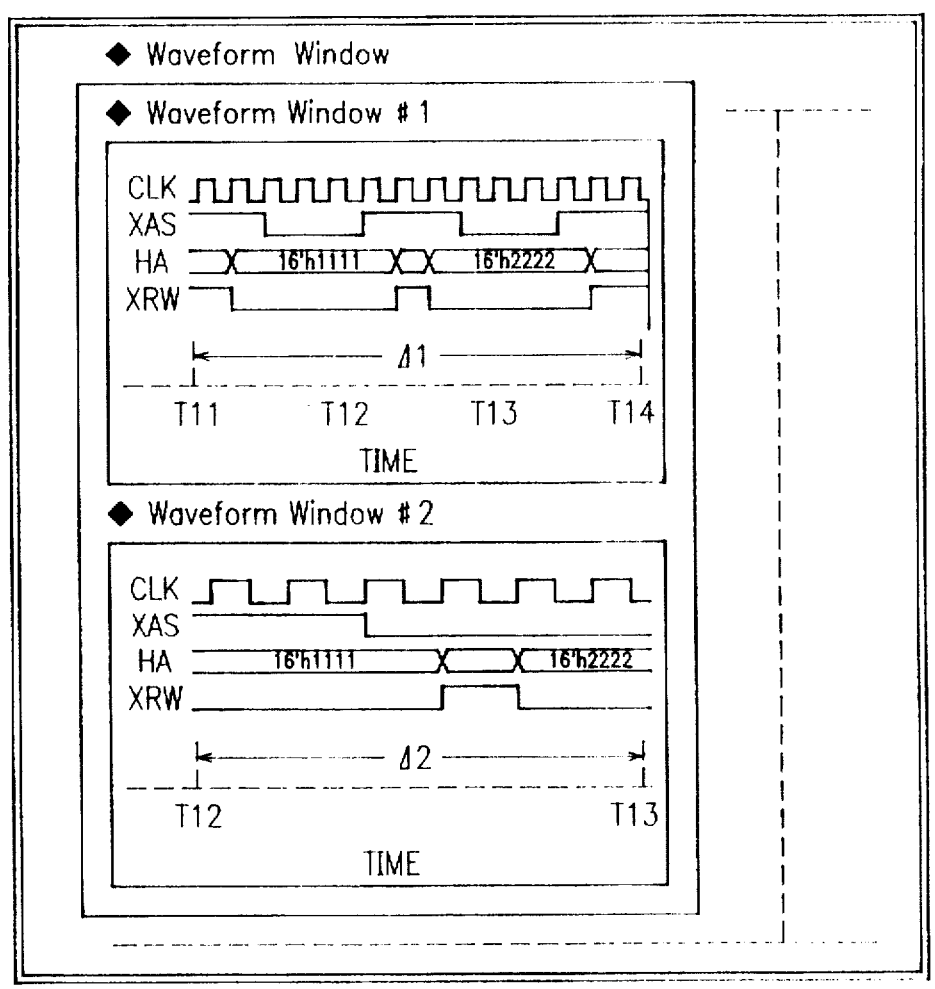
FIG. 33 is a diagram depicting an example of windows displayed in the third embodiment.

FIG. 33 shows an example of the windows of unit 50 at that time. Window #1 displays the simulation result between simulation times T11 and T14. In window #1 at that time, the display start time is T11 and the display time width remains δ1. Window #2 displays, on an enlarged scale, the simulation result between simulation times T12 and T14 of window #1. In window #2, the display start time is T12 and the display time width remains δ2. In the windows of FIG. 33 the current simulation time is T14.

(G11) Next, verification by checking the next waveform is performed with window #1. In the window example of FIG. 33, check whether the address strobe signal XAS goes from 1 to 0 twice during the period between times T11 and T14 of window #1.

(G12) When the next verification is completed, the command in the command operating window (not shown) in the window of unit 50 is clicked with mouse 52. In response, restart control unit 550 restarts the simulation.

(G13) Hereinafter, all verification points are check by repeating similar Steps.

(G14) Finish the logic simulation.

Note that by clicking another command (not shown) in the command operating window, the waveforms before and after the simulation times being displayed on windows #1 and #2 can also be displayed independently. For example, when the waveform, as the simulation was stopped once, is shifted from a desired verification point, the waveforms before and after the waveform now being displayed is displayed by moving the displayed waveform. The waveforms before and after the waveforms now being displayed are obtained from the data start in disk 53.

While in the third embodiment the display time width was fixed during simulation, it may be changed even during simulation, by changing the data of the display time width of the time setting file. Also, while the display time width δ1 of window #1 was a part of the entire simulation time, the entire waveform between the simulation start time and the simulation end time may be displayed on window #1 by setting the display time width δ1 to the entire simulation time.

Also, as a waveform window, more than two waveform windows may be displayed by additionally setting a display time width to the time setting file. Moreover, while a signal waveform to be displayed was a digital waveform, the invention is not limited thereto, but, may be an analog waveform, or both digital and analog waveforms.

The third embodiment has the following and other advantages. When the hardware of the target logic model is verified by checking a signal waveform with logic simulation, there is provided a file in which data for setting the display time width is stored, and by referring to the stored data of this file, a signal waveform obtained as a result of simulation and a partially enlarged signal waveform of that waveform may be displayed on different display regions, respectively. Thus, the operation of enlarging or reducing a waveform for each verification point becomes unnecessary. Accordingly, there is no possibility that the simulation will be stopped during the enlarging or reducing operation. Thus the time required for logic simulation becomes smaller. Also, there is enhanced efficiency of logic simulation in which the hardware of a target logic model is verified by checking the signal waveform.

(d-4) Fourth Embodiment

Figure 34:
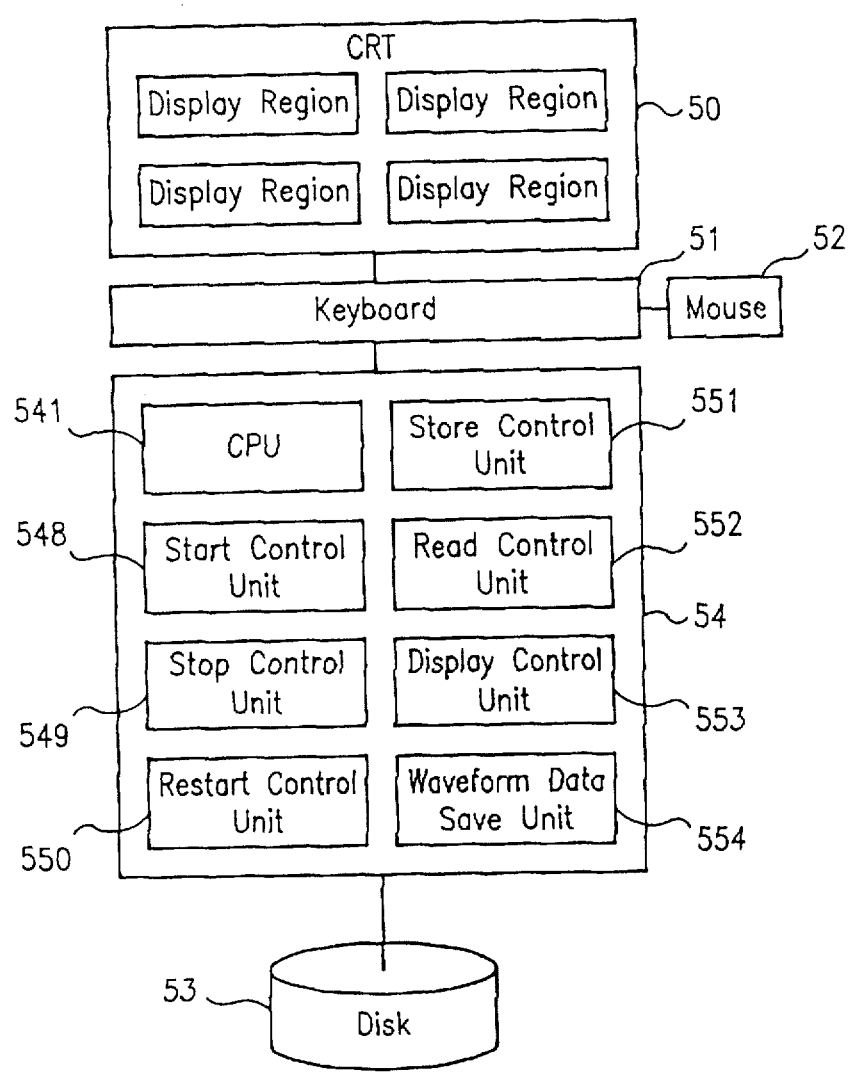
FIG. 34 is a diagram depicting construction of the hardware of a fourth illustrative embodiment.

FIG. 34 shows the hardware of a fourth illustrative embodiments, which is similar to FIG. 28, except for the addition of waveform data save unit 554 in process control unit 54, and deletion of file of setting time 59. The FIG. 34 system is used to verify the hardware of a target logic such as shown in FIG. 1. The virtual model of the target logic shown in FIG. 3 is prepared, and with this model, the hardware of the target logic is verified with logic simulation.

Figure 35:
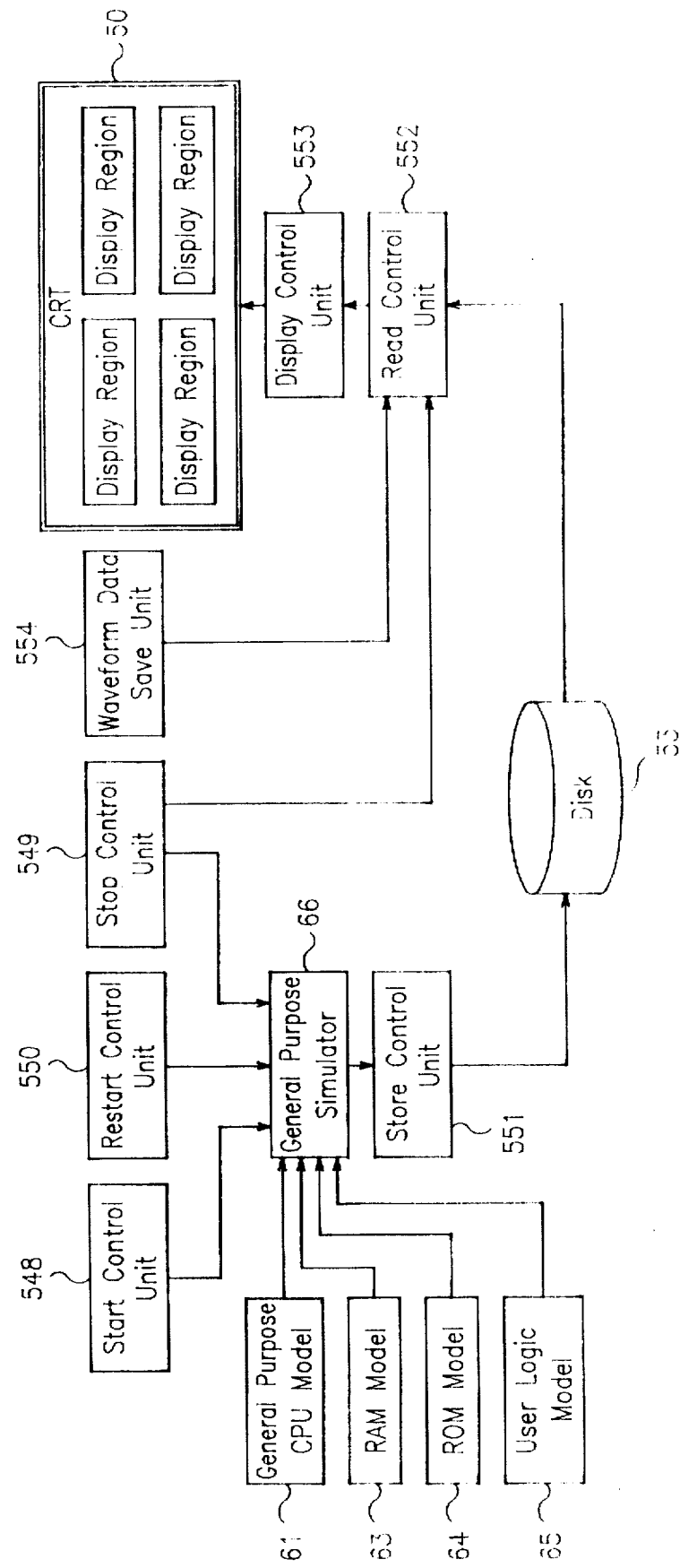
FIG. 35 is a block diagram depicting functions of the fourth embodiment.

FIG. 35 shows the functions of the fourth embodiment, wherein a read control unit 552 reads out signal data and simulation time data stored in disk 53 is used by a store control unit 551. A display control unit 553 converts the signal data and simulation time data read from disk 53 by use of read control means 552, into waveform timing diagram and displays same on a first display region of unit 50, in sequence. In this display, a signal waveform is displayed as it is, or it is displayed by partially enlarging or reducing same.

When the logic simulation is stopped by a stop control unit 549, waveform data save unit 554 causes read control unit 552 to read out the signal data and simulation time data that were stored in disk 53 immediately before the stopping, to convert same into a waveform timing diagram, and to display same on a second display region of unit 50. In this display, a signal waveform is displayed as it is, or it is displayed by partial enlargement or reduction thereof.

The first display region and the second display region are different.

Figure 36:
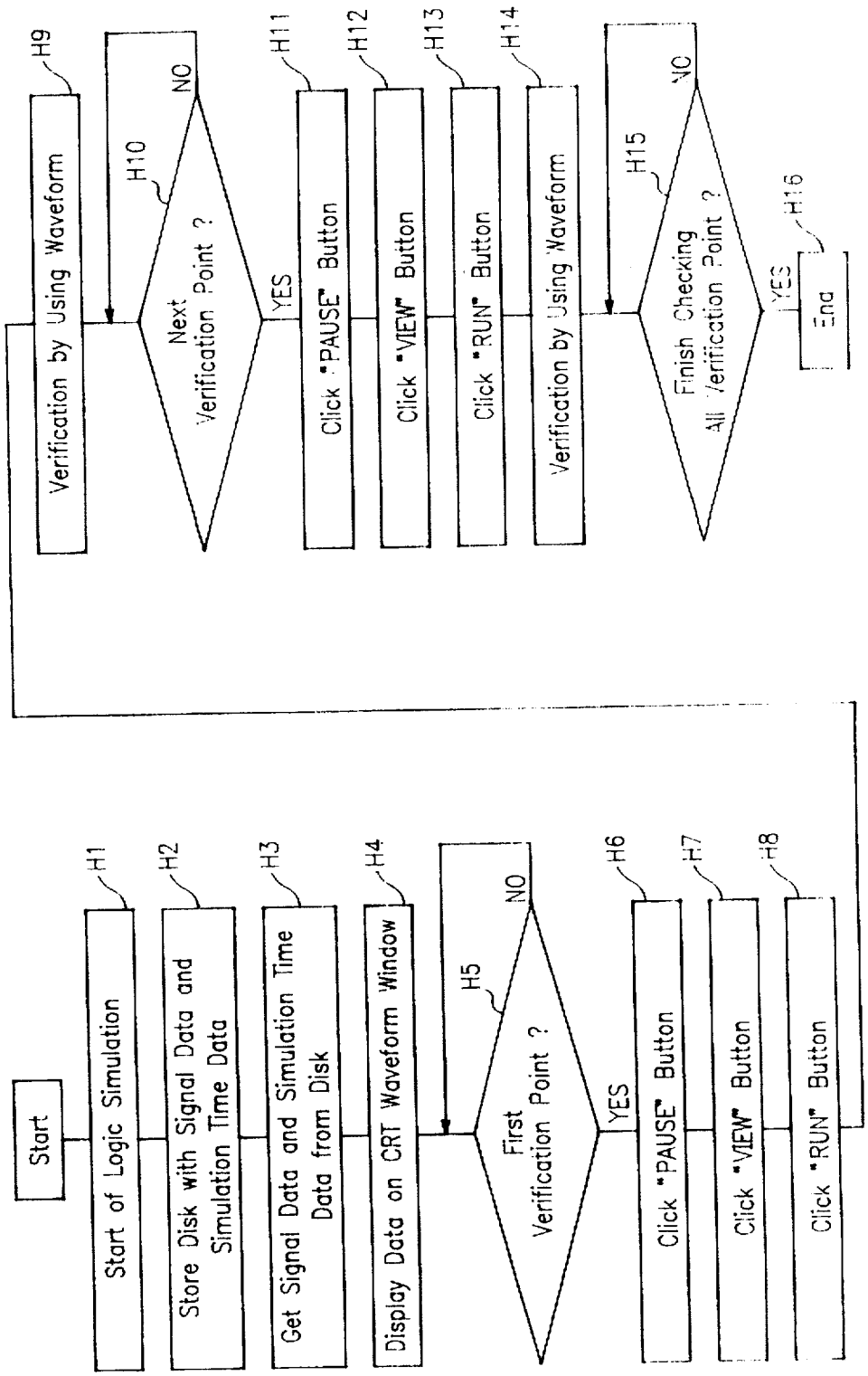
FIG. 36 is a flow chart used to explain the operation of the fourth embodiment.

The operation of the fourth embodiment will be described with reference to FIG. 36 which shows the procedure for verification of the hardware of a target logic model using logic simulation. The procedural Steps described below as Steps (H1) to (H16) correspond to Steps H1 to H16 of FIG. 36.

(H1) Start a general purpose logic simulator 66. This start is performed by a start control unit 548. When general purpose logic simulator 66 is started, process control unit 54 will read out a target logic model 21, a library for circuit information, and a signal file in which a plurality of previously registered signal names in the target logic model necessary for verification is written, from disk 53. These are applied to simulator 66 to start logic simulation.

(H2) When logic simulation is started, simulator 66 will follow the content of the signal file as a result of the simulation execution, and store signal data necessary for verification and also simulation time data in disk 53 by use of store control unit 551.

(H3) At the same time, read control unit 552 reads out the signal data and simulation time data stored in disk 53.

(H4) The signal data and simulation time data read out are converted into a waveform timing diagram and displayed on a first region of CRT display unit 50 by use of the display control unit 553. In the display, the signal waveform is displayed as it is, or partially enlarged or reduced.

Figure 37:
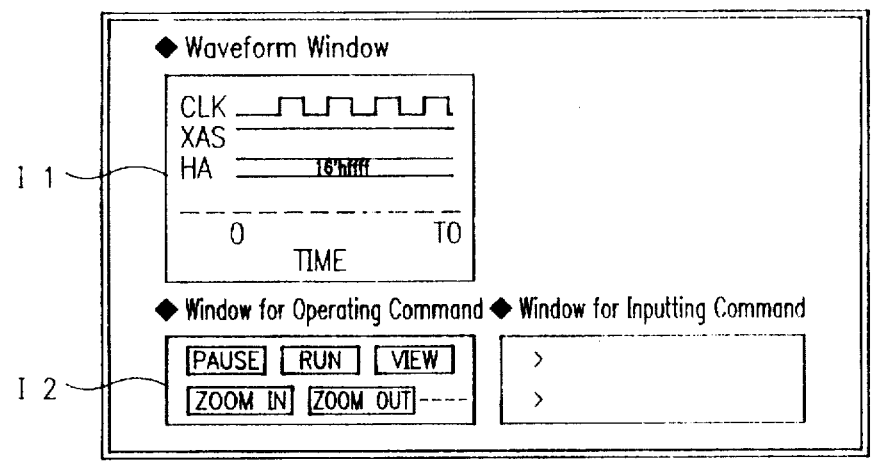
FIG. 37 is a diagram depicting an example of a window displayed in the fourth embodiment.

FIG. 37 shows an example of the window of unit 50 at that time. Waveform window I1 is a first display region, wherein the waveform timing diagram obtained as a result of current simulation is displayed. The simulation time starts from time 0, and the current time is T0. CLK represents a clock for providing operating timing; XAS represents a negative logic address strobe signal; and HA represents a host address. 16'hffff is data which is given as a default when host address HA is not determined. As the simulation proceeds, the waveform timing diagram of waveform window I1 is renewed every hour.

(H5) Check whether window I1 has gotten to a first verification point.

Figure 38:
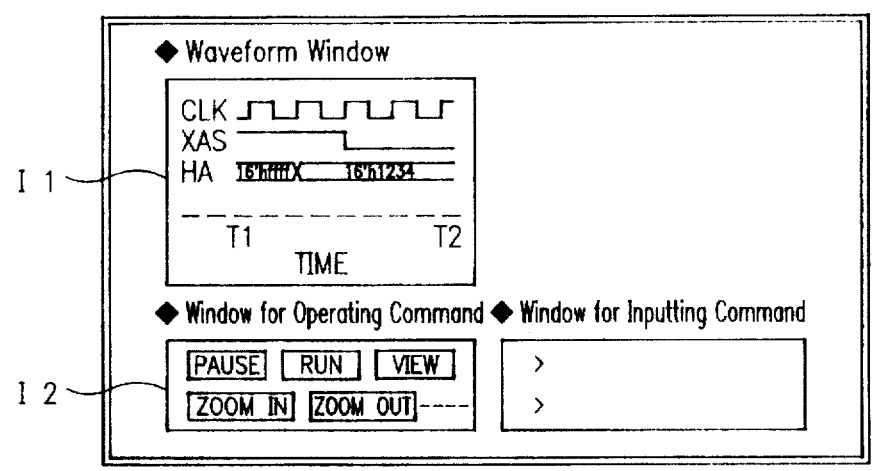
FIG. 38 is a diagram depicting an example of a window displayed in the fourth embodiment.

(H6) At the time window I1 has gotten to the first verification point, a PAUSE button in command operating window I2 of unit 50 is clicked with mouse 52. In response, stop control unit 549 stops the simulation once. FIG. 38 is a diagram showing an example of windows of the unit 50 at that time.

Figure 39:
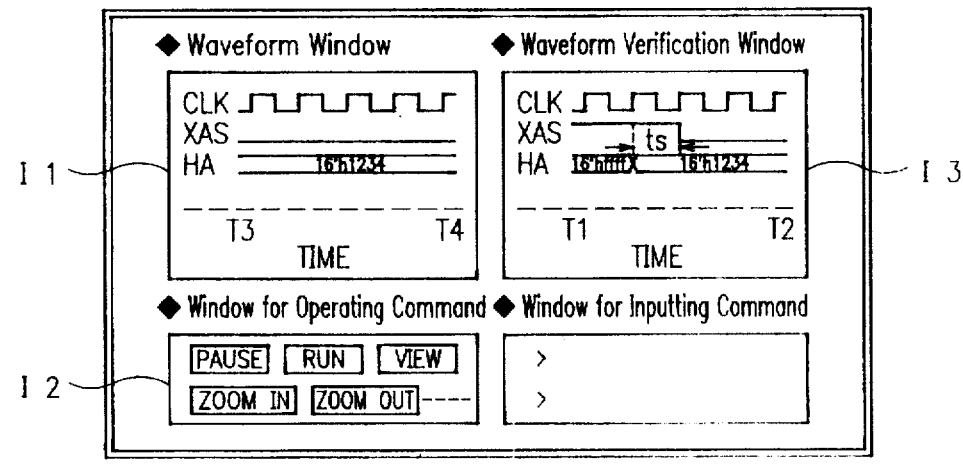
FIG. 39 is a diagram depicting an example of windows displayed in the fourth embodiment.

(H7) Next, a VIEW button in command operating window I2 is clicked by mouse 52. In response, read control unit 552 reads from disk 53 signal data and simulation time data now being displayed on window I1. The signal data and simulation time data so read out are converted into a waveform timing diagram, which is displayed as a waveform verification window on a second display region of unit 50 by use of display control unit 553. FIG. 39 shows an example of the windows of unit 50 at that time. Window I3 is the second display region.

(H8) A RUN button in command operating window I2 is clicked with mouse 52. In response, restart control unit 550 restarts the simulation.

(H9) A first verification is performed with window I3. In the window of FIG. 39, verify whether the set up time ts of host address HA as the address strobe signal XAS went from 1 to 0, is matched with a prescribed time.

While verification is being made with window I3, simulation proceeds so that the waveform timing diagram of window I1 is renewed every hour. As shown in window I1 of FIG. 39, the simulation time passes through T2 and T3, and the current simulation time is T4.

On the other hand, the waveform timing diagram of window I3 is fixed without being renewed.

(H10) Check whether window I1 has gotten to the next verification point.

Figure 40:
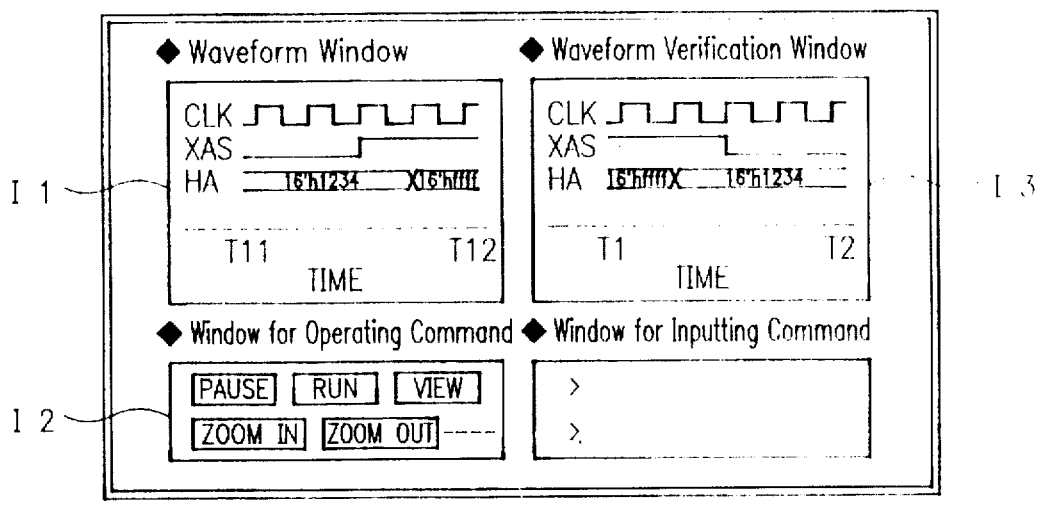
FIG. 40 is a diagram depicting an example of a window displayed in the fourth embodiment.

(H11) At the time window I1 has gotten to the next verification point, the PAUSE button in window I2 is clicked with mouse 52. In response, stop control unit 549 stops the simulation once. FIG. 40 shows an example of the windows of unit 50 at that time.

(H12) Next, the VIEW button in window I2 is again clicked with mouse 52. In response, read control unit 552 reads from disk 53 signal data and simulation time data being displayed on window I1.

Figure 41:
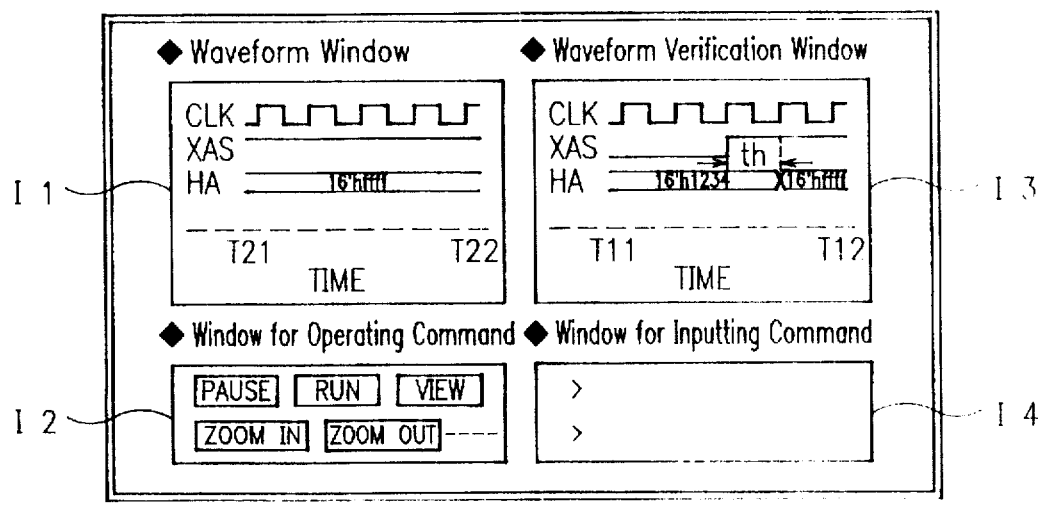
FIG. 41 is a diagram depicting an example of windows displayed in the fourth embodiment.

The signal data and simulation time data so read out are converted into a waveform timing diagram, and window I3 is renewed and displayed. FIG. 41 shows an example of windows of unit 50 at that time.

(H13) The RUN button in window I2 is clicked with mouse 52. In response, restart control unit 550 restarts the simulation.

(H14) The next verification is performed with window I3. In the window example of FIG. 41, verify whether the hold time th of host address HA as the address strobe signal XAS went from 0 to 1, is matched with a prescribed time.

While verification is being performed with window I3, the simulation proceeds, so that the waveform timing diagram of window I1 is renewed every hour. As shown in window I1 of FIG. 41, the simulation time passes through T12 and T21, and the current simulation time is T22. The waveform timing diagram of window I3 is fixed without being renewed.

(H15) Then, all verification points are visually checked by repeating similar steps.

Note that in the above Steps, the waveform verification window I3 can be partially enlarged or reduced, as desired, by clicking a ZOOM IN or ZOOM OUT button in window I2 with mouse 52. Also, by clicking another command (not shown) in window I2, the waveforms before and after the simulation time being displayed on window I3 can also be displayed. Moreover, instead of clicking the PAUSE, RUNT VIEW, ZOOM IN, and ZOOM OUT buttons with mouse 52, the respective commands may be inputted to window I4 through a keyboard 51.

(H16) Finish the logic simulation.

While the fourth embodiment shows use of a digital waveform as the signal waveform, the invention is not so limited; analog waveforms, or combination of analog and digital waveforms can also be used. Moreover, while only one verification window is shown, the invention is not so limited; a plurality of waveform verification windows may be used by adding buttons (e.g. VIEW 1, VIEW 2, etc) to the command window.

The fourth embodiment enjoys the following and other advantages. When the hardware of the target logic model is verified by logic simulation, there is provided, in addition to the first display region, in which a signal waveform, obtained by logic simulation, is renewed and displayed every hour, a second display region wherein the signal waveform, obtained when simulation is stopped once at the verification point of the hardware, is saved. Thus, even if the logic simulation were to be stopped once to verify the hardware, and thereafter the logic simulation were to be restarted, the display of the waveform existing at the time of the stoppage would remain. Thus, the stoppage of logic simulation, such as for checking, would not result in any loss of waveform data. Accordingly, the time required for logic simulation is shortened and efficiency of logic simulation to verify the hardware of a target logic model is greatly enhanced.

(e-5) Fifth Embodiment

Figure 12:
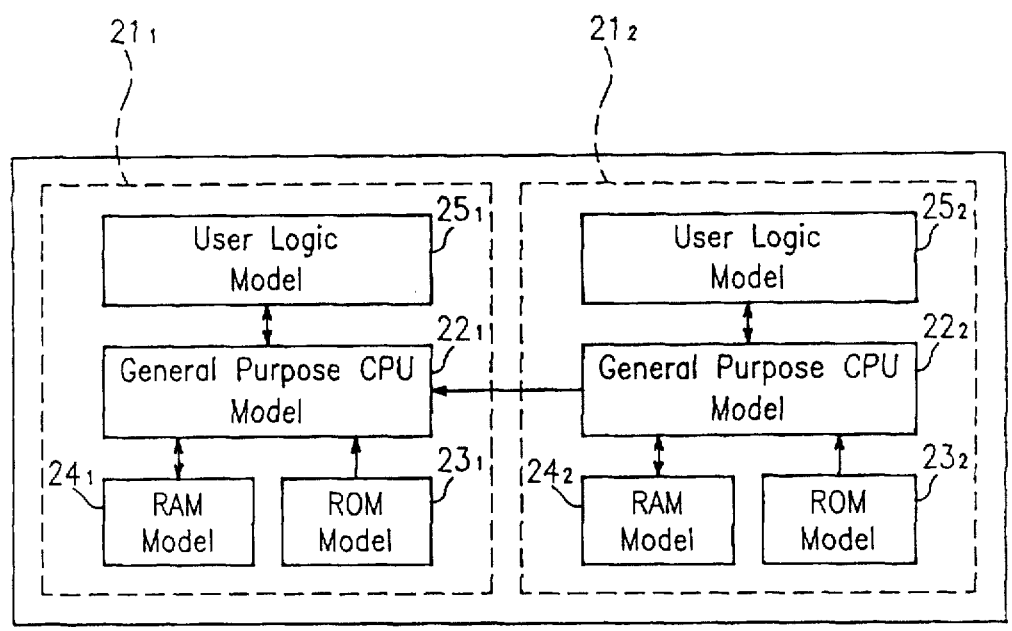
FIG. 12 is a diagram of a virtual model of the CPU mounted circuit of FIG. 11.
Figure 13:
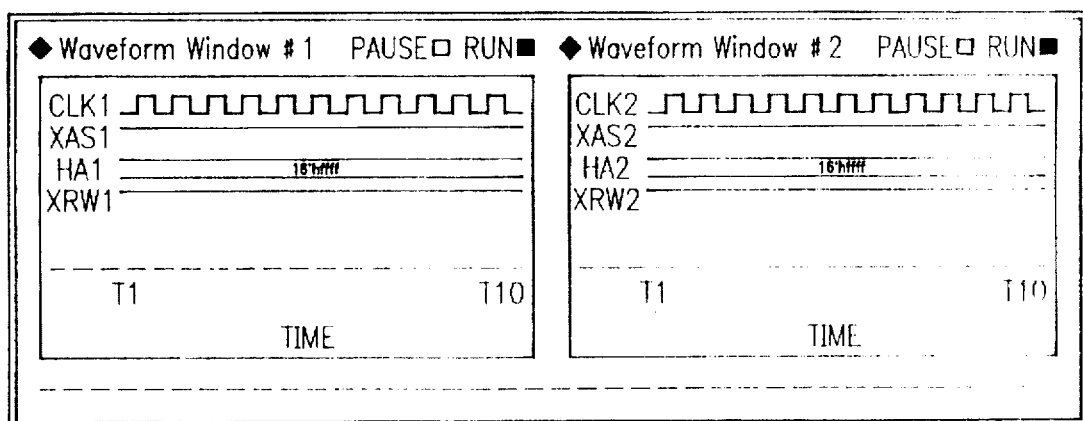
FIG. 13 is a diagram depicting an example of windows displayed in a conventional system.
Figure 14:
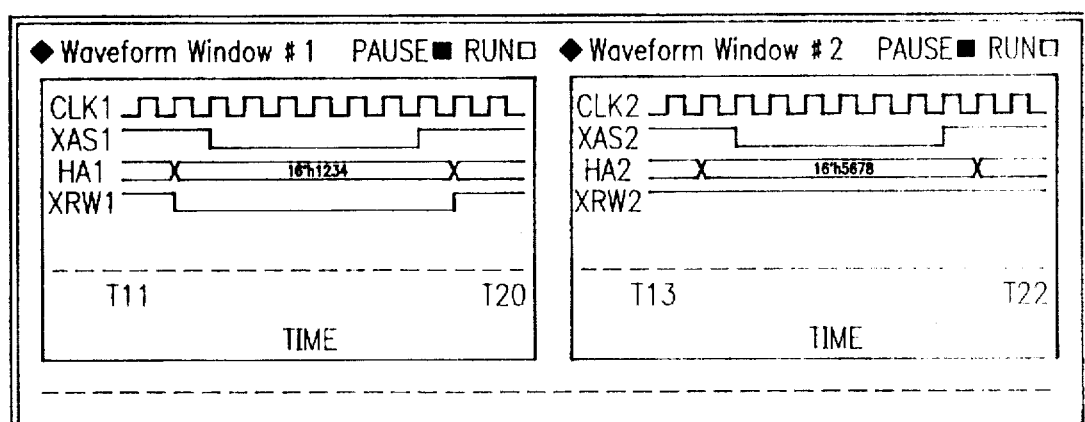
FIG. 14 is a diagram depicting an example of windows displayed in a conventional system.
Figure 15:
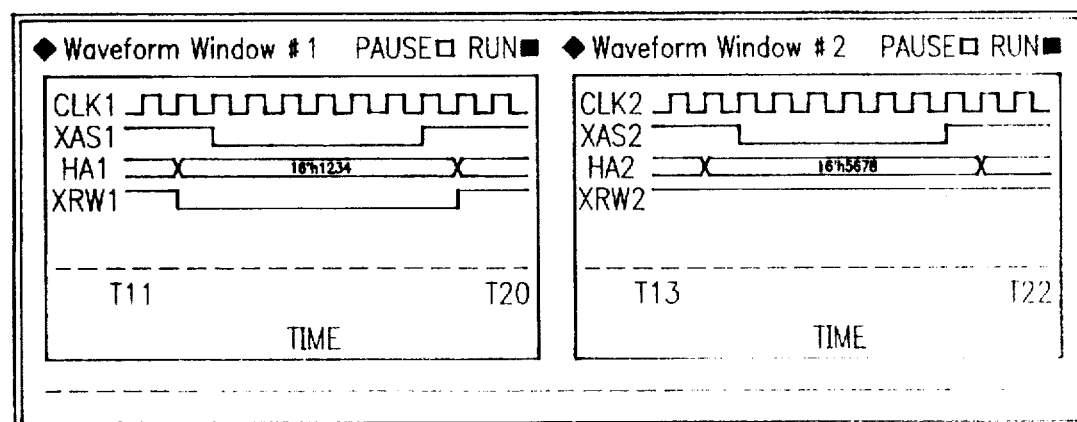
FIG. 15 is a diagram depicting an example of windows displayed in a conventional system.
Figure 42:
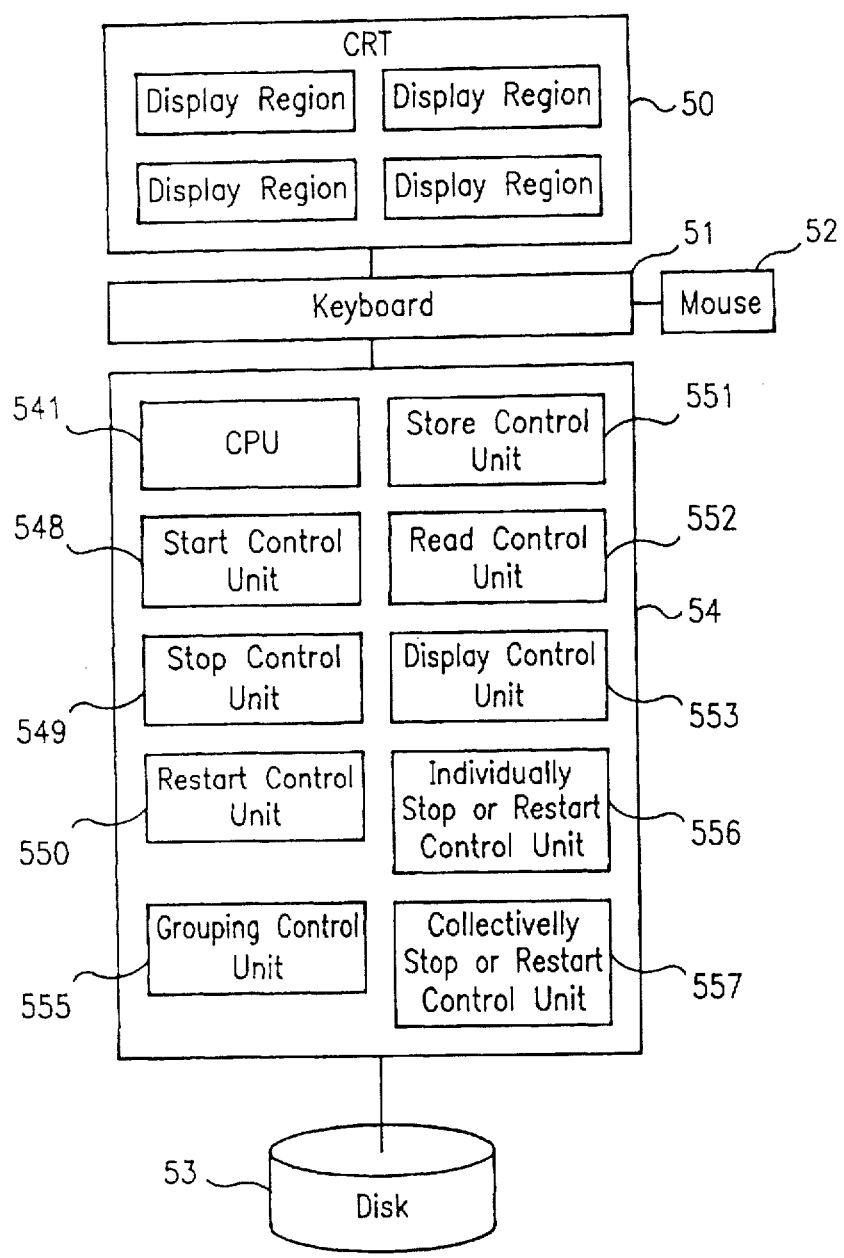
FIG. 42 is a diagram depicting construction of the hardware of a fifth illustrative embodiment.

FIG. 42 shows the hardware of a fifth illustrative embodiment which is similar to FIG. 28, except for the addition in process control unit 54 of grouping control unit 555, individually stop or reopen control unit 556, and collectively stop or reopen control unit 557. Also, as in FIG. 34, the file of setting time 59 is omitted. The operations of these units will be described later. The fifth embodiment is a system for verifying the hardware of a target logic such as shown in FIG. 11. The virtual model of the target logic shown in FIG. 12 is prepared, and with this model, the hardware of the target logic is verified by logic simulation.

Figure 43:
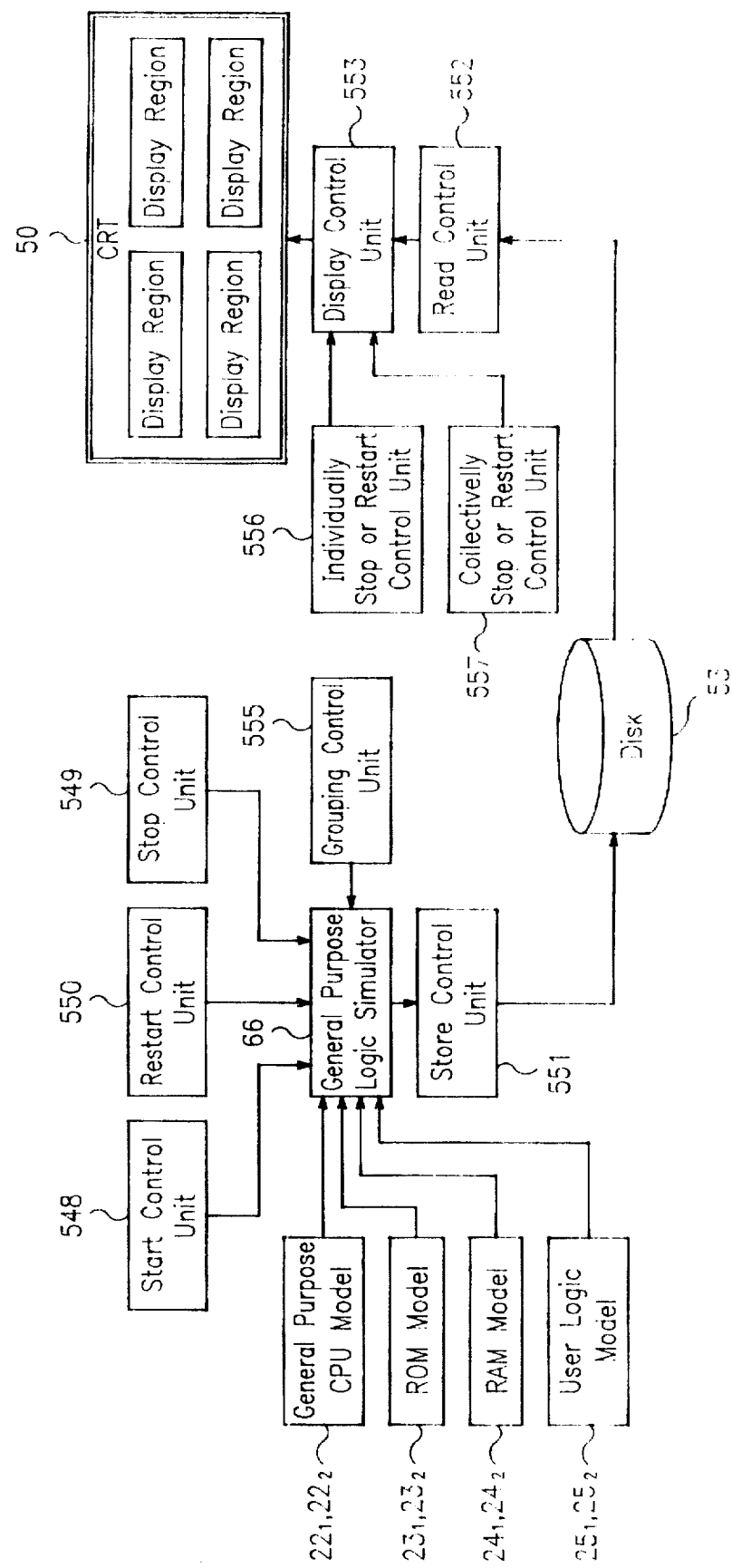
FIG. 43 is a diagram depicting functions of the fifth embodiment.

FIG. 43 shows the functions of the fifth embodiment, wherein general purpose CPU models $22_1$ and $22_2$; ROM models $23_1$ and $23_2$; RAM models $24_1$, and $24_2$; and user logic models $25_1$ and $25_2$ are constructed as files and stored in disk 53. General purpose simulator 66 receives as inputs signals from the aforementioned models as input files, when the logic simulation is executed, and furthermore executes logic simulation for verifying the target logic mode constituted by these aforementioned models.

Grouping control unit 555 groups signal data and simulation time data necessary for the verification of the two target logic models $21_1$, and $21_2$ obtained as a result of the logic simulation, for each target logic model. A store control unit 551 stores the signal data and simulation time data grouped by the grouping control unit 555 in disk 53, in sequence. A read control unit 552 reads out the signal data and simulation time data stored in disk 53 by use of store control unit 551 for each group.

A display control unit 553 converts the signal data and simulation time data, which were read out from disk 53 for each group by the use of the read control unit 552, into a waveform timing diagram and displays same on different regions of unit 50 for each target logic. The waveform timing diagram displayed on each display region is renewed as the logic simulation proceeds.

The individually stop or reopen unit 556 stops and reopens the renewing of a waveform timing diagram independently for each display region by controlling display control unit 553. The collectively stop or reopen unit 557 stops and reopens the renewing of the waveform timing diagrams displayed on all display regions collectively by controlling display control unit 553.

Figure 44:
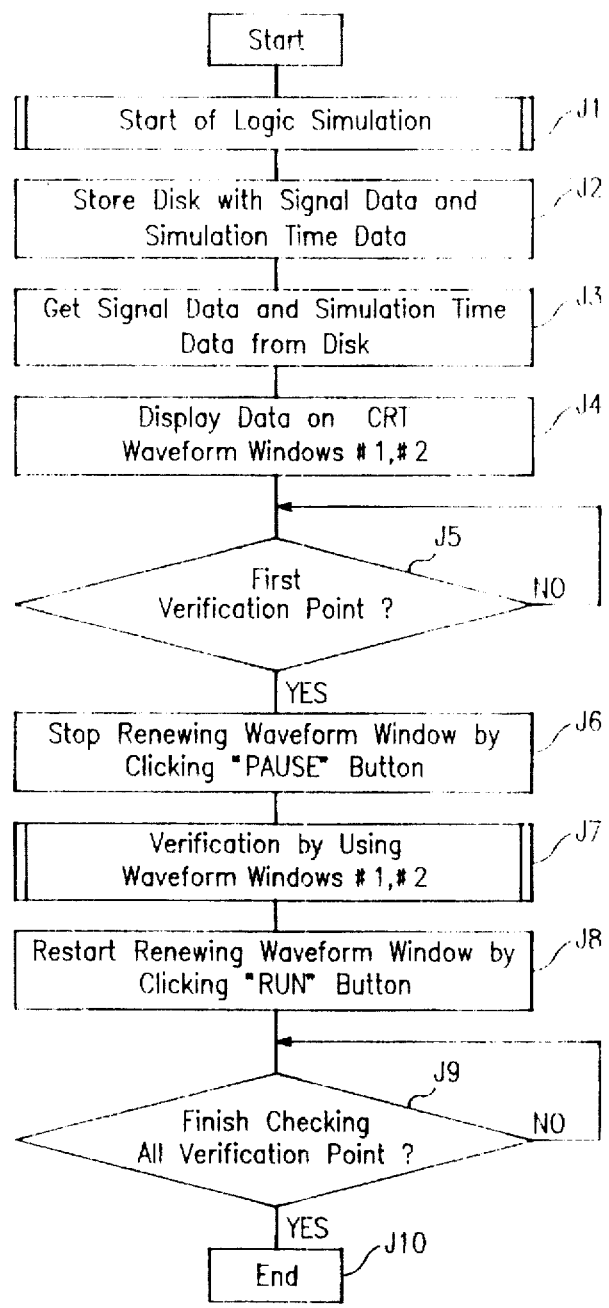
FIG. 44 is a flow chart used in explaining the operation of the fifth embodiment.

The operation of the fifth embodiment will now be described with reference to FIG. 44 which shows the procedural Steps for verifying the hardware of a target logic model using logic simulation. The Steps described below as Steps (J1) to (J10) correspond to Steps J1 to J10 of FIG. 44.

(J1) Start general purpose logic simulator 66, using start control unit 548. When general purpose logic simulator 66 is started, process control unit 54 reads out the target logic models $21_1$ and $21_2$, a library for circuit information, and a signal file in which a plurality of registered signal names in the target logic models necessary for verification, have been written, from disk 53. These signals are inputted to simulator 66 to start the logic simulation.

(J2) When the logic simulation is started, general purpose simulator 66 will follow the contents of the signal file as a result of the simulation execution, and store signal data necessary for verification and also simulation time data in disk 53 by use of store control unit 551. The signal data and simulation time data to be stored have been grouped into two groups by grouping control unit 555, and the store control unit 551 stores the signal data and simulation time data that have been grouped.

(J3) At the same time, read control unit 552 reads out the grouped signal data and simulation time data from disk 53.

(J4) The signal data and simulation time data read out are converted into waveform timing diagrams and displayed on windows #1 and #2 of unit 50 by use of display control unit 553. In this case, the signal data and simulation time data, which were grouped into two groups, become display data of windows #1 and #2 of FIG. 45.

Figure 45:
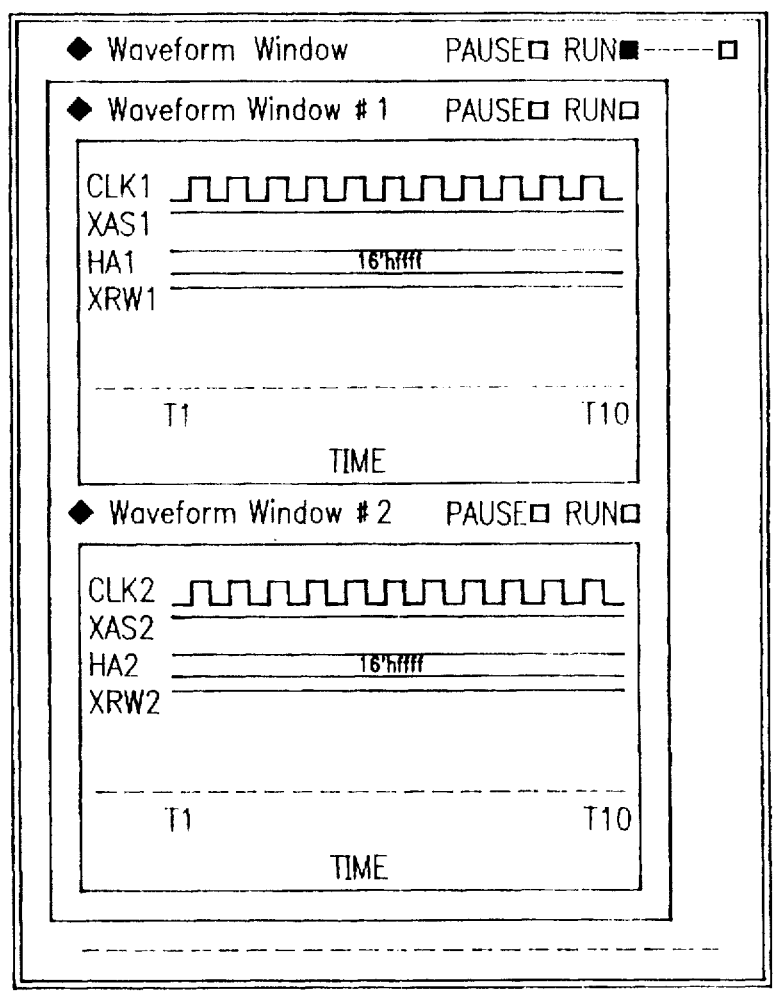
FIG. 45 is a diagram depicting an example of windows displayed in the fifth embodiment.

In FIG. 45, CLK1 and CLK2 represent clocks for providing the operating timings for target logic models $21_1$ and $21_2$; XAS1 and XAS2 represent negative logic address strobe signals of target logic models $21_1$ and $21_2$; HA1 and HA2 represent host addresses of the target logic models $21_1$ and $21_2$; and XRW1 and XRW2 represent negative logic read/write signals of target logic models $21_1$ and $21_2$.

Window #1 displays the simulation results of target logic model $21_1$ between simulation time 0 and T10. The simulation result is displayed in the form of a waveform timing diagram. On the other hand, window #2 likewise displays the simulation results of the target model $21_2$ between simulation time 0 and T10. As the simulation proceeds, the waveform timing diagrams of windows #1 and #2 are renewed every hour.

(J5) Check whether the waveform window has gotten to a first verification point.

(J6) At the time the waveform window has gotten to the first verification point, a PAUSE button in command operating window 12 of unit 50 is clicked with mouse 52. In response, collectively stop or reopen control unit 557 collectively stops the renewing of the waveforms on windows #1 and #2. During this time, the simulation itself is not stopped and continues to be executed. This step is performed by collectively stop or reopen control unit 557.

Figure 46:
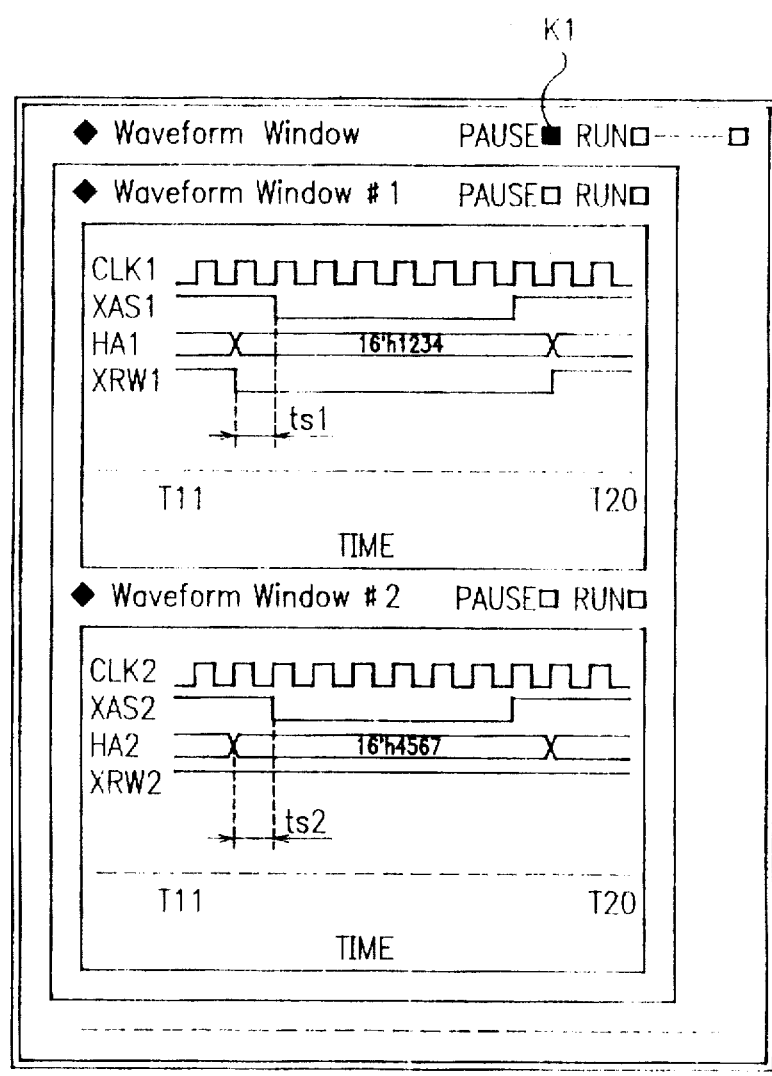
FIG. 46 is a diagram depicting an example of windows displayed in the fifth embodiment.

FIG. 46 shows an example of the windows of unit 50 at that time. In FIG. 46, the clicked PAUSE button K1 has been changed from ☐ to ■. Window #1 displays the simulation results of target logic model $21_1$ between simulation time T11 and T20. Window #2 similarly displays the simulation result of target logic mode $21_2$ between simulation time T11 and T20.

(J7) Next, verification by checking the first waveform is performed with windows #1 and #2. In the window example, verify whether the set up times ts1 and ts2, of the host addresses HA1 and HA2, as the address strobe signals XAS1 and XAS2 in the waveform windows #1 and #2 went from 1 to 0, are matched with a prescribed time.

Figure 47:
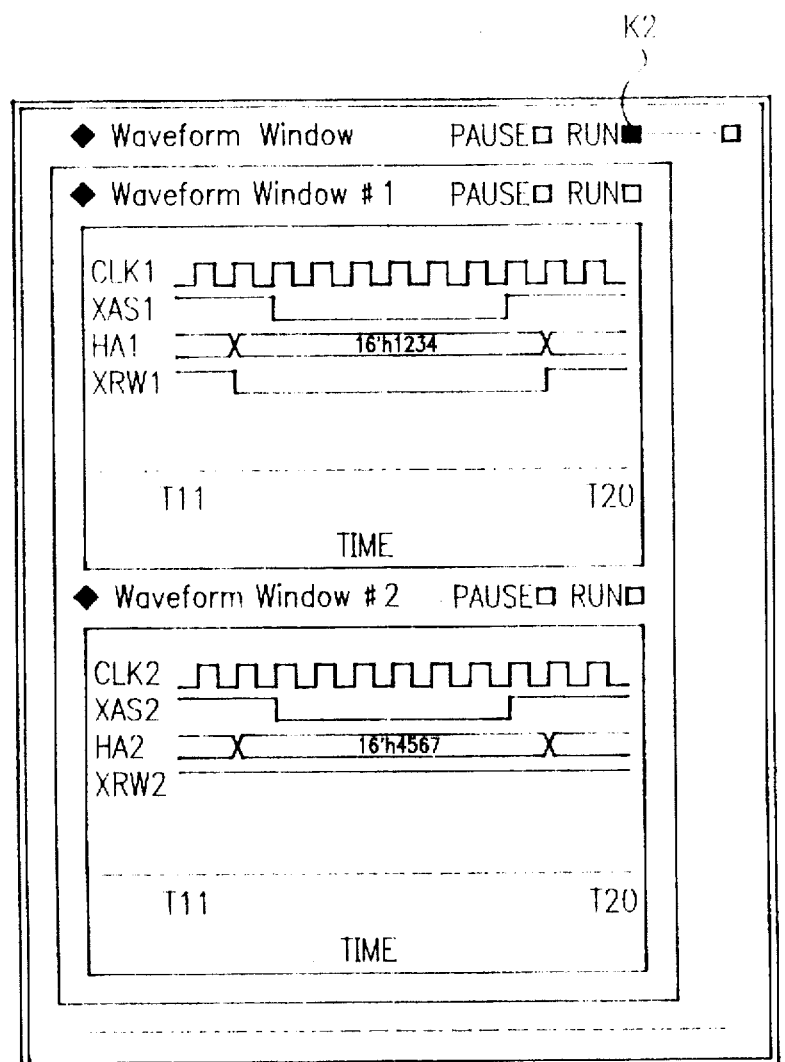
FIG. 47 is a diagram depicting an example of windows displayed in the fifth embodiment.

(J8) When the first verification is completed, a RUN button in the command operating window of unit 50 is clicked with mouse 52. In response, collectively stop or reopen control unit 557 releases the renewing that was stopped collectively, and collectively reopens the renewing of the windows 41 and 42. FIG. 47 shows exemplary windows of unit 50 at that time. In FIG. 47, the clicked RUN button K2 has been changed from ☐ to ■.

(J9) Then, all verification points are checked by repeating similar Steps.

(J10) Finish the logic simulation.

While the fifth embodiment provides PAUSE and RUN buttons in windows #1 and #2, these buttons may be pushed to stop and reopen the renewing of the waveforms in windows #1 and #2, independently. Such a Step is performed by individually stop or reopen control unit 69. PAUSE button K1, RUN button K2, and PAUSE and RUN buttons provided in each window have various attributes, respectively, and based on the particular attribute of the pushed button, the renewing of the displayed waveforms on all the windows is collectively stopped or reopened, or the renewing is independently stopped or reopened for each window.

Moreover, in the fifth embodiment, when the timing of the pushing of the PAUSE button is delayed and the waveform, as the renewing is stopped, is shifted from a desired verification point, the waveforms of windows #1 and #2 can be displayed by shifting same before and after with respect to the time axis by clicking another command (not shown) in the command operating window. The data of waveforms before and after the waveform now being displayed are obtained from data stored in disk 53.

Furthermore, although windows #1 and #2 are shown, the invention is not limited thereto. More than two waveform windows may be used, in which case, the number of target logic models will be more than 2. Also, although digital waveforms are used in the fifth embodiment, analog waveforms or combination of digital and analog waveforms can be used.

The fifth embodiment has many advantages, such as those discussed below. When the hardware of the target logic models is verified by checking a waveform by logic simulation, the data obtained as a result of such logic simulation, are grouped for each target model and stored in the disk, and then, the grouped data are read out and displayed. Thus, with respect to the display region provided in each target logic model to display waveforms, the renewing of the displayed waveform can be stopped and reopened independently for each display region. Also, the renewing of the displayed waveforms on all display regions can be stopped and reopened collectively. Thus, even if the renewing of waveform were to be stopped and reopened for all display regions, there is no possibility that the simulation time will be shifted between display regions. Accordingly, signal waveforms can be easily checked without consideration of differences in simulation times between display regions. Thus, efficiency of logic simulation for verifying the hardware of a target logic model by checking the waveform signal, is considerably enhanced by the invention.

(f-6) Sixth Embodiment

Figure 48:
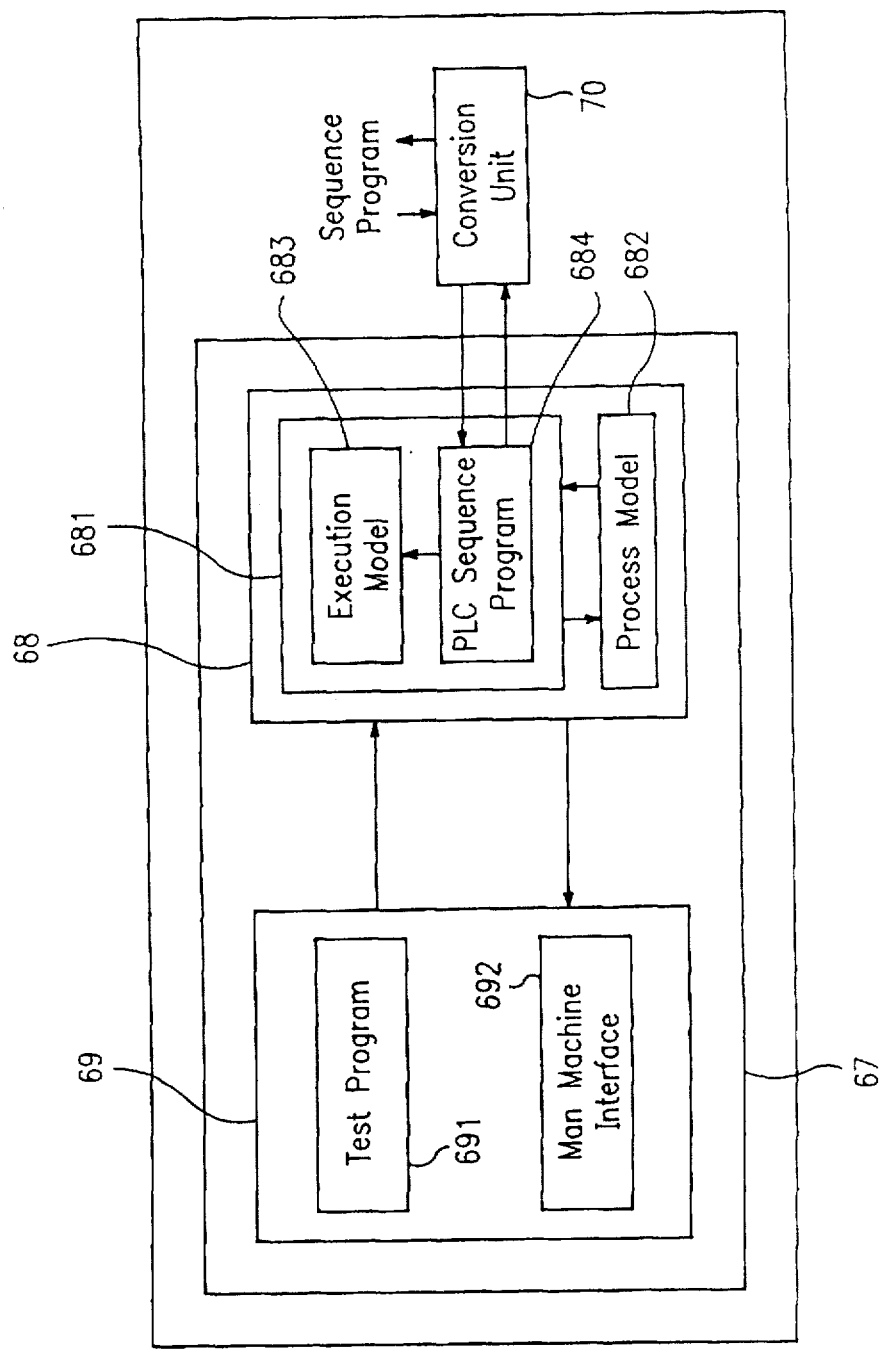
FIG. 48 is a conceptual diagram depicting a sixth illustrative embodiment.

FIG. 48 shows a sixth illustrative embodiment wherein the environment is provided on an EWS 67 which comprises a virtual system 68 and a test bench 69. The virtual system 68 is a virtual system which simulates a sequence control system, and comprises a PLC model 681 and a process model 682. PLC model 681 comprises an execution model 683 for simulatively executing the function of a PLC and a file 684 in which PLC sequence programs are written. The PLC sequence programs will be described later. Process model 682 simulatively executes the function of a control target that is controlled by a sequence control system. Test bench 69 comprises a file 691, in which test programs for verifying the virtual system 68 are written, and a man machine interface 692 for debugging.

Figure 16:
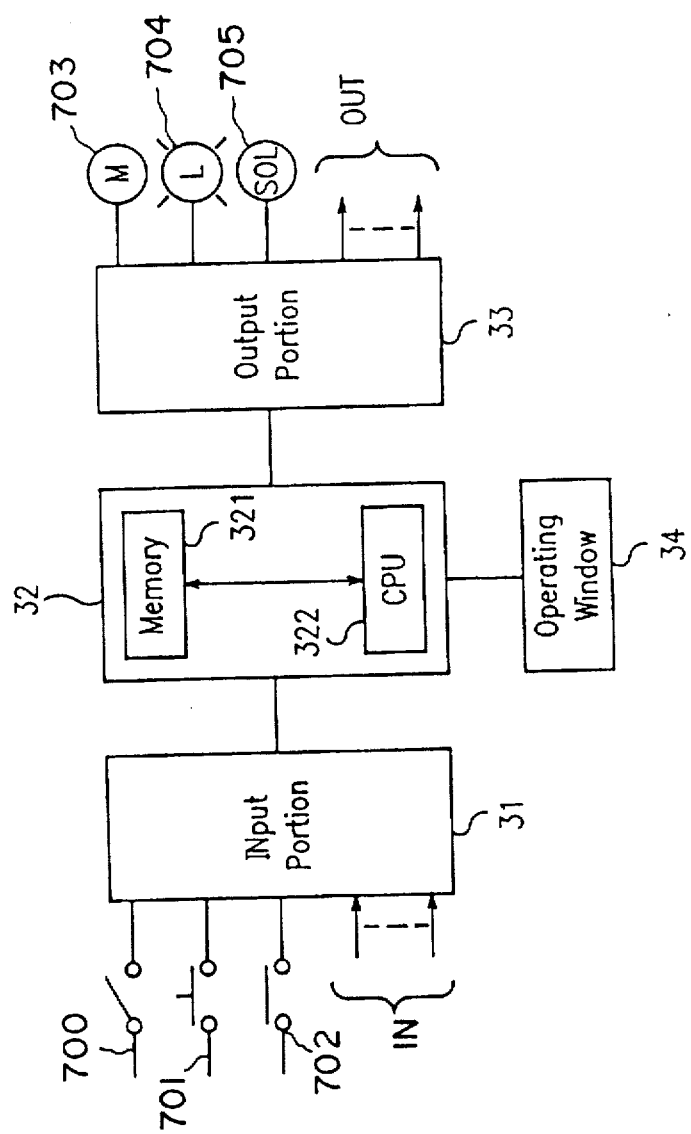
FIG. 16 is a diagram depicting the construction of a sequence control system.
Figure 17:
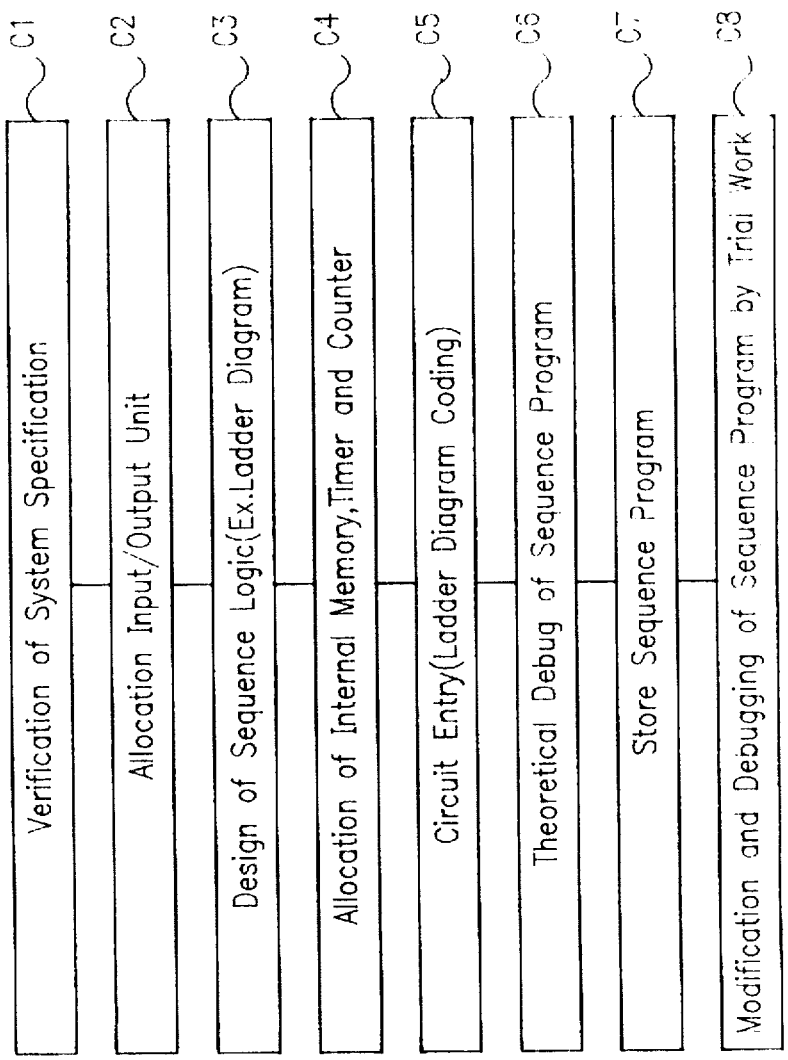
FIG. 17 is a flow chart depicting Steps of designing a sequence program in the prior art.

A conversion unit 70 is provided for converting a sequence program into a PLC sequence program. The sequence program is a program for operating an actual PLC, and the PLC sequence program is a program for operating PLC model 681. PLC model 681 corresponds to a part comprising the input portion 31, calculation control unit 32, and output portion 33 of FIG. 16. The virtual system 68 in EWS is verified by the test programs.

Figure 49:
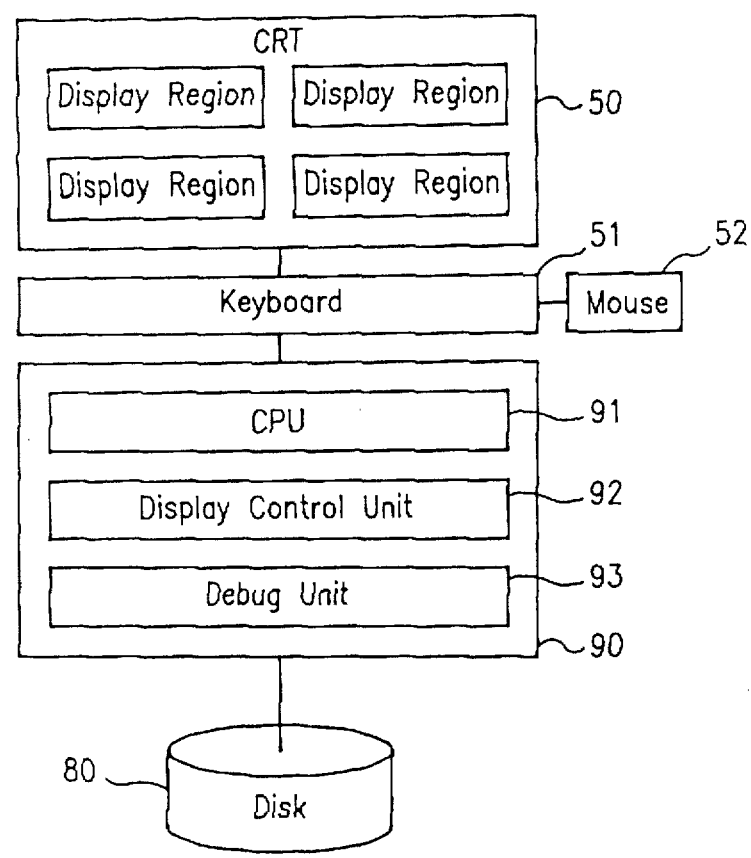
FIG. 49 is a diagram depicting construction of the hardware of the sixth embodiment.

FIG. 49 shows an example of the hardware of the sixth embodiment, wherein the hardware corresponds to an EWS that is mounted in a computer system, and comprises a CRT display unit 50, a keyboard 51, a mouse 52, a disk 80, and a process control unit 90.

Disk 80 stores the following information, and the like:

(1) Software for sequence circuit (e.g. ladder diagram) entry.

(2) Software for conversion from a sequence circuit to a mnemonic.

(3) Software for conversion from mnemonic to a sequence circuit.

(4) Software for conversion from a mnemonic to a PLC sequence program described in HDL.

(5) Software for conversion from a PLC sequence program described in HDL to a mnemonic.

(6) Software for general purpose simulators.

(7) PLC model comprising an execution model described in HDL and a file for PLC sequence programs.

(8) Process model described in HDL.

(9) Test program described in HDL.

Process control unit 90 comprises a CPU 91, which mainly executes simulation by test programs, and stores or displays the results of simulation in disk 80 or on CRT display unit 50; display control unit 92; and a debugging unit 93. Display control unit 92 displays the results of simulation on a predetermined display region of CRT display unit 50. Debugging unit 93 performs debugging at a predetermined region of unit 50.

Figure 50:
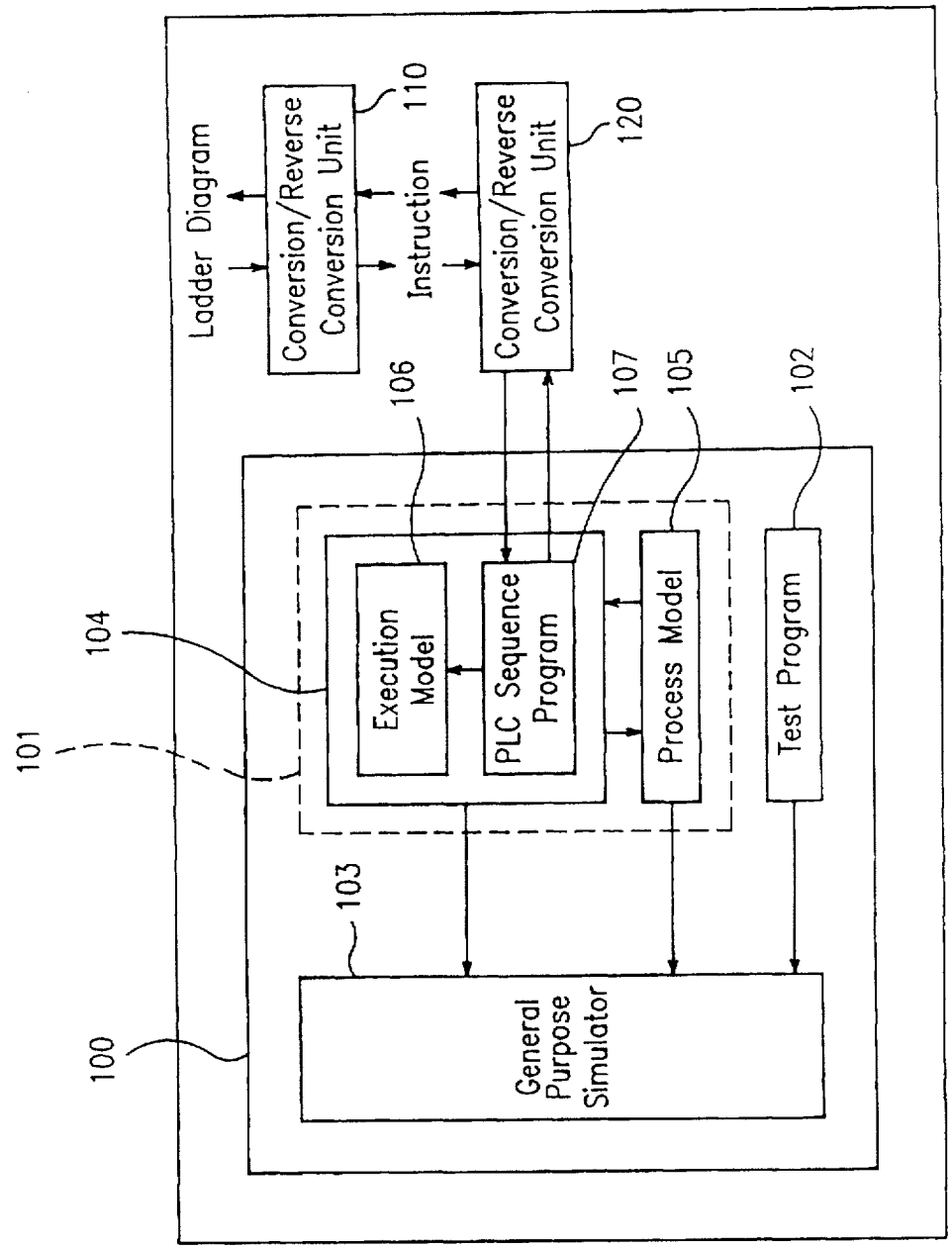
FIG. 50 is a block diagram depicting functions of the sixth embodiment.

FIG. 50 shows the functions of the EWS of the sixth embodiment, wherein verfication support system 100 comprises a virtual system 101, a file 102 for test programs and a general purpose simulator 103. Virtual system 101 comprises a PLC model 104 and a process model 105. PLC model 104 comprises an execution model 106 and a file 107 for PLC sequence programs.

Execution model 106 is a file wherein the function and operating timing of a CPU in an actual PLC have been described in HDL. The PLC sequence program stored in file 107 is a file in which the following instructions have been described in HDL.

(1) Basic instruction, such as load, AND, and OR.

(2) Application instruction, such as data comparison and logic arithmetic instruction.

A ladder diagram made as a sequence circuit by the user is once converted into a mnemonic by software for conversion from a sequence circuit to a mnemonic and stored in disk 80. The software for conversion from a sequence circuit to a mnemonic is well known in the art. The mnemonic is finally converted into a PLC sequence program by software for conversion from a mnemonic to a PLC sequence program described in HDL, and stored in disk 80.

The verification of the PLC sequence program is performed with PLC model 104 operated with the PLC sequence program. The PLC sequence program modified or changed as a result of the verification is reversely converted into a mnemonic by software for reverse conversion from a PLC sequence program to a mnemonic and stored in disk 80. Furthermore, the mnemonic is reversely converted into a sequence circuit (e.g. a ladder diagram) by software for reverse conversion from a mnemonic to a sequence circuit and stored in disk 80. The software for reverse conversion from a mnemonic to a sequence circuit is well known in the art.

A conversion/reverse conversion unit 110 is provided for performing conversion or reverse conversion between the PLC sequence program and the mnemonic. A conversion/reverse conversion unit 120 is provided for performing conversion or reverse conversion between the mnemonic and the sequence circuit (e.g. ladder diagram).

A process model 105 is a file in which the function and operating timing of a control target that is controlled by virtual system 101 have been described in HDL.

The test program stored in test program 102 is a program for verifying a PLC sequence program and comprises a file described in HDL. The test progam 102 comprises a first test program for performing verification with process model 105 disconnected from PLC model 104 and a second test program for performing verification with process model 105 connected to PLC model 104.

A general purpose simulator 103 receives as inputs signals from PLC model 104, process model 105, and test program file 102, when simulation is executed, and executes the simulation for verification by the test program of the virtual system 101 comprising PLC model 104 and process model 105.

PLC model 104, process model 105, test program file 102, and general purpose simulator 103 are stored in disk 80 of FIG. 48. As HDL (i.e. hardware description language) for describing PLC model 104 and process model 105, there may be used VHDL, for example. While the HDL was developed as a language for designing VLSI (i.e. very large scale integrated circuits), it is now extensively used as simulation language, modeling language, programming language, and logical synthesis language. Currently, as HDL standardized by the IEEE, there are the VHDL of IEEE-1076, and Verilog-HDL of IEEE-1364.

In the art, the sequence program is verified after an actual system has been constructed. On the other hand, in the invention, a virtual system, corresponding to the actual system, is first constructed by a PLC model and process model described as files. Then, a test program is loaded as a sequence program verification file, into a general purpose simulator, which then executes a test program to verify by simulation a EWS using a sequence program. Thus, in the invention, the sequence program is verified before the actual system is constructed. This results in substantial savings of time and money.

Figure 51:
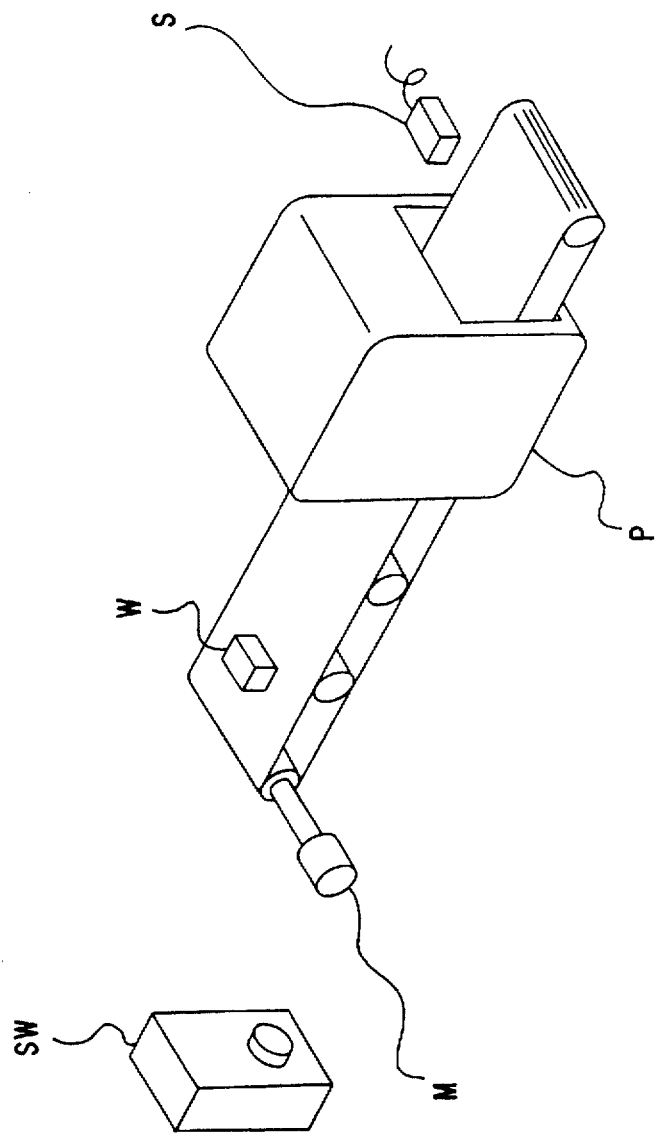
FIG. 51 is a perspective view depicting a paint blower which is the target of control of the sixth embodiment.

The operation of the sixth embodiment will now be discussed wiht reference to FIG. 51 which shows an example of a sequence controlled paint blower. In FIG. 51, there is depicted a paint blower P, a work W, a starting switch SW, a motor M for driving a conveyor, and an output sensor S. The painting is performed using the following procedure. When starting switch SW is turned ON, motor M for driving a conveyor rotates and work W is conveyed. Three seconds after work W starts moving (i.e. the time required for work W to get to paint blower P), paint blower P is driven. The painting time is 6 seconds. At the time work W comes out of paint blower P and is detected by output sensor S, conveyor driving motor M and paint blower P are stopped.

Figure 52:
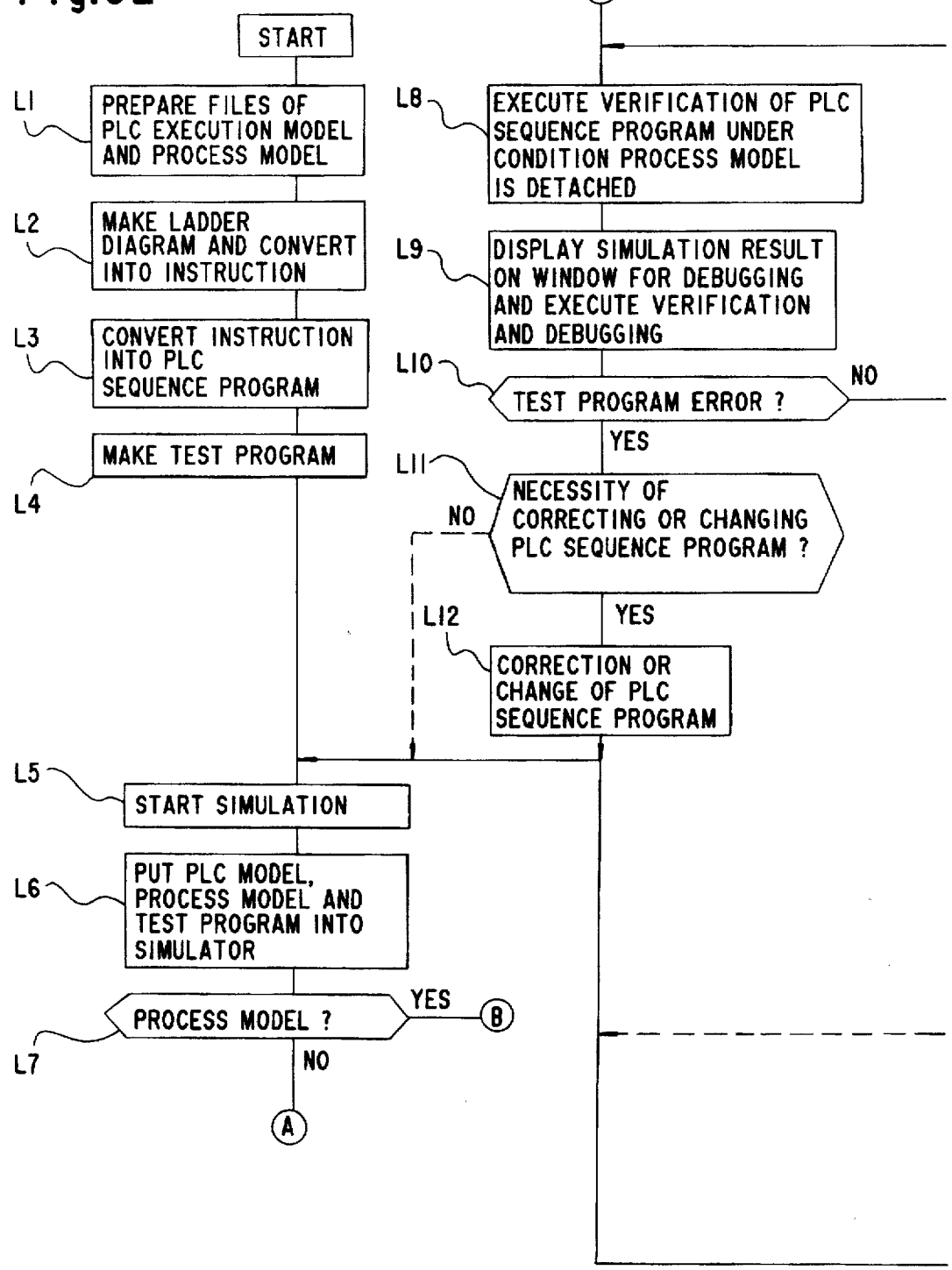
FIG. 52 is a flow chart used to explain the operation of the sixth embodiment.
Figure 52B:
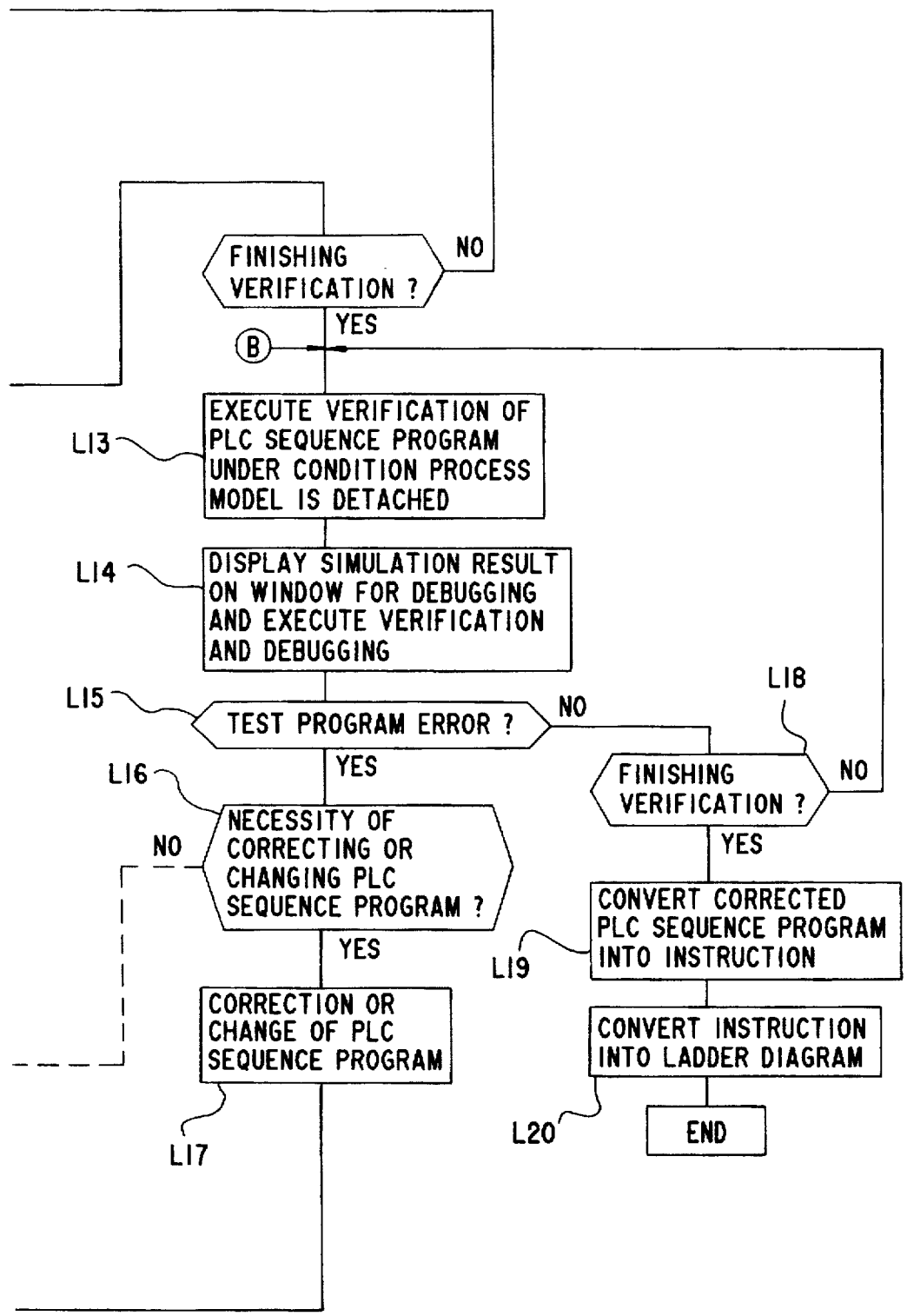

FIG. 52 shows the operational procedures of the sixth embodiment, wherein the following Steps (L1) to (L20) correspond to Steps L1 to L20 in FIG. 52.

(L1) To start with, prepare the files of a PLC execution model and a process model and store the files in disk 80.

Figures 54, 55:
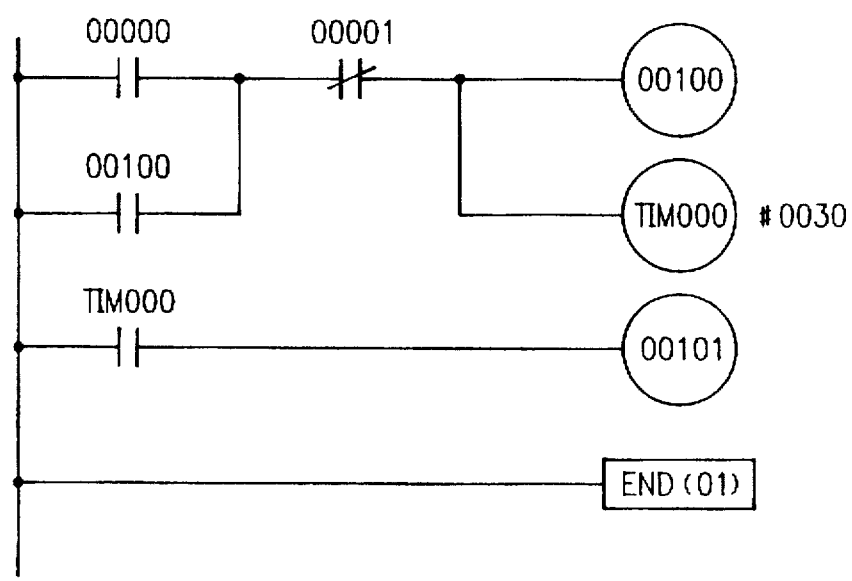
FIG. 54 is a diagram depicting allocation of the input-output and timer of the paint blower of FIG. 51.
FIG. 55 is a ladder diagram in the paint process of the paint blower of FIG. 51.

(L2) FIG. 53 is a timing diagram of the input and output in the above described painting step. By referring to the timing diagram of the painting step of FIG. 53, allocation of an input or output and a timer is performed to make a ladder diagram. FIG. 54 shows the allocation of an input or an output and a timer, and FIG. 55 shows a ladder diagram so made.

A 5-bit code allocated to the input or output of FIGS. 53,54 and 55 corresponds to the 5-bit code applied to the structural elements of FIG. 51. More particularly, inputs (00000) and (00001) correspond to the inputs of starting switch SW and output sensor S; and outputs (00100) and (00101) correspond to outputs of conveyor driving motor M and paint blower P.

The entry for the ladder diagram made is performed to obtain a sequence program. In FIG. 56, there is shown an example of a sequence program by a mnemonic. This example comprises 8 instructions of addresses 0 to 7.

Figures 57, 58:
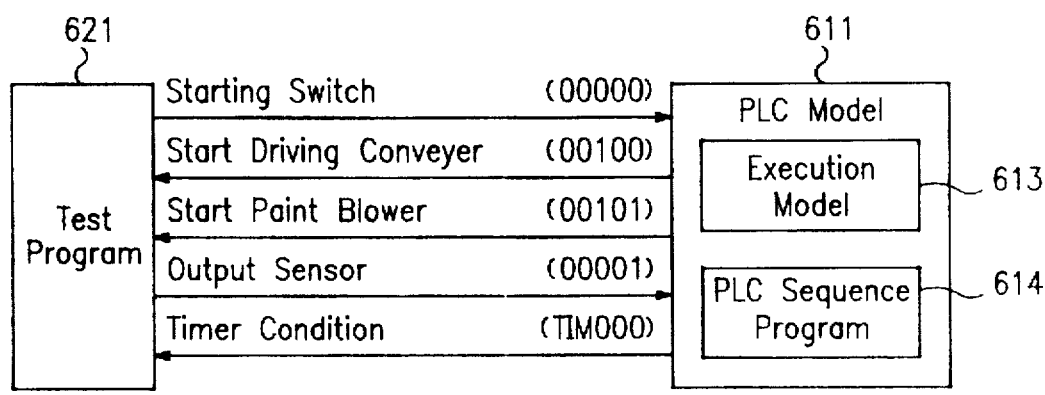
FIG. 57 is a diagram depicting an example of a PLC sequence program.
FIG. 58 is a diagram depicting a verification environment when a control target model is disconnected from a PLC model.

(L3) Next, the sequence program of the mnemonic of FIG. 56 is converted into a PLC sequence program described in HDL. In FIG. 57, there is depicted an example of the converted PLC sequence program. The instructions of addresses 0 to 7 of FIG. 56 are converted into instructions of TLD (0, 0) to TEND (7) of FIG. 57 described in HDL, respectively.

(L4) Then, make a test program for verifying the converted sequence program. The test programs are made for two cases (1) the case where the process model is disconnected from the PLC model and (2) the case where the process model is connected to the PLC model.

The verification environment by the test program when the process model is disconnected is shown in FIG. 58. Under the verification environment shown in FIG. 58, the test program verifies the PLC sequence program mainly as a single PLC model. More particularly, the test program inputs external conditions, such as the states of the starting switch (00000) and the outer sensor (00001) from the process model to the PLC model, and compares the control output from the PLC model, such as the conveyor drive (00100), and the starting output of the paint blower (00101), and the internal state, such as the timer state in the PLC model (TIM000), with the respective expected values as needed. The test program further functions as the process model. An example of the test program when the process model is disconnected, is shown in FIG. 60. In this example, the test program comprises five sub-test programs for each verification item of chk1☐ to chk5☐ (wherein ☐=1, 2, . . . ).

Figure 59:
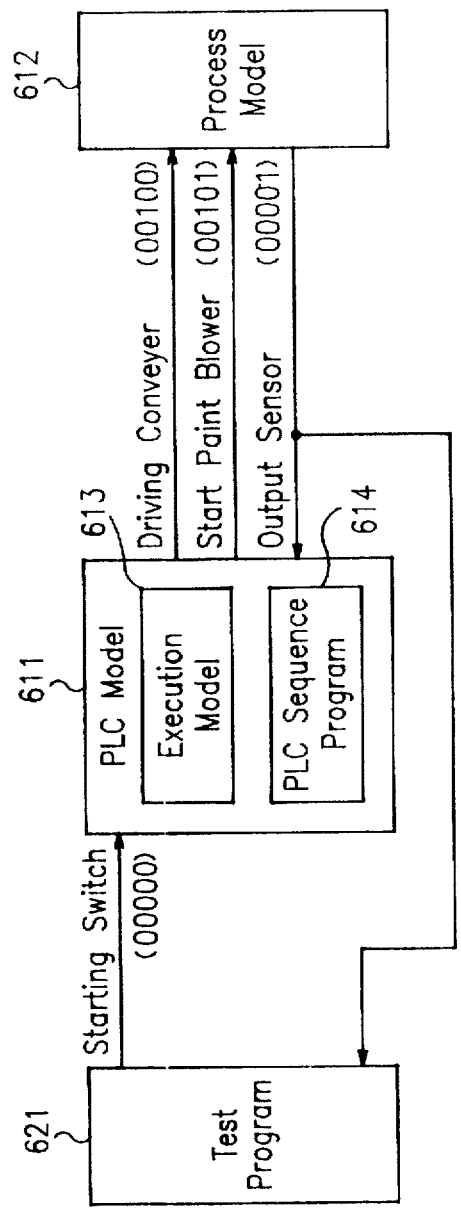
FIG. 59 is a diagram depicting a verification environment when the control target model is connected to the PLC model.

The verification environment by the test program when the process model is connected, is shown in FIG. 59. In the environment shown in FIG. 59, the test program verifies the PLC sequence program as an entire virtual system, including the process model. More particularly, the external condition, such as the starting switch (00000), is inputted to the PLC mode, and the output result, such as the state of the output sensor (00001) from the process model, is compared with an expected value. An example of the test program when the process model is connected is shown in FIG. 61. In this example, the test program comprises four sub-test programs for each verification item of chk11 to chk41.

(L5) Start simulation (L6) When the simulation is started, the control process unit 90 will read out of disk 80, the PLC model, the process model, the test program as the process model was disconnected from the PLC model, and the test program as the process model was connected to the PLC model, and apply such read out data to general purpose simulator 103. With the above preparatory operation, the verification operation of the PLC sequence program is ready to go.

(L7) Next, execute the verification for the case when the process model is disconnected from the PLC model and for the case when the process model is connected to the PLC model.

(L8) First, the verification of the PLC sequence program is executed when the process model is disconnected from the PLC Model.

(L9) As shown in FIG. 61, the process control unit 90 displays the simulation results on the CRT windows for debugging, such as a waveform window, a variables window, a test program window, a test program window, a PLC sequence program window, and a command window.

Figure 62:
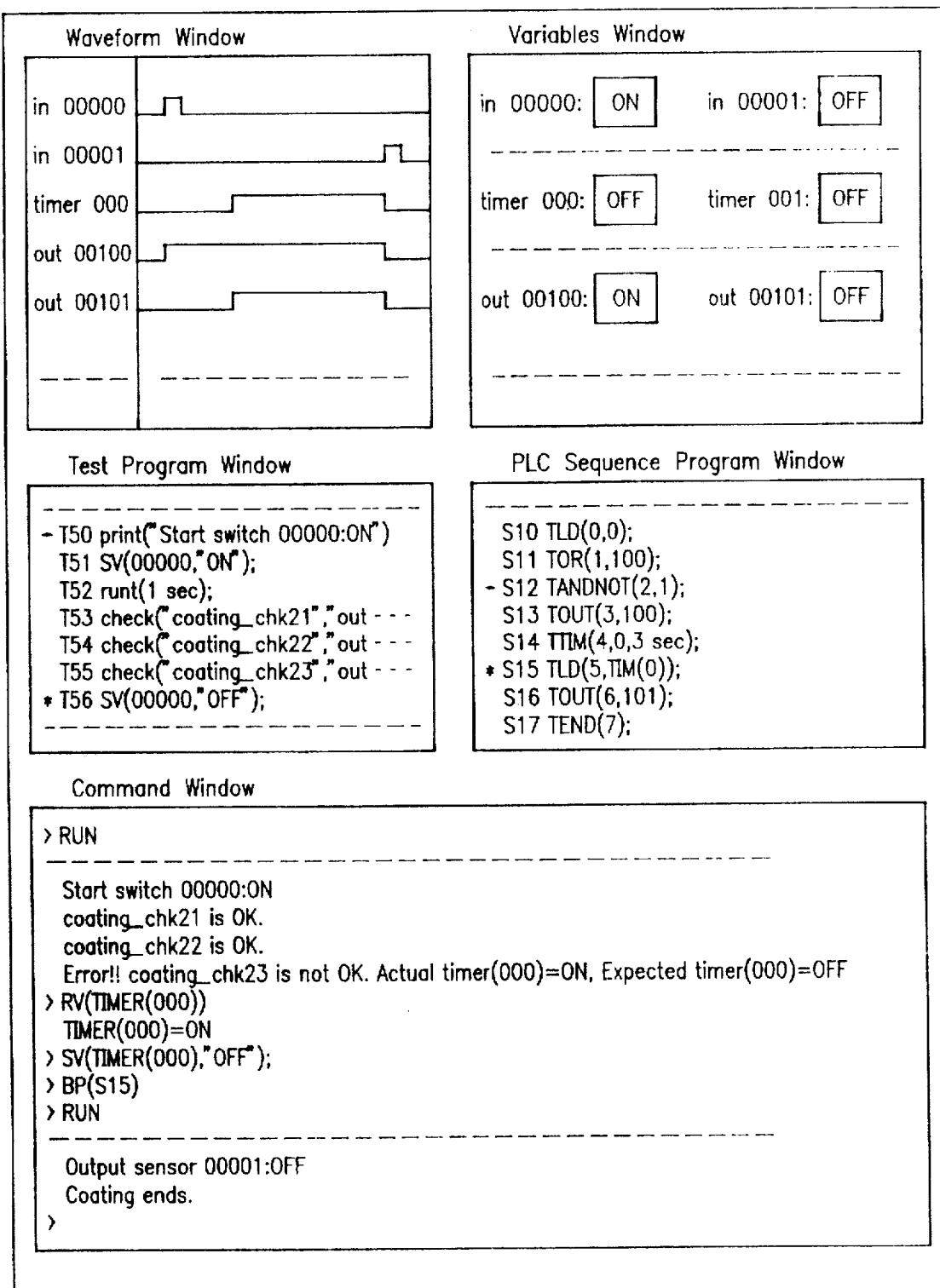
FIG. 62 is a diagram depicting an example of windows for the results of simulation.
Figure 63:
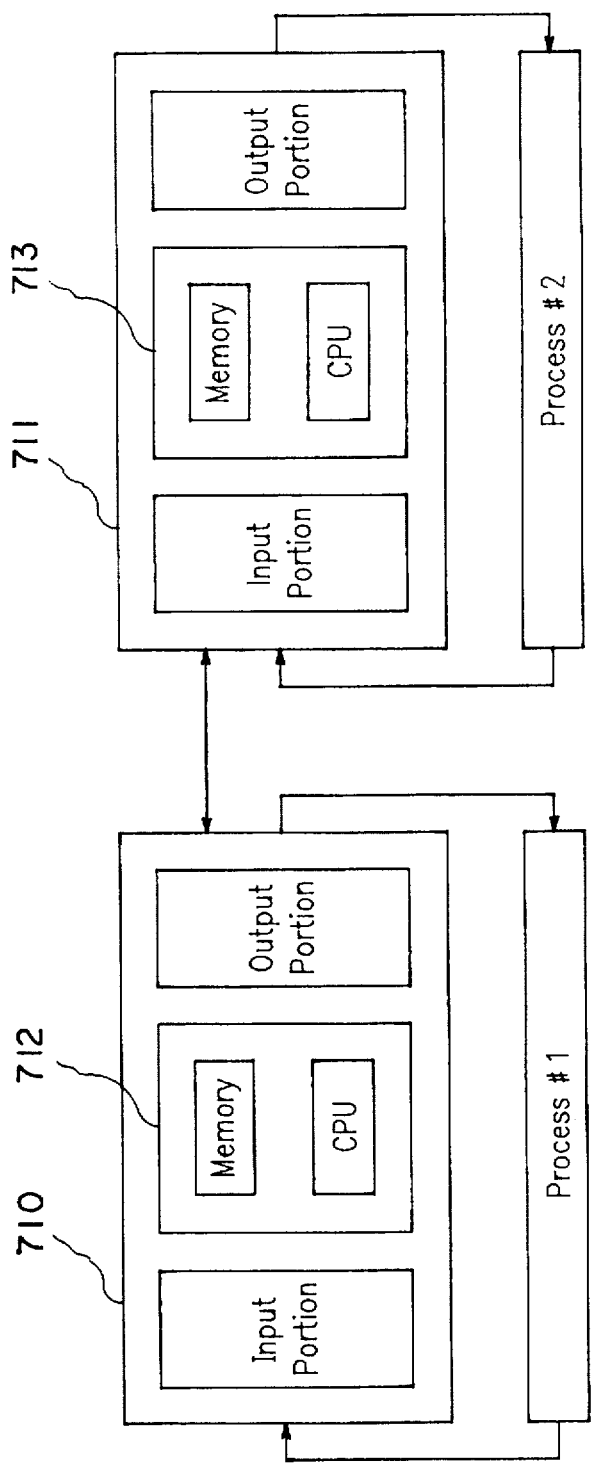
FIG. 63 is a diagram depicting another example to which the the verification support system of the invention is applied.

The waveform window displays the timing diagram of waveforms at arbitrary points in the test program and the PLC model. The variables window performs display and change of the state values of variables at arbitrary points in the test program and the PLC model. The test program window performs the display of a test program now being executed and the setting and releasing of a break point. The PLC sequence program window performs the display of a PLC sequence program being executed and the setting and releasing of a break point. The arrows → in FIG. 62 represent the test program code and PLC sequence program code now being executed, respectively. The command window is used for the setting and releasing of break points in the test program and PLC sequence program and for the display and change of variables, in addition to the start and stop of simulation and the message display of the test program. The display of windows for debugging, shown in FIG. 63, is performed by display control unit 92 of process control unit 90. Verification and debugging are performed by using these windows for debugging.

(L10) Verification is performed mainly by a test program such as that shown in FIG. 60. The test program is executed, and the control output value and internal state value from the PLC model are compared with expected values. As a result, if both values match each other, a message of normality will be displayed on the command window and the next sub-test program will be executed. On the other hand, if both values are mismatched, an error message, an actual value, and an expected value will be displayed on the command window and simulation will be stopped once. FIG. 62 shows a display example of errors in the case of normality and in the case when an error occurs.

If an error occurs, the cause of the error will he analyzed and cleared up by making use of a waveform display function, a display and change function of variables, and the setting function of a break point in the PLC sequence program.

The display and change of a variable can be performed with the variable window shown in FIG. 62, and also by inputting that variable together with command to the command window. For example, the state value of a timer 000 can be read from the RV(TIMER(000)) shown in FIG. 62, and the state value of the time 000 can forcibly be changed from ON to OFF from the SV(TIMER(000,'OFF')).

The setting of a break point in the PLC sequence program is performed by clicking a corresponding line S15 of the PLC sequence program shown in FIG. 62 with a mouse. The mark * is applied to the corresponding line S15 clicked with a mouse. The break point can also be set by inputting a line number corresponding to a corresponding line, together with a command, to the command window by using a keyboard. The BP(S15) shown in FIG. 62 was set by using a keyboard. These settings related to debugging are performed by the debug unit 93.

(L11) and (L12) When, as a result of the examination of the cause of an error, it is necessary to correct or change the PLC sequence programs, the PLC sequence programs are corrected or changed and the simulation is again executed. When it is necessary to correct or change at a point other than the PLC sequence program, the point is corrected and then the simulation is again executed. Until there is no correction or change further required and the verification operation is completed, the above steps (L11) and (L12) are repeated.

(L13) to (L18) Next, by the same steps as when the process model is detached from the PLC model, the verification of the PLC sequence program is executed under the condition that the process model is connected to the PLC model.

(L19) At the time that it is no longer necessary to correct or change and the verification is completed, the corrected or changed PLC sequence programs are reverse converted to generate instructions of the sequence programs that operate in an actual PLC.

(L20) Convert the obtained instructions into ladder diagrams. The verification of the sequence programs is now ended.

Thus, by operating the logic simulation support system of the invention on a single EWS, inputting a PLC model, a process model, and a test program as part of an input file by the general logic simulator, and displaying the execution results of the test program and various debugging functions on the window of the CRT display unit, the verification and debugging of the sequence programs are performed.

In the sixth embodiment, when it is necessary to correct or change the PLC sequence programs, the PLC sequence programs described in HDL are directly corrected or changed to shorten the verification and debugging times, and then, the simulation is again executed.

However the invention is not so limited. By correcting or changing the original ladder diagrams, generating instructions from the corrected or changed ladder diagrams, and again converting the instructions, PLC sequence programs may be regenerated and then, the simulation again executed.

Also, although an independent control system, in which one PLC is used for one control target, has been described, the invention may be applied to a distributed system in which PLC 710 and PLC 711, each comprising a calculation control logic 712 and 173, respectively, are separately controlled with respect to a plurality of interlocked processes #1 and #2, such as shown in FIG. 63.

The distributed control system has the advantage that independent operation can be performed for each distributed process. On the other hand, control signals and information have to be synchronized to interlock distributed processes, so that a distributed control system normally takes a long time to verify sequence programs, as compared with independent control systems. The invention, however, can perform an overall verification efficiently by preparing on a single EWS a plurality of virtual systems comprising a PLC model and a process model and a plurality of test programs, respectively, corresponding to the virtual system and execution simulation.

The sixth embodiment has the following and other advantages. Before an actual system is constructed by a PLC, a virtual system is constructed by a file in which a PLC model and a process model are described in HDL, test programs under the condition when the process model is detached from the PLC model and under the condition when the process model is connected to the PLC model, are prepared, and the sequence programs are verified by using a general purpose simulator with a debugging function. Thus, the following advantages are attained.

(1) With a test program, where the process model is detached from the PLC model, the verification of the sequence programs as a single PLC can be performed efficiently for each verification item. In addition, with a test program where the process model is connected to the PLC model, the verification of the sequence programs as a whole system, can be performed efficiently.

(2) Where there is an error in the sequence program, the specification of the error point can be performed quickly by the debugging function. When it is necesssary to correct or change the sequence programs, the PLC programs described in HDL can be corrected without returning to the original sequence programs, and when the verification is completed, sequence programs that operate on an actual PLC are obtained collectively from the corrected or changed PLC sequence programs, so that the verification time is shortened considerably. When there is possibility of an error in the correction or change of the sequence programs, the existence of the error can also be determined by merely executing the test programs.

(3) The trade off of whether the hardware on the input-output equipment part of the PLC is mainly realized or the sequence programs of the PLC is mainly realized with use of software, with respect to a control process, can be fully examined before an actual system is built, so that optimum allocation can be performed.

(4) The entire performance of the PLC system can be estimated efficiently and accurately before an actual system is built.

As described above, the correction and change of the sequence programs can be efficiently done according to the invention. Moreover, there can be obtained a verification support system which is capable of quantitatively estimating allocation of control by the hardware and of control by software. This results in great improvement of efficiency of design of a sequence control system using a PLC.

As described above, the invention provides a verification support system which is capable of enhancing the efficiency of development of a CPU mounted circuit and of enhancing the efficiency of development of a sequence control system using a PLC.

The foregoing description is illustrative of the principles of the invention. Numerous modifications and extensions thereof would be apparent to the worker skilled in the art. All such modifications and extension are to be considered to be within the spirit and scope of the invention.

What is claimed is:

1. A verification support system comprising:

a target of verification comprising programs which a CPU mounted circuit executes, the CPU mounted circuit including a process control unit with a general purpose CPU, a keyboard and a mouse connected to said process control unit, a CRT display unit, and a disk for storing a variety of data and programs and also having a ROM, a RAM, and a user logic mounted around said general purpose CPU;

a general purpose CPU model, a RAM model an ICE model, and a user logic model which simulatively execute functions of said general purpose CPU, said RAM said ICE and said user logic, respectively, said models being constructed by files which are stored in said disk;

a ROM model in which a program comprising a related sequence of steps 1 to N, wherein N represents an integer, is stored, said ROM model being constructed by a file which is stored in said disk;

a general purpose logic simulator for inputting therein said general purpose CPU model, said ROM model, said RAM model, and said ICE model, from said disk, as input files, and for performing logic simulation of executing said program stored in said ROM model according to an order of a step by said CPU model;

verification means for performing verification each time each step of said program is executed;

save means for saving contents of registers provided in said general purpose CPU model and user logic model and a content of said RAM model, to said disk each time one step is completed;

correction means which, when an error is found in the verification of a particular step as said verification is being performed by said verification means, corrects said program and rewrites a content of said ROM model with the corrected program; and verification control means which, when said corrected program is verified, causes said verification means to read out from said disk, a content that was saved in said disk when the verification of a step one less than said particular step was completed, again store the read content in said registers provided in said general purpose CPU model and user logic model and said RAM model, bypass the execution and verification steps of a first step to said step one less than said particular step, and immediately perform the execution and verification of said step one less than said particular step.

2. A verification support system comprising a process control unit with a general purpose CPU, a keyboard and a mouse connected to said process control unit, a CRT display unit, and a disk for storing a variety of data and programs and which verifies hardware of a plurality of target logics by logic simulation, said verification support system further comprising:

a plurality of target logic models for simulatively executing functions of said plurality of target logics, the target logic models comprising files which are stored in said disk;

a general purpose logic simulator for inputting therein said plurality of target logic models, from said disk, as input files, and for performing verification of hardware of said plurality of target, logic models by logic simulation;

grouping means for grouping signal data and simulation data desired for verification of said plurality of target logic models and obtained as a result of said logic simulation, for each target logic model;

store means for sequentially storing in said disk the signal data and simulation time data grouped by said grouping means;

read means for reading out, for each group, the signal data and simulation time data stored in said disk;

display means for converting said signal data and said simulation time data read out from said disk into waveform timing diagrams, respectively, and for displaying said timing diagrams on different display regions of said CRT display unit for each target logic model, and for renewing said timing diagram displayed on each display region as said logic simulation proceeds;

individually stop or reopen means for individually performing stop or reopening of the renewing of the timing diagram by controlling said display means; and collectively stop or reopen means for collectively performing stop or reopening of the renewing of the timing diagrams displayed on all of the display regions, by controlling said display means.

3. The system of claim 1, wherein said program has a test program for performing verification when a process model is connected to an execution model and when the process model is disconnected from the execution model.

4. The system of claim 1, further comprising reverse conversion means for converting a corrected sequence program into a sequence program when the sequence program is changed as a result of verification.

* * * * *